United States Patent
Lee et al.

(10) Patent No.: US 9,177,658 B2
(45) Date of Patent: Nov. 3, 2015

(54) 1T1B AND 2T2B FLASH-BASED, DATA-ORIENTED EEPROM DESIGN

(71) Applicants: Peter Wung Lee, Saratoga, CA (US); Hsing-Ya Tsao, San Jose, CA (US)

(72) Inventors: Peter Wung Lee, Saratoga, CA (US); Hsing-Ya Tsao, San Jose, CA (US)

(73) Assignee: Aplus Flash Technology, Inc.

( * ) Notice: Subject to any disclaimer, the term of this patent is extended or adjusted under 35 U.S.C. 154(b) by 0 days.

(21) Appl. No.: 14/546,294

(22) Filed: Nov. 18, 2014

(65) Prior Publication Data

US 2015/0071007 A1 Mar. 12, 2015

Related U.S. Application Data

(62) Division of application No. 13/734,777, filed on Jan. 4, 2013, now Pat. No. 8,923,049.

(60) Provisional application No. 61/632,099, filed on Jan. 17, 2012.

(51) Int. Cl.

| | |
|---|---|
| G11C 11/04 | (2006.01) |
| G11C 16/14 | (2006.01) |
| G11C 16/34 | (2006.01) |
| G11C 16/06 | (2006.01) |
| G11C 16/04 | (2006.01) |
| G11C 16/10 | (2006.01) |
| G11C 16/16 | (2006.01) |
| G11C 16/26 | (2006.01) |

(52) U.S. Cl.
CPC ............ *G11C 16/14* (2013.01); *G11C 16/0425* (2013.01); *G11C 16/0458* (2013.01); *G11C 16/0483* (2013.01); *G11C 16/06* (2013.01); *G11C 16/10* (2013.01); *G11C 16/16* (2013.01); *G11C 16/26* (2013.01); *G11C 16/3459* (2013.01); *G11C 2216/14* (2013.01)

(58) Field of Classification Search
CPC .... G11C 16/0483; G11C 16/06; G11C 16/14; G11C 16/04; G11C 16/0425
USPC ............. 365/185.05, 185.17, 185.18, 185.22, 365/185.29, 185.33; 257/316; 438/129, 459
See application file for complete search history.

(56) References Cited

U.S. PATENT DOCUMENTS

| | | | | |
|---|---|---|---|---|
| 6,900,086 | B2 * | 5/2005 | Mori et al. ..................... | 438/201 |
| 7,177,190 | B2 * | 2/2007 | Lee ........................... | 365/185.17 |
| 7,636,252 | B2 * | 12/2009 | Lee et al. ................. | 365/185.05 |
| 8,289,775 | B2 * | 10/2012 | Lee et al. ................. | 365/185.18 |
| 8,923,049 | B2 * | 12/2014 | Lee et al. ................. | 365/185.05 |
| 2011/0096609 | A1 * | 4/2011 | Lee et al. ................. | 365/185.28 |
| 2013/0214341 | A1 * | 8/2013 | Wang ............................ | 257/316 |

* cited by examiner

*Primary Examiner* — Gene Auduong
(74) *Attorney, Agent, or Firm* — Fang Wu

(57) ABSTRACT

An one-transistor-one-bit (1T1b) Flash-based EEPROM cell is provided along with improved key operation schemes including applying a negative word line voltage and a reduced bit line voltage for perform erase operation, which drastically reduces the high voltage stress on each cell for enhancing the Program/Erase cycles while reducing cell size. An array made by the 1T1b Flash-based EEPROM cells can be operated with Half-page or Full-page divided programming and pre-charging period for each program cycle. Utilizing PGM buffer made of Vdd devices in the cell array further save silicon area. Additionally, a two-transistor-two-bit (2T2b) EEPROM cell derived from the 1T1b cell is disclosed with additional cell size reduction but with the operation of program and erase the same as that for the 1T1b cells with benefits of no process change but much enhanced storage density, superior Program/Erase endurance cycle, and capability for operating in high temperature environment.

15 Claims, 28 Drawing Sheets

Prior Art

| | Selected WL | Unselected WL | Selected TPW | Selected BL/SL | Unselected BL/SL |
|---|---|---|---|---|---|
| Page Erase | 0V | 11V | 14V | 14V/F | NA |
| Page Program | 16V | 0V | 0V | 0V/F | 10V/F |
| Read | 2.5V | 0V | 0V | 1V/0V | 1V/0V |

| | Selected WL | Unselected WL | Selected TPW | Unselected TPW | Selected BL/SL | Unselected BL/SL |
|---|---|---|---|---|---|---|
| Byte Erase | -5V | 5V | 10V | 0V | 10V/F | 0V/F |
| Page Erase | -5V | 5V | 10V | 0V | 10V/F | 0V/F |
| Page Program | 16V | 0V/5V | 0V | 0V | 0V/F | 10V/F |
| Read | 2.5V | 0V | 0V | 0V | 1V/0V | F/0V |

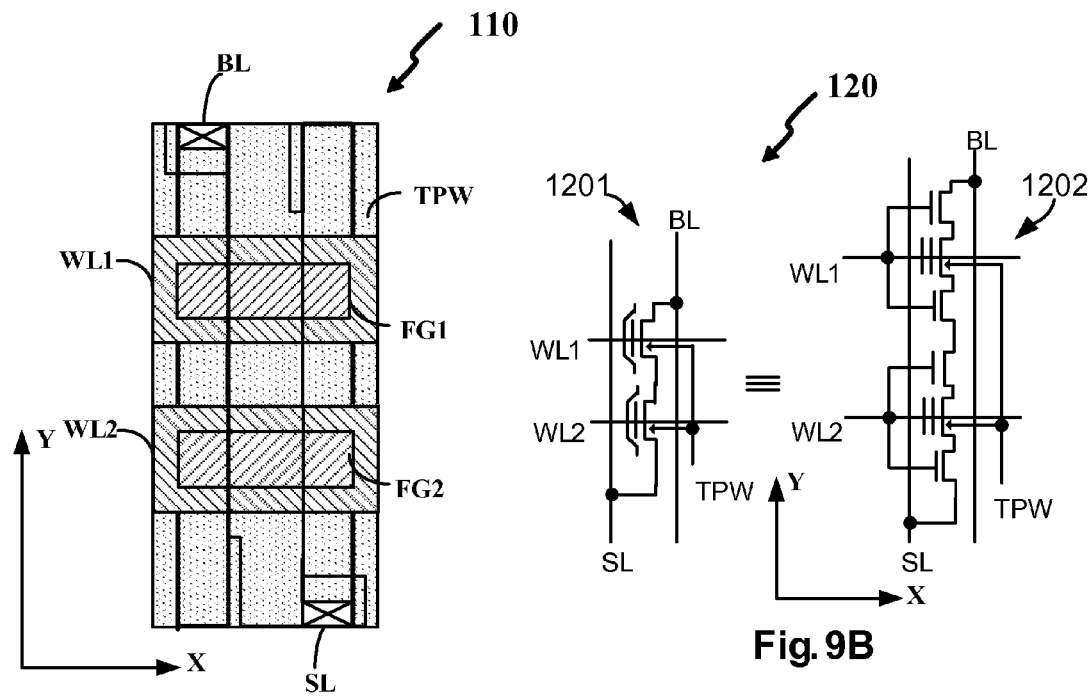
Fig. 9A
Fig. 9B
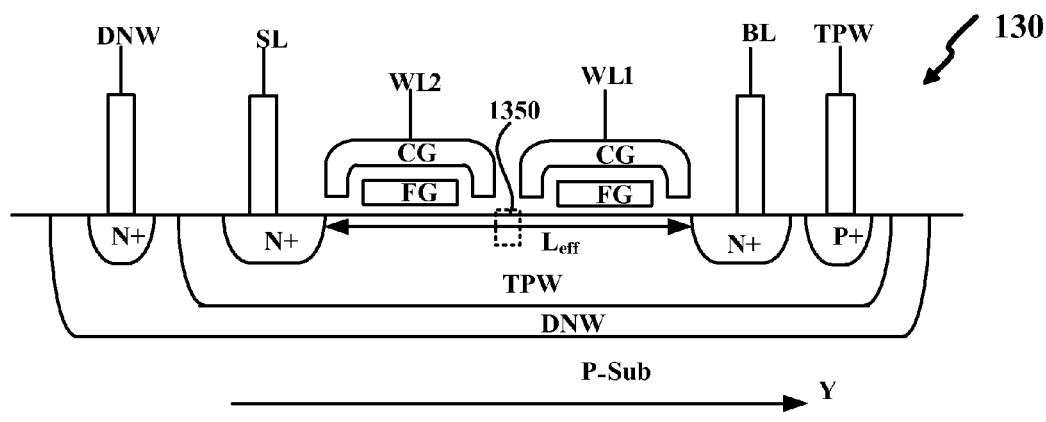
Fig. 9C

|  | Selected Pair | | Unselected Pair | | Selected TPW | Unselected TPW | Selected BL/SL | Unselected BL/SL |
|---|---|---|---|---|---|---|---|---|
|  | Selected WL | Unselected WL | Unselected WL | | | | | |
| Byte Erase | -5V | 5V | 5V | | 10V | 0V | 10V/F | 0V/F |
| Page Erase | -5V | 5V | 5V | | 10V | NA | 10V/F | NA |
| Page Program | 16V | 0V/5V | 0V/5V | | 0V | NA | 0V/F | 10V/F |
| Read | 2.5V | 4.5V | 0V | | 0V | NA | 1V/0V | F/0V |

Fig. 12B

1T1B AND 2T2B FLASH-BASED, DATA-ORIENTED EEPROM DESIGN

CROSS-REFERENCES TO RELATED APPLICATIONS

This application is a divisional application of U.S. patent application Ser. No. 13/734,777, filed on Jan. 4, 2013, claiming priority to U.S. Provisional Patent Application No. 61/632,099, filed on Jan. 17, 2012, commonly assigned, and hereby incorporated by reference in its entirety herein for all purposes.

This application is related to U.S. Pat. Nos. 4,599,707 and 6,479,347 and hereby incorporated by reference in its entirety herein for all purposes. This application is also related to U.S. patent application Ser. No. 13/199,785, filed on Sep. 9, 2011, U.S. patent application Ser. No. 13/200,010, filed on Sep. 15, 2011, and U.S. patent application Ser. No. 13/200,142, filed on Sep. 19, 2011, commonly assigned, and hereby incorporated by reference in its entirety herein for all purposes.

BACKGROUND OF THE INVENTION

The present invention relates generally to nonvolatile memory cell structure, array structure, and operation. More particularly, the present invention relates to improved 1T1b and 2T2b flash-based Electrical Erasable Programmable Read Only Memory (EEPROM) data-oriented cell structures, array structures, and operations.

Nonvolatile memory is well known in the art. The different types of nonvolatile memory that employ a charge retention mechanism include Read-Only-Memory (ROM), Electrically Programmable Read Only Memory (EPROM), Electrically Erasable Programmable Read Only Memory (EEPROM), NOR Flash Memory, and NAND Flash Memory. The charge retention mechanism may be charge storage, as in a floating gate memory cell, a so-called Flash-based cell.

The NAND Flash memory cell design has several advantages. Firstly, its cell size is highly scalable and is able to have a cell size that is a factor of approximately four times (4×) larger than the minimum feature size ($\lambda^2$) of the manufacturing technology. This has held in technologies with feature sizes from 0.25 µm down to 20 nm. This is the smallest nonvolatile memory cell when compared to other nonvolatile cell types. Secondly, NAND Flash memory cell design uses a low-current Fowler-Nordheim tunneling phenomena for both program and erase operations. The Fowler-Nordheim Tunneling allows the program and erase operations to be performed in relatively larger memory unit sizes and a faster speed. The Fowler-Nordheim erase operation is typically performed in a unit of a large sector with sizes ranging from 512 Kb to 2 Mb and 1 ms fast erase time in current specifications. The Fowler-Nordheim program is performed in a unit of a large page size varying from 512 B to 2 KB with a fast speed of 200 us typically in the current specifications.

By contrast, NOR Flash memory device is formed of an array of less-compact charge retaining transistors that are fundamentally connected in parallel, rather than serially in a NAND Flash memory array. Like a NAND Flash memory charge storage transistor, the NOR Flash memory charge storage transistor is also made of the stack-gate cell structure for the floating gate transistors. Each NOR Flash memory cell has a contact metallurgy at each drain and source node to connect each NOR Flash memory cell to the common bit lines and source lines. The cell size for the NOR Flash memory, therefore, is larger than the NAND Flash memory.

As is known in the art, an EEPROM memory array is structured to be a byte-wise erasable structure as compared to block-wise erasable NAND flash memory arrays. EEPROM memory array requires more die area than a NAND flash memory of the same capacity because each EEPROM memory cell pitch is much larger. Conversely, in a NAND flash memory array, the erase circuits are shared by large blocks of cells (often 512×8 bits).

Typically, the three types of nonvolatile memory structures are targeted three different storage markets and technologies are not compatible. The NAND Flash memory has been extensively used as a slow-serial-read, extreme high-density, block-alterable memory array for huge data storage. Conversely, the NOR Flash memory is used as a fast-random-read medium-high-density, sector-alterable memory array for program code storage. Unlike the NAND and NOR Flash memories, the EEPROM memory is broadly used as a fast-random-read, byte-alterable memory array for small data storage.

An EEPROM memory array design has certain disadvantages. The first disadvantage is a large cell size that is the largest among the nonvolatile memory structures. Currently, the EEPROM manufacturing technology process, in real production, is about four generations behind NOR Flash memory manufacturing technology and seven generations behind the NAND Flash memory manufacturing technology. The cell size will be relatively larger as technology migrates below 0.15 µm. In the manufacturing process node above and including 0.18 µm, the EEPROM cell has been realized with a cell area size of about 90 times the minimum feature size ($\lambda^2$) but will have an area larger than 100 times the minimum feature size ($\lambda^2$) when migrating below 0.15 µm.

The second disadvantage of the EEPROM memory array design is that a very high bit line programming voltage is required. The programming voltage is as high as 16 V in the cell channel region between its drain and source nodes for performing proper Fowler-Nordheim Program operation. As a result, the EEPROM memory array program operation is the most critical one as compared to NAND Flash memory array and NOR Flash memory array. The very high programming voltage requirement in cell's channel region between the drain and source prevents the EEPROM memory cell area from further scaling below the 0.13 µm minimum feature size. During a higher density page program operation, higher number of bit lines and one word line is charged to the very high programming voltage of 16V in the worst-case. The page size varies from 8 bytes in low-density 2 kb part to 256 Bytes for high-density parts such as 1-2 Mb with page program speed of around 1 ms.

One major advantage of the EEPROM memory design lies in the number of Program and Erase (P/E) endurance cycles. Currently a two-transistor FLOTOX-based EEPROM memory array can endure at least 1 million program-and-erase (P/E) cycles in units of byte or page. Therefore, the two-transistor EEPROM memory array is the best nonvolatile storage memory for those extremely high frequency changing rates of byte-alterable or page-alterable data applications. For example, a two floating gate tunnel oxide (FLOTOX) based EEPROM memory design has been developed for the market need of byte-alterable data-oriented application, keeping the advantage of 1M P/E endurance of traditional EEPROM memory as well as features of fast write speed and relative simple manufacture process. A recent trend for the byte-alterable EEPROM application demands a low-cost high-density storage solution that allows the scaling below 90 nm at higher temperature automotive environment. The drawback of the 2T FLOTOX-based EEPROM cell is its large cell size (for storing one bit) of $90\lambda^2$ and high bit line voltage level of about 16 V which limits its channel length scaling. Alternatively, an one floating gate transistor Flash-based EEPROM cell is proposed to reduce the cell size (for storing one bit) to about one-third of that, down to $30\lambda^2$. But current operation scheme of the corresponding 1T1b EEPROM cell array in the prior art still requires bit line inhibit voltage level as high as 16 V. Thus the stress to the source line select transistors and bit line select transistors is very high, imposing a big disadvantage of inferior of P/E endurance cycle of just about 300K. Therefore, improved operation schemes as well as new memory array architectures are needed and become objectives of the present invention.

BRIEF SUMMARY OF THE INVENTION

An object of this invention is to provide a one-transistor-one-bit (1T1b) Flash-based EEPROM cell with a novel operation method for data erasure by applying a negative control gate (CG) voltage applied to a word line (WL) along with a reduced bit line (BL) voltage for superior cell channel length's reduction cell structure.

Another object of this invention is to provide an array of one-transistor-one-bit (1T1b) Flash-based EEPROM cells with novel operation schemes for half-page/full-page divided pre-charging period and programming period for each program cycle along with either High-voltage (HV) PGM buffer and Low-voltage (LV) PGM buffer for BL biasing. In a preferred embodiment, LV PGM buffer made by devices having low Vdd of 3V or less is used to replace typical HV PGM buffer to save silicon area of the memory cell array circuit.

Further, another object of this invention is to provide a novel 2T2b flash-based EEPROM cell, which is based on above two 1T1b Flash-based EEPROM cells being connected in serial without a middle contact region between the two 1T1b cells for cell size reduction in Y-axis direction but identical in X-pitch. In an embodiment, the Fowler-Nordheim (FN) channel tunneling scheme is not changed during both program operation and erase operation when the cell structure is changed from two larger 1T1b EEPROM cells to one smaller 2T2b EEPROM cell for cost reduction.

Furthermore, another object of this invention is to provide a method for data erasure by applying a negative CG voltage applied to a WL along with a reduced BL voltage for superior cell channel length's reduction for the 2T2b Flash-based EEPROM cell structure.

Still further, an object of this invention is to provide a negative charge-pump circuit that can be generated based on this Flash-based EEPROM process without a triple P-well (TPW) HV 1-poly NMOS device existing in the peripheral area. This negative charge-pump circuit can be built by using the existing HV PMOS device to generate the negative voltage level for the selected WL of a page.

Still further, another object of this invention is to provide a new set of two threshold voltages $V_t$s (a low threshold level $V_{tL}$ and a high threshold level $V_{tH}$) for defining memory bits associated with each 2T2b Flash-based EEPROM cell. The center value of $V_{tL}$ of the 2T2b EEPROM cell is kept the same as 1T1b EEPROM cell of about 1.0V. But the $V_{tH}$ of this novel 2T2b EEPROM cell can be kept at a lower positive center value of around 2.7V (compared to traditional 4.2 V for the 1T1b EEPROM cell) with a tighter $V_t$ distribution below 0.5V as a NAND Multi-level Cell (MLC) approach.

Even further, another object of this invention is to disclose a method of program operation with an iterative bit-by-bit program-verify step for the 2T2b Flash-based EEPROM cell for superior control over the center value and the range of $V_{tH}$ to avoid over-programming concern. The added program-verify step and programming step would be an iterative process to gradually increase the 2T2b EEPROM cell's threshold voltage level of $V_t$ from $V_{tL}$ to $V_{tH}$ until it reaches the desired low positive value, ranging between +2.5V to +2.9V.

Still even further, another objective of the present invention is to provide a novel combo nonvolatile memory (NVM) arrays that comprises an 1T1b EEPROM cell array, a 2T2b NOR cell array and a nTnb NAND array to achieve the most flexible and compact combo NVM memory integrated in 1-die without any process changes.

Further yet, another objective of the present invention is to provide an extra row in a 2T2b Flash-based EEPROM cell array to equalize the voltage between the selected pairs of bit lines (BLs) and source lines (SLs) for different operations for programming, erasing, and reading.

Still further yet, another objective of the present invention is to provide a new set of TPW voltage conditions along with the negative CG voltage for different bytes in the selected page of either 1T1b or 2T2b Flash-based EEPROM cell array for achieving the BL and SL disturbances during the erase operation for operating in the higher P/E endurance cycles as well as higher temperature for auto-grade applications.

Furthermore, another objective of the present invention is to provide either 1T1b or 2T2b Flash-based EEPROM cell array with a new LV page PGM buffer along with a 2-step program algorithm to replace the traditional HV PGM page buffer for a size reduction. The 2-step program operation includes a first-step of Pre-Charge period and a second-step of Programming period along with a Pre-charge LV Bus within a source line control block circuit.

Moreover, another objective of the present invention is to provide either 1T1b or 2T2b Flash-based EEPROM array with a new LV page PGM buffer along with a 2-step program algorithm to replace the traditional HV PGM page buffer for a size reduction. But the 2-step program option can be divided with into two Half-page or one Full-page program operation and pre-charge operation.

In a specific embodiment, the present invention provides an one-transistor-one-bit (1T1b) Flash-based EEPROM array circuit. The 1T1b Flash-based EEPROM array circuit includes a 1T1b Flash-based EEPROM cell array divided into a plurality of pages. Each page is laid in a row having a number of bytes in X direction. Each byte includes eight bits and each bit is associated with a memory cell having a triple P-well (TPW) node, a word line (WL) node connected to a common WL for each page in the X direction, a bit line (BL) node configured to connect a global BL in Y direction perpendicular to the X direction, and a source line (SL) node configured to connect a global SL in the Y direction respectively through a plurality of SL-select transistors. The plurality of pages is arranged in the number of columns of bytes in the Y direction, each column of bytes sharing a common TPW node connected to all TPW nodes of all memory cells in the column. The 1T1b Flash-based EEPROM array circuit further includes a decoder circuit connected to each common WL in the X direction associated with each of the plurality of pages. Furthermore, the 1T1b Flash-based EEPROM array circuit includes a low-voltage PGM buffer circuit made from PMOS and NMOS devices with power supply voltages of 3V or less and connected to all the global BLs in the Y direction respectively through a plurality of BL-select transistors. Moreover, the 1T1b Flash-based EEPROM array circuit includes a source line control block circuit configured to connect all the global SLs in the Y direction respectively through a plurality of SL-select transistors. The decode circuit is configured to apply a negative voltage level to a selected WL along with a reduced voltage level being applied to selected TPW node and selected BLs for superior channel length reduction during data-oriented storage operations on selected memory cells in selected bytes or selected page.

In another specific embodiment, the present invention provides a method for operating an one-transistor-one-bit (1T1b) Flash-based EEPROM cell array during a byte erase operation. The method includes providing a 1T1b Flash-based EEPROM cell array. The 1T1b Flash-based EEPROM cell array includes a 1T1b Flash-based EEPROM cell array divided into a plurality of pages. Each page is laid in a row having a number of bytes in X direction and each byte includes eight bits and each bit is associated with a memory cell having a triple P-well (TPW) node, a word line WL node connected to a common WL for each page in the X direction, a bit line BL node configured to connect a global BL in Y direction perpendicular to the X direction, and a source line SL node configured to connect a global SL in the Y direction. The plurality of pages is arranged in the number of columns of bytes in the Y direction. Bytes in each column share a common TPW node connected to all TPW nodes of all memory cells in the column. The 1T1b Flash-based EEPROM cell array further includes a decoder circuit connected to each common WL in the X direction associated with each of the plurality of pages. Additionally, the 1T1b Flash-based EEPROM cell array includes a low-voltage PGM buffer circuit made from PMOS and NMOS devices with power supply voltages of 3V or less and connected to all the global BLs in the Y direction respectively through a plurality of BL-select transistors. Moreover, the 1T1b Flash-based EEPROM cell array includes a source line control block circuit configured to connect all the global SLs in the Y direction respectively through a plurality of SL-select transistors. Additionally, the method includes biasing the 1T1b Flash-based EEPROM cell array for erasing a selected byte in a selected page by applying a negative voltage level through the decode circuit to a selected WL associated with the selected byte belonging to the selected page. The negative voltage level is approximately −5 V. The erasing method further includes applying a +5 V level through the decoder circuit to all unselected WLs and coupling 0 V from the low-voltage PGM buffer circuit to gates of the plurality of BL-select transistors to close all global BLs for preventing leakage. Still further, the erasing method includes applying approximately +10 V level to a selected TPW node associated with the selected byte and applying approximately 0 V level to all un-selected TPW nodes. Furthermore, the erasing method includes coupling 10 V or less to all selected global BLs/SLs associated with the selected byte through corresponding PN junctions between the selected TPW node and the selected global BLs/SLs. Moreover, the erasing method includes coupling 0 V to all un-selected global BLs and setting all un-selected global SLs to float. A bias difference between the selected WL and the selected BLs is about 16 V for inducing FN tunneling effect for erasing the selected byte.

In yet another specific embodiment, the present invention provides a method for operating an one-transistor-one-bit (1T1b) Flash-based EEPROM cell array during a program operation. The method includes biasing the 1T1b Flash-based EEPROM cell array for pre-charging all global SLs by applying a moderate positive voltage level between 0 V and 5V to all WLs from the decoder circuit, by setting the TPW nodes to ground reference voltage level at 0 V, by applying a high gate voltage level of approximately 16 V to gates of all SL-select transistors to allow passage of 10V pre-charge voltage from a bottom common bus to the global SLs, and by applying a LV Vdd level of 3V or less to gates and drain nodes of the plurality of BL-select transistors to set them in non-conduction state for prevent leakages. Further, the method includes biasing the 1T1b Flash-based EEPROM cell array for programming a selected bit in the selected page with pre-charged SLs by ramping only the moderate positive voltage level to the selected WL associated with the selected page to a high program voltage level of approximately 16 V and keeping the moderate positive voltage level for other WLs, by keeping the TPW nodes in the ground reference voltage level, by applying a low gate voltage level of 0 V to turn off the SL-select transistor connecting to the SL of the selected bit, and keeping other SL-select transistors On to allow passage of the common bus voltage of 10 V to un-selected global SLs, and by applying the LV Vdd level to gates of all BL-select transistors and applying a PGM inhibit voltage level to all but one drain nodes of the BL-select transistors to inhibit discharging of the corresponding global BLs except applying a PGM voltage level to said one drain node of the BL-select transistor to allow discharge of the BL associated with the selected bit. The PGM inhibit voltage level is equal to the LV Vdd of 3 V or less and the PGM voltage level is 0 V.

In still another specific embodiment, the present invention provides a method for operating an one-transistor-one-bit (1T1b) Flash-based EEPROM cell array during a read operation. The method includes biasing the 1T1b Flash-based EEPROM cell array for reading a selected byte by applying a low read voltage level of approximately 2.5 V through the decode circuit to a selected WL associated with the selected byte, by applying a ground reference voltage level of 0 V to other unselected WLs, by setting the TPW node associated with the selected byte to the ground reference voltage level, by applying 1 V or less from the Low-voltage PGM buffer circuit through a sense amplifier to all selected global BLs corresponding to the selected byte, by letting the un-selected global BLs to float; and by applying the ground reference voltage level from the source line control block circuit to all global SLs.

In an alternative embodiment, the present invention provides a two-transistor-two-bit (2T2b) Flash-based EEPROM cell. The 2T2b Flash-based EEPROM cell includes a first floating gate transistor and a second floating gate transistor formed a paired cell structure in series along a Y direction on a P-type substrate without any middle contact region. The paired cell structure includes a common Deep N-well (DNW) region formed in the P-type substrate, a common Triple P-well (TPW) region formed within the DNW region, a common drain region formed within the TPW region, and a common source region formed within the TPW region, the common source region being separated from the common drain region by a distance in the Y direction defined as a channel length. Additionally, the paired cell structure includes a first floating gate disposed on a first gate oxide overlying a first portion of the channel length. The paired cell structure further includes a first control gate disposed on an insulating layer over the top the first floating gate. The first control gate includes first extended regions surrounded edges of the first floating gate in X direction and the Y direction. The X direction is perpendicular to the Y direction. Furthermore, the paired cell structure includes a second floating gate disposed on a second gate oxide overlying a second portion of the channel length separated from the first portion of the channel length by a middle portion belonging to the TPW region without any contact region. Moreover, the paired cell structure includes a second control gate disposed on an insulating layer over the top of the second floating gate. The second control gate includes second extended regions surrounded edges of the second floating gate in the X and Y directions. The DNW region includes a first N+ contact region as a DNW node, the TPW region includes a P+ contact region as a TPW node, the common source region includes a second N+ contact region surrounded by the TPW region, the common drain region includes a third N+ contact region surrounded by the TPW region, the first control gate is connected to a first word line, and the second control gate is separately connected to a second word line.

In another alternative embodiment, the present invention provides a 2T2b Flash-based EEPROM cell array circuit. The 2T2b Flash-based EEPROM cell array circuit includes a matrix of a plurality of 2T2b Flash-based EEPROM cells arranged in rows and columns. Each 2T2b Flash-based EEPROM cell includes a first floating gate transistor and a second floating gate transistor connected in series as a paired cell structure on a P-type substrate without any middle contact region. The paired cell structure includes a Deep N-well (DNW) region formed in the P-type substrate, a Triple P-well (TPW) region formed within the DNW region, a drain region formed within the TPW region, and a source region formed within the TPW region, the source region being separated from the drain region by a distance defined as a channel length in a direction in parallel with the columns. The paired cell structure further includes a first floating gate disposed on a first gate oxide overlying a first portion of the channel length. Additionally, the paired cell structure includes a first control gate disposed on an insulating layer over the top the first floating gate. The first control gate includes first extended regions surrounded edges of the first floating gate. The paired cell structure further includes a second floating gate disposed on a second gate oxide overlying a second portion of the channel length separated from the first portion of the channel length by a middle portion belonging to the TPW region without any contact region. Furthermore, the paired cell structure includes a second control gate disposed on an insulating layer over the top of the second floating gate. The second control gate includes second extended regions surrounded edges of the second floating gate. The 2T2b Flash-based EEPROM cell array circuit further includes a plurality of paired word lines wherein each paired word lines laid in parallel with the rows of the matrix respectively connected to the first control gate and the second control gate of each 2T2b Flash-based EEPROM cell in each row. Additionally, the 2T2b Flash-based EEPROM cell array circuit includes a plurality of bit lines wherein each bit line is connected to the drain region of each 2T2b Flash-based EEPROM cell in a column and laid in parallel with the channel length direction of the paired cell structure. The 2T2b Flash-based EEPROM cell array circuit further includes a plurality of source lines wherein each source line is connected to the source region of each 2T2b Flash-based EEPROM cell in a column and laid in parallel with each bit line and perpendicular to each paired word lines. Furthermore, the 2T2b Flash-based EEPROM cell array circuit includes a row-decoder circuit connected to the plurality of paired word lines to provide voltage levels for erasing, programming, and reading one or more selected floating gate transistors from the matrix of the plurality of 2T2b Flash-based EEPROM cells. The 2T2b Flash-based EEPROM cell array circuit further includes a PGM buffer circuit connected to the plurality of bit lines to provide voltage levels for erasing, programming, and reading one or more selected floating gate transistors from the matrix of the plurality of 2T2b Flash-based EEPROM cells. Moreover, the 2T2b Flash-based EEPROM cell array circuit includes a source line control block circuit connected to the plurality of source lines to provide voltage levels for erasing, programming, and reading one or more selected floating gate transistors from the matrix of the plurality of 2T2b Flash-based EEPROM cells. Each row of the 2T2b Flash-based EEPROM cells corresponds to a page having the paired word lines respectively connected to a first row of the first floating gate transistors and a second row of the second floating gate transistors. Each first/second floating gate transistor corresponds to a stored bit by erasing, programming, and reading operations through a bias condition at a corresponding word line, a corresponding bit line, and a corresponding source line. Every eight consecutive first/second floating gate transistors in the page corresponds to a byte sharing a common TPW node connected to the TPW region of each corresponding paired cell structure. All bytes belonging to a same column in the matrix of the 2T2b Flash-based EEPROM cells shares the same common TPW node having a same reference voltage level.

In yet another alternative embodiment, the present invention provides a method for operating a two-transistor-two-bit (2T2b) Flash-based EEPROM cell array during a byte erase operation. The method includes providing a 2T2b Flash-based EEPROM cell array comprising a matrix of a plurality of 2T2b Flash-based EEPROM cells arranged in rows and columns. Each 2T2b Flash-based EEPROM cell includes a first floating gate transistor and a second floating gate transistor connected in series as a paired cell structure on a P-type substrate without any middle contact region. The paired cell structure includes a Deep N-well (DNW) region formed in the P-type substrate, a Triple P-well (TPW) region formed within the DNW region, a drain region formed within the TPW region, and a source region formed within the TPW region, the source region being separated from the drain region by a distance defined as a channel length in a direction in parallel with the columns. Additionally, the paired cell structure includes a first floating gate disposed on a first gate oxide overlying a first portion of the channel length. The paired cell structure further includes a first control gate disposed on an insulating layer over the top the first floating gate. The first control gate includes first extended regions surrounded edges of the first floating gate. Furthermore, the paired cell structure includes a second floating gate disposed on a second gate oxide overlying a second portion of the channel length separated from the first portion of the channel length by a middle portion belonging to the TPW region without any contact region. The paired cell structure further includes a second control gate disposed on an insulating layer over the top of the second floating gate. The second control gate includes second extended regions surrounded edges of the second floating gate. Additionally, the 2T2b Flash-based EEPROM cell array includes a plurality of paired word lines (WLs) wherein each paired WLs laid in parallel with the rows of the matrix respectively connected to the first control gate and the second control gate of each 2T2b Flash-based EEPROM cell in each row defined as a page. Each page has two rows of floating gate transistors in unit of byte. Each byte has eight bits and each bit corresponds to one floating gate transistor. The 2T2b Flash-based EEPROM cell array further includes a plurality of bit lines (BLs) wherein each BL is connected to the drain region of each 2T2b Flash-based EEPROM cell in a column and laid in parallel with the channel length direction of the paired cell structure. Still further, the 2T2b Flash-based EEPROM cell array includes a plurality of source lines (SLs) wherein each SL is connected to the source region of each 2T2b Flash-based EEPROM cell in a column and laid in parallel with each BL and perpendicular to each paired WLs. Furthermore, the 2T2b Flash-based EEPROM cell array includes a row-decoder circuit connected to the plurality of paired WLs to provide voltage levels for erasing, programming, and reading one or more selected floating gate transistors from the matrix of the plurality of 2T2b Flash-based EEPROM cells. The 2T2b Flash-based EEPROM cell array also includes a low-voltage PGM buffer circuit made by Vdd NMOS and PMOS devices connected to the plurality of BLs respectively through a plurality of BL-select transistors. Moreover, the 2T2b Flash-based EEPROM cell array includes a source line control block circuit including a high-voltage common bus device, a first half-page SL-select transistors connected to all SLs with odd column numbers and a second half-page SL-select transistors connected to all SLs with even column numbers, and a plurality of equalizer transistors each inserted in a pair of BL/SL corresponding to a column of 2T2b Flash-based EEPROM cells. Additionally, the method includes biasing the 2T2b Flash-based EEPROM cell array for erasing a selected byte in a selected page by applying a negative voltage level of approximately −5 V through the decode circuit to a selected WL associated with the selected byte belonging to one row of the selected page. The method of biasing further includes applying a +5 V level through the decoder circuit to an unselected WL of the another row of the selected page and all other WLs of unselected pages, coupling 0 V from the low-voltage PGM buffer circuit to gates of all BL-select transistors to close all BLs for preventing leakage, applying approximately +10 V level to a selected TPW node associated with the selected byte, applying approximately 0 V level to all un-selected TPW nodes, coupling 10 V or less to all selected global BLs/SLs associated with the selected byte through corresponding PN junctions between the selected TPW node and the selected global BLs/SLs, and setting all un-selected global BLs/SLs to 0V or float state. The bias difference between the selected WL and the selected BLs is about 16 V for inducing FN tunneling effect for erasing the selected byte.

In still another alternative embodiment, the present invention provides a method of operating a two-transistor-two-bit (2T2b) Flash-based EEPROM cell array during a page program operation. The method includes biasing the 2T2b Flash-based EEPROM cell array for pre-charging all SLs. The method of biasing further includes applying a moderate positive voltage level between 0 V and 5V to all WLs from the decoder circuit, setting the TPW nodes to ground reference voltage level at 0 V, and applying a high gate voltage level of approximately 16 V to gates of all SL-select transistors to allow passage of 10V pre-charge voltage from a high-voltage common bus device to the SLs. Additionally, the method of biasing includes applying a LV Vdd level of 3V or less to gates and drain nodes of all BL-select transistors to set them in non-conduction state for prevent leakages. Furthermore, the method of biasing includes coupling an equalizer voltage level of approximately 16 V to gates of the plurality of equalizer transistors to balance the voltage level of each pair of BL/SL corresponding to a column of 2T2b Flash-based EEPROM cells. The method of operation also includes biasing the 2T2b Flash-based EEPROM cell array for programming a selected bit in the selected page with pre-charged SLs. The method of programming includes ramping up only the moderate positive voltage level applied to the selected WL associated with the selected page to a high program voltage level of approximately 16 V, and keeping the moderate positive voltage level for other WLs. Additionally, the method of programming includes keeping the TPW nodes in the ground reference voltage level and retaining the equalizer voltage level of 16 V to each of the plurality of equalizer transistors. The method of programming further includes applying a low gate voltage level of 0 V to turn off the SL-select transistor connecting to the SL of the selected bit, and keeping other SL-select transistors On to retain the pre-charge voltage of 10 V to un-selected SLs. Furthermore, the method of programming includes applying the LV Vdd level to gates of all BL-select transistors and applying a PGM inhibit voltage level equal to the LV Vdd level to all but one drain nodes of the BL-select transistors to inhibit discharging of the corresponding BLs except applying a PGM voltage level to said one drain node of the BL-select transistor to allow discharge of the BL associated with the selected bit. The PGM inhibit voltage level is equal to the LV Vdd of 3 V or less and the PGM voltage level is 0.0 V.

In yet still another alternative embodiment, the present invention provides a method for operating a two-transistor-two-bit (2T2b) Flash-based EEPROM cell array during a read operation. The method includes biasing the 2T2b Flash-based EEPROM cell array for reading a selected byte in a page. The method of biasing includes applying a low read voltage level of approximately 2.5 V through the decode circuit to a selected WL of the selected byte in the page, applying a read pass voltage level of approximately 4.5 V to another WL in the page, and applying a ground reference voltage level of 0 V to other unselected WLs. Additionally, the method of biasing includes setting the TPW node associated with the selected byte to a ground reference voltage level of 0V. The method of biasing further includes applying 0 V to gates of all equalizer transistors to isolate the BL from the SL in each pair and applying 1 V or less from the low-voltage PGM buffer circuit through a sense amplifier to all selected BLs corresponding to the selected byte. Furthermore, the method of biasing includes letting the un-selected BLs to float and applying the ground reference voltage level from the source line control block circuit to all SLs while letting all SL-select transistors on by coupling approximately 2.5 V to their gates.

Many benefits can be achieved by applying the embodiments of the present invention. Particularly, using a novel 1T1b flash-based EEPROM cell to replace traditional 2T1b FLOTOX-based EEPROM cell remove extra source line or bit line select transistor associated with each cell so that cell size can be reduced. By introducing a novel negative control gate voltage to the word line along with a reduced bit line voltage level for bit erase operation, no need to apply high voltage to BL/SL select transistors any more. The bit line inhibit voltage is forward from a Triple P-well node voltage to the BL and SL where only a low-voltage Vdd-controlled select transistor is connected. As the result, the stress on 1T1b EEPROM cell and SL-select and BL-select HV transistors is drastically reduced and the stress-caused degradation of P/E cycles is substantially removed. The new 1T1b EEPROM cell can be further reduced in cell size as restriction from the channel length scaling limited by high BL voltage is suppressed. Therefore, the improved techniques presented in this invention can support the current application trend that demands low-cost high-density data-oriented storage solution allowing the scaling below 90 nm at higher temperature automotive environment. Additionally, several embodiments of the 1T1b EEPROM cell array are provided along with a half-page and full-page divided programming and pre-charging period for each program cycle. Further, the present invention uses low-voltage page PGM buffer to replace high-voltage page PGM buffer. All LV PGM buffers are made of Vdd devices to save silicon area, which further leads to a memory array with a higher density storage. Furthermore, embodiments of the present invention provide a 2T2b EEPROM cell which can additionally help reducing the effective cell size from the 1T1b EEPROM counterpart by removing the contact region in the middle portion of the channel length. Other operations of program, erase, and read can be kept the same.

These and other benefits may be described throughout the present specification and more particularly below.

BRIEF DESCRIPTION OF THE DRAWINGS

FIG. 9A is a schematic diagram of top layout view of a two-transistor-two-bit (2T2b) Flash-based EEPROM cell according to an embodiment of the present invention.

FIG. 9B is a diagram of two circuit symbols of the 2T2b Flash-based EEPROM cell circuit according to an embodiment of the present invention.

FIG. 9C is a diagram of a cross-sectional view of the 1T1b Flash-based EEPROM cell according to an embodiment of the present invention in accordance with the cell layout shown in FIG. 9A and symbol and equivalent circuit shown in FIG. 9B.

FIG. 12B is a table of the detailed bias voltage conditions for Erase, Program, and Read operations of the 2T2b Flash-based EEPROM cell array according to embodiments of the present invention.

DETAILED DESCRIPTION OF THE INVENTION

The present presentation relates to the continuation of improvement over the traditional EEPROM data-oriented Combo NVM design. But unlike an disclosure by the same inventors with the title of "A EEPROM-based, Data-oriented Combo NVM design" based on traditional large 2T1b FLO-TOX-based EEPROM cell structure and process technology, the present invention provide a novel operation scheme of an 1T1b Data-oriented EEPROM cell design, which utilize a Flash-based cell structure and process made by prior art. The advantage of this single-bit 1T EEPROM cell size is about ⅓ of 90λ² of the traditional 2T1b FLOTOX-based EEPROM cell but with a disadvantage in its operation scheme it shows of inferior of P/E endurance cycle of 300K, rather than 1M.

By contrast, when compared to the traditional NOR flash cell size, this flash-based 1T1b EEPROM cell is about 1.5× larger but its performance of the P/E endurance of 300K is superior to the traditional NOR flash cell with 100K cycles only. Therefore, in order to fulfill certain application trends for nonvolatile memory devices, improved byte-alterable and data oriented EEPROM design with a smaller but retaining the same P/E cycles at higher temperature environment is needed. The present invention is disclosed here to take on above issues and resolve it in a very economic way. The key breakthrough of this new Flash-based EEPROM NVM design of the present can have a much smaller cell size to the EEPROM and higher scaling in channel length and can be operating at higher temperature (more than 85° C.) in auto-grade environment.

Figures 1A, 1B:
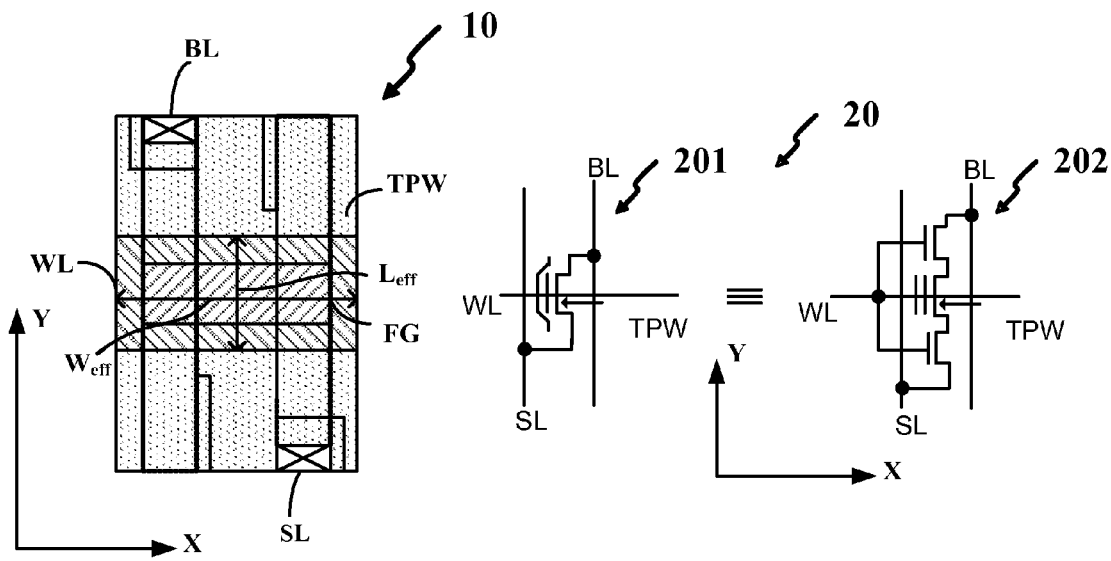
FIG. 1A is a schematic diagram of top layout view of an one-transistor-one-bit (1T1b) Flash-based EEPROM cell of the prior art.
FIG. 1B is a diagram of two circuit symbols of the 1T1b Flash-based EEPROM cell circuit of the prior art.

FIG. 1A is a schematic diagram of top layout view of an one-transistor-one-bit (1T1b) Flash-based EEPROM cell of the prior art. The 1T1b means one EEPROM transistor stores one bit of SLC digital data. The SLC term means Single-Level-Cell storage as frequently being used in NAND or NOR flash industry. The top layout view of the 1T1b Flash-based EEPRPM cell 10 is shown, although a prior art, it will be used in a 1T1b flash-based EEPROM cell array to execute a novel operation scheme according to embodiments of present invention. As shown, a control gate (CG) is connected to a word line (WL) and is made of Poly2 (a second layer of poly-silicon) on top of a floating gate (FG). The floating gate layer of the floating gate transistor (FT) is made of Poly1 (first layer of poly-silicon), which is formed under beneath Poly2 with two wings extending out in X-direction from an N+ active layer of channel region. Note, unlike the traditional EEPROM cell, it does not have BN+ layer in layout to surround the so-called tunnel-oxide window nearing an N+ Drain node. The Poly2 and Poly1 layers are not self-aligned. As shown in the layout, the Poly2 layer covers whole Poly1-FG and extends our four edges of Poly1 layer. The Drain and Source node has respective half contact hole for metal1 (first layer of metal contact) connection running in parallel in a Y-axis direction. The overlapping of a P2 (second P-type layer) layer and a N-active layer in layout defines the effective channel length, $L_{eff}$, in the Y direction and the channel width, $W_{eff}$, is in the X direction of each FT. The whole NMOS 2-poly Flash-based EEPROM cell is formed on a triple P-well (TPW) bulk.

FIG. 1B is a diagram of two circuit symbols of the 1T1b Flash-based EEPROM cell circuit of the prior art. The 1T1b Flash-based EEPROM cell circuit symbol 20 corresponds to the layout of the 1T1b Flash-based EEPROM cell 10. In the left of the figure, it shows a 2-poly floating-gate 1T1b Flash-based EEPROM cell's symbol circuit 201. It comprises one (high-voltage) HV NMOS 2-poly floating-gate transistor with a Poly2 control gate node, CG, denoted as WL (referring to word line), a Poly1 floating gate, FG, formed right below the CG but above the cell channel, the N+ Drain node denoted as BL (referring to bit line), the N+ Source node denoted as SL (referring to source line) and the bulk denoted as TPW (Triple P-well) respectively. The TPW region is formed within the Deep N-well (DNW) region, which is formed on top of a P-substrate, P-Sub. Note, WL stands for word line, BL stands for bit line, SL stands for source line.

In a cell array layout made from these 1T1b Flash-based EEPROM cells of prior art, the BLs and SLs are running vertically and are perpendicular to WLs. Unlike the traditional 2T FLOTOX-based EEPROM cell, this 1T1b Flash-based EEPROM cell does not have extra 1T 1-poly Select transistor connecting in series with this 1T 2-poly FT.

In the right of the figure, it shows the electrically equivalent circuit 202 of the 1T1b 2-poly floating-gate Flash-based EEPROM cell's symbol circuit 201. Each 1T1b Flash-based EEPROM cell 201 actually comprises a circuit 202 of three HV NMOS transistors being connected in series with their common poly2-gate coupled to WL, the Drain to BL and the Source to SL on the common bulk of TPW.

The three HV NMOS transistors of each 1T1b EEPROM cell 202 equivalently comprises two 1-poly, poly2-gate, HV NMOS Select transistors being placed on both top and bottom along with one 2-poly NMOS FG transistor placed in the middle. The BL and SL metal lines are running vertically in Y direction, while the WL line is running perpendicularly to the BL and SL. Since this 1T1b EEPROM cell 201 equivalently is a 3T transistor cell 202 but in more compact layout, there is no need to have extra 1T select transistor like that in 2T FLOTOX-based EEPROM cell of the prior art. Any HV applied to the selected BL or SL in the cell array can be blocked away to reach the floating gate of each cell. As a result, even without extra 1T Select transistor as seen in the traditional 2T FLOTOX-based EEPROM cell, no BL or SL disturbance will happen to this 1T1b Flash-based EEPROM cell with mush smaller cell size.

Figure 1C:
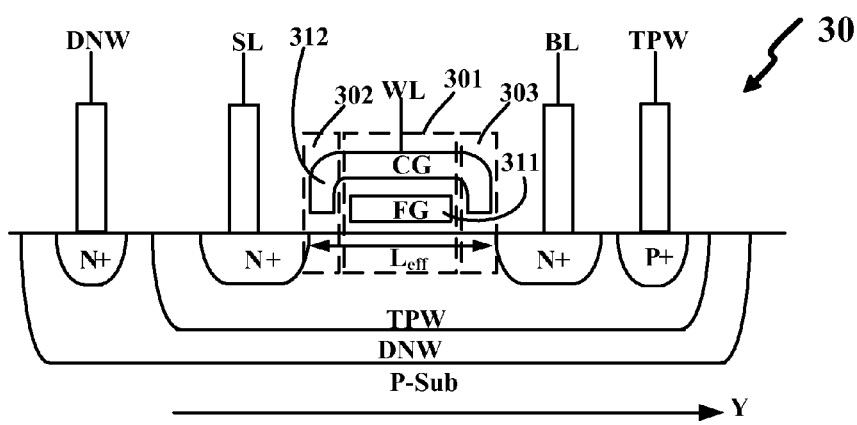
FIG. 1C is a diagram of a cross-sectional view of the 1T1b Flash-based EEPROM cell of prior art in accordance with the cell layout shown in FIG. 1A and symbol and equivalent circuit shown in FIG. 1B.

FIG. 1C is a diagram of a cross-sectional view of the 1T1b Flash-based EEPROM cell of prior art in accordance with the cell layout shown in FIG. 1A and symbol and equivalent circuit shown in FIG. 1B. As seen from the cross-sectional view, this 1T1b 2-poly NMOS Flash-based EEPROM transistor 30 is formed within the TPW region surrounded by DNW region which is on top of a P-substrate region, including five electric nodes of DNW, SL, WL, BL and TPW. As shown, the 1T HV NMOS 2-poly floating-gate EEPROM transistor 30 is not being made by the method of self-aligned process. As a result, the right and left edges of the floating gate of the FT transistor 30 are not made coincidentally between Poly2 layer 312 and Poly1 layer 311. The Poly1-FG 311 is formed beneath and surrounded by the top Poly2-CG 312 and above the cell's channel. The CG 312 is tied to a word line WL. The channel length of the FT transistor 30, $L_{eff}$, is defined in Y-axis direction and is formed between an N+ Drain node and an N+ Source node. The N+ Drain node is connected to a bit line BL and the N+ source node is connected to a source line SL. Effectively in circuit perspective, the 1T HV NMOS 2-poly floating-gate EEPROM transistor 30 comprises three transistors connected in series in Y-axis between the BL and the SL. These three transistors include two single-poly Poly2-gate NMOS transistors 302 and 303 situated in left and right corners and one 2-poly floating gate transistor 301 situated right in the middle. The effective channel length $L_{eff}$ of this 1T HV NMOS 2-poly floating-gate EEPROM transistor 30 comprises of two channel lengths of Poly2-transistor plus one 2-ploy floating gate transistor. The whole channel length $L_{eff}$ has to sustain the punch-through voltage when BL HV is applied to the cell array. The TPW node is connected to bulk of the FT transistor 30 through a P+ contact region and the DNW node is connected out through another N+ contact region.

Figure 2:
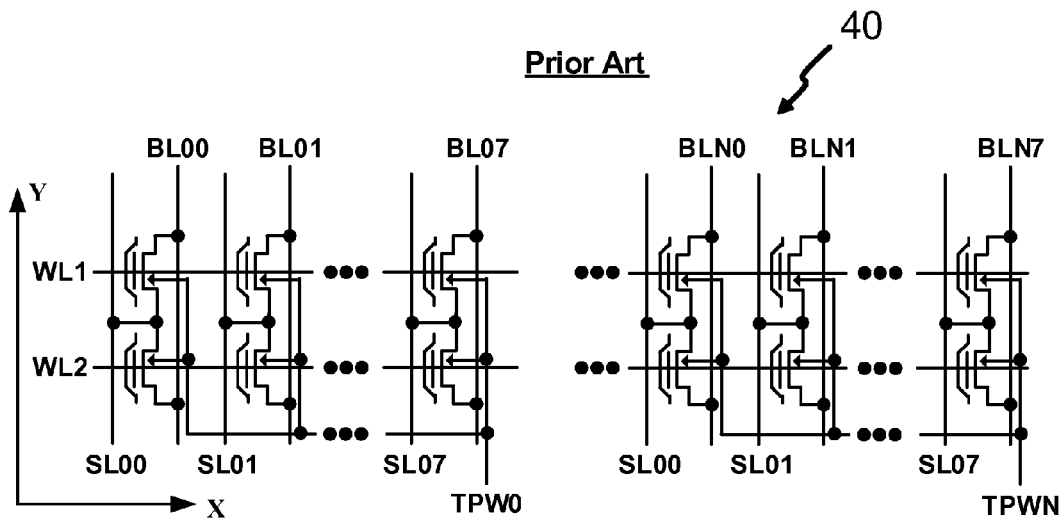
FIG. 2 is diagram of an 1T1b Flash-based EEPROM cell array circuit formed in a matrix comprising of two rows of the 1T1b Flash-based EEPROM cells of the prior art.

FIG. 2 is diagram of an 1T1b Flash-based EEPROM cell array circuit formed in a matrix comprising of two rows of the 1T1b Flash-based EEPROM cells of the prior art. This diagram is to illustrate a partial memory array circuit 40 made by the 1T1b Flash-based EEPROM cells (201 in FIG. 1B) of the prior art arranged in a matrix comprising of only two rows respectively connected to two word lines, denoted as WL1 and WL2. Each row is defined as a page comprising (N+1) bytes with only one dedicated WL. N is an integer greater than 0. Each cell has its own dedicated BL and SL. In other words, each cell has one-pair of BL and SL. All BLs and SLs of all 1T1b Flash-based EEPROM cells in same columns are then connected to multiple pairs of common global BLs, denoted as BLN0, BLN1, . . . to BLN7, and the common SLs, such as SLN0, SLN1, . . . and SLN7 running in Y-axis direction. In other words, each byte contains eight BLs and eight SLs. For example, for the first byte in any row, it associated with eight bit lines BL00, BL01, . . . BL07 corresponding to eight source lines SL00, SL01, . . . SL07. All common CGs of floating gate transistors formed in the same row are tied together and connected to WL1 and WL2, running in X-axis direction.

Lastly shown in FIG. 2, all bulks of floating gate transistors in the two rows are tied to a common node of TPW in the same byte. Note, every byte in same vertical layer is formed in same vertical TPW. Different bytes in different columns are placed in different TPW. The first byte of every page is placed in the same vertical TPW. Similarly, the corresponding bytes in each page are placed in the different TPW, which may be subjected to different bias voltage conditions. The reason to have the different bytes in different TPW voltages are because the normal operation of this 1T1b Flash-based EEPROM cell array, the TPW voltage of respective byte in the selected page would be selected or non-selected for erase and program operation.

Figure 3:
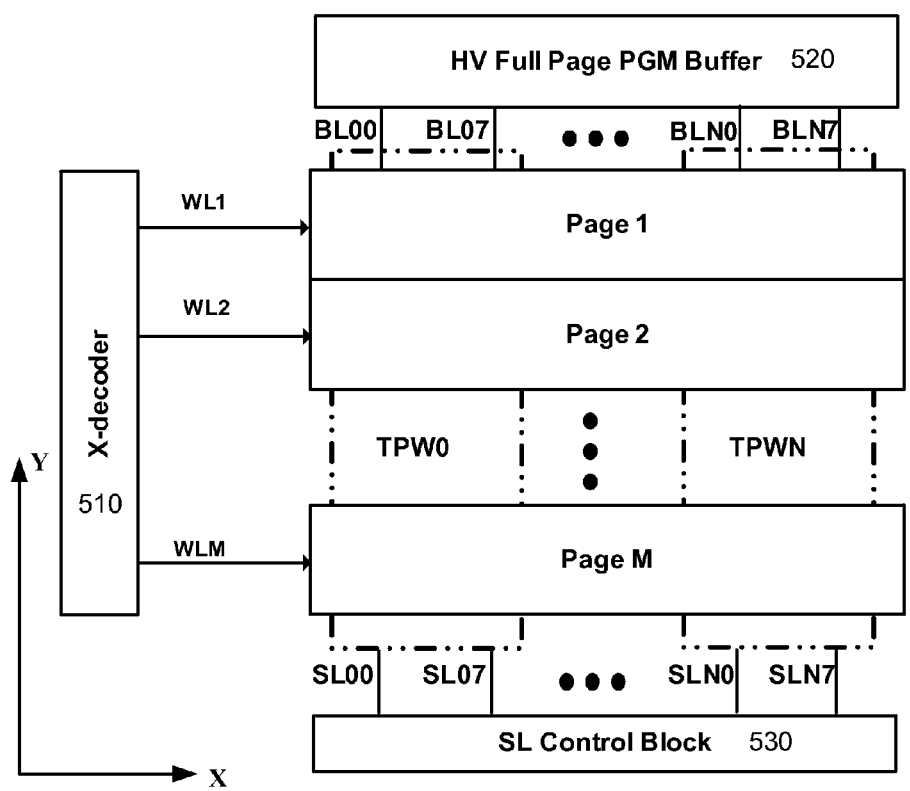
FIG. 3 is a block diagram of an 1T1b Flash-based EEPROM cell array that includes an X-decoder, a HV PGM buffer, a SL Control circuit block, and 1T1b EEPROM cell array of the prior art.

FIG. 3 is a block diagram of an 1T1b Flash-based EEPROM cell array 50 that includes an X-decoder, a HV PGM buffer, a SL control block, and 1T1b EEPROM cell array of the prior art. As shown, the X-decoder 510 is a row voltage control circuit designated for providing various bias voltage levels selectively for some or all the word lines of the cell array 50 laid in X-axis. The HV PGM buffer 520 is a high-voltage Programmable Memory Buffer device used to temporarily store the (N+1)×8 data bits of incoming string data for programming into the selected page of this 1T1b EEPROM cell array 50. These data bits are coming from the external I/O pins via a Y-decoder and all BLs to reach the HV PGM Buffer 520. The SL control block 530 is also referred as a column voltage control circuit designated for providing various bias voltage levels selectively for some or all SLs in the cell array 50. The 1T1b EEPROM cell array includes M pages, denoted as Page 1, Page, 2, . . . , Page M, laid in horizontal rows respectively connected to M outputs of the X-decoder 510 via dedicated WLs, denoted as WL1, WL2, . . . , WLM. Each Page is one row having one WL with the length of (N+1) bytes. Additionally, each page has (N+1)×8 BLs, such as BL00, . . . , BL07, . . . , BLN0, . . . , to BLN7, connected to the HV PGM Buffer 520 through (N+1)×8 global BLs. Each page also has (N+1)×8 SLs, such as SL00 to SLN7, connected to the SL Control Block 530 through (N+1)×8 global SLs.

Figures 4A, 4B:
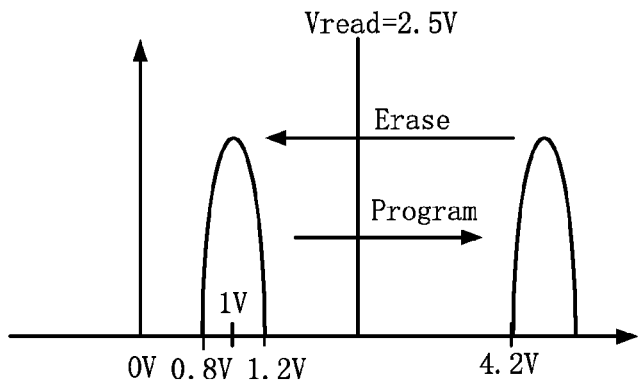
FIG. 4A is plot of two sets of threshold voltage level distributions of the 1T1b Flash-based EEPROM cell of the prior art.
FIG. 4B is a table of the detailed bias voltage conditions for Erase, Program, and Read operations of the 1T1b Flash-based EEPROM cell array of the prior art.

FIG. 4A is a plot of one set of two preferable threshold voltage level $V_t$ distributions of the 1T1b Flash-based EEPROM cell of prior art. As described in FIG. 1B on the feature of this unique 1T1b EEPROM cell, it is effectively a 3T1b cell structure (202 in FIG. 1B) with a 2-poly floating gate transistor sandwiched by two 1-poly transistors. In order to avoid the false data read both threshold voltage level, $V_{tH}$ and $V_{tL}$, are defined as only positive values. No negative value of cell's threshold voltage is generated to result in the cell leakage in the selected common BL during read and program operations.

Specifically, the programmed threshold voltage level, $V_{tH}$, was preferably defined to a higher positive value above 4.2V after program operation by prior art. In certain embodiments of the present invention, this is also one preferable threshold voltage set. The $V_{tH}$-state of a cell (bit) in the selected byte corresponding to a programmed threshold level is a non-conduction state which can be achieved by subjecting to FN-channel tunneling effect when a high program voltage level of approximately 16 V is applied to the selected WL versus the selected TPW coupled to 0 V. Electrons would be injected into the FG of selected floating gate transistor storage cells after the predetermined program time of about 1 ms. The $V_{tL}$-state of a cell corresponding to erased threshold level is also defined as a positive but with a lower center value of approximately 1.0V. In this erased state, electrons are removed out from the FG of selected floating gate transistor storage cells in the selected bytes after the predetermined erase time of about 1 ms. This is very unlike the traditional 2T FLOTOX-based EEPROM cell, where the $V_{tL}$-state had a negative value of −2.0 V. In another aspect, a read voltage level $V_{read}$ is set at 2.5 V. More details would be explained below.

FIG. 4B is a table of a set of the biased voltage conditions of key operations of the 1T1b Flash-based EEPROM cell array of prior art for the respective nodes of Selected WL, Unselected WLs, Selected TPW, Selected BL/SL and Unselected BL/SL etc. These key operations include Byte-erase, Page-erase, Page-program and Read.

In Byte-erase operation, the TPW node of the selected Byte is coupled to 14V along with the Selected WL coupled to 0V and the selected BL/SL coupled to 14V to induce the FN channel tunneling effect in through the channel region of the floating gate transistor. But for those unselected bytes for erase, the unselected BL/SL and TPW nodes are coupled to 7V and the Selected WL is also coupled to 7 V to inhibit the FN tunneling effect. After the Byte-erase operation, only the selected cells in the selected bytes in the selected page would be erased to a low $V_{tL}$ state due to 14 V is applied across between all CGs and channel (via TPW node) of the selected bytes. But the TPW nodes of the unselected bytes in the same page are coupled to +7V to inhibit inducing the FN tunneling effect so that the $V_t$s of the unselected bytes in the selected page would not be affected and remain the same after erase.

For those unselected cells in the unselected (M−1) pages, the unselected BLs are coupled to 5.5V along with 11V being coupled to the unselected M−1 WLs so that the threshold voltage levels of unselected cells would remain unchanged (regardless of $V_{tH}$ and $V_{tL}$) because only 8.5 V (14 V−5.5 V) is applied between the CG and the channel of each unselected cell.

In Page-erase operation, all TPW nodes and BL/SLs in the selected page are coupled to 14V along with the selected WL of the selected page coupled to 0 V to induce FN tunneling effect. At the same time, the unselected WLs of all unselected pages are coupled to 11 V to inhibit the FN tunneling effect. After page-erase operation, the selected cells in all bytes of the selected page would be erased to a low $V_{tL}$ state of around 1.0 V. But the cells in the unselected M−1 pages would keep their threshold levels $V_t$s unchanged, regardless those cells are in $V_{tH}$ and $V_{tL}$ states.

In Page-program operation, all TPW nodes and BL/SLs in selected bytes in the selected page are reversely coupled to 0 V along with the Selected WL coupled to 16 V to induce the FN tunneling effect. But all BLs/SLs of unselected bytes are coupled to 10 V along with the M−1 unselected WLs coupled to 0 V to inhibit the FN-tunneling effect. After page-program operation, the selected cells in the selected bytes of the selected page would be programmed to either a high $V_{tH}$ state due to 16 V between corresponding CGs and channels is sufficient to induce the FN tunneling effect. For those unselected bits, the BL/SLs are selectively coupled to 10 V in the selected page to inhibit FN tunneling effect due to only 6 V (16 V−10 V) is applied between corresponding CGs and channels. Thus the threshold levels $V_t$s of those unselected cells in the selected page would remain the same before and after page-program operation.

For those unselected cells in the unselected M−1 pages, the M−1 WLs are coupled to 0V to inhibit inducing the FN tunneling effect so that the unselected cells in the unselected M−1 pages would keep their threshold levels $V_t$s unchanged, regardless of $V_{tH}$ and $V_{tL}$.

In read operation, the selected WL of a selected page is coupled to 2.5 V for 3 V Vdd operation but the unselected M−1 WLs coupled to 0V to inhibit leakage in the selected 1V BLs with 0V SLs corresponding to the selected bits in the selected page. During read in embedded EEPROM application, one byte for 8-bit CPU read, 2-byte for 16-bit CPU read and 4-byte for 32-but CPU read for fast read speed. But in slow 8-pin serial EEPROM design, one bit read is very common to save area and power consumption.

Figure 5A:
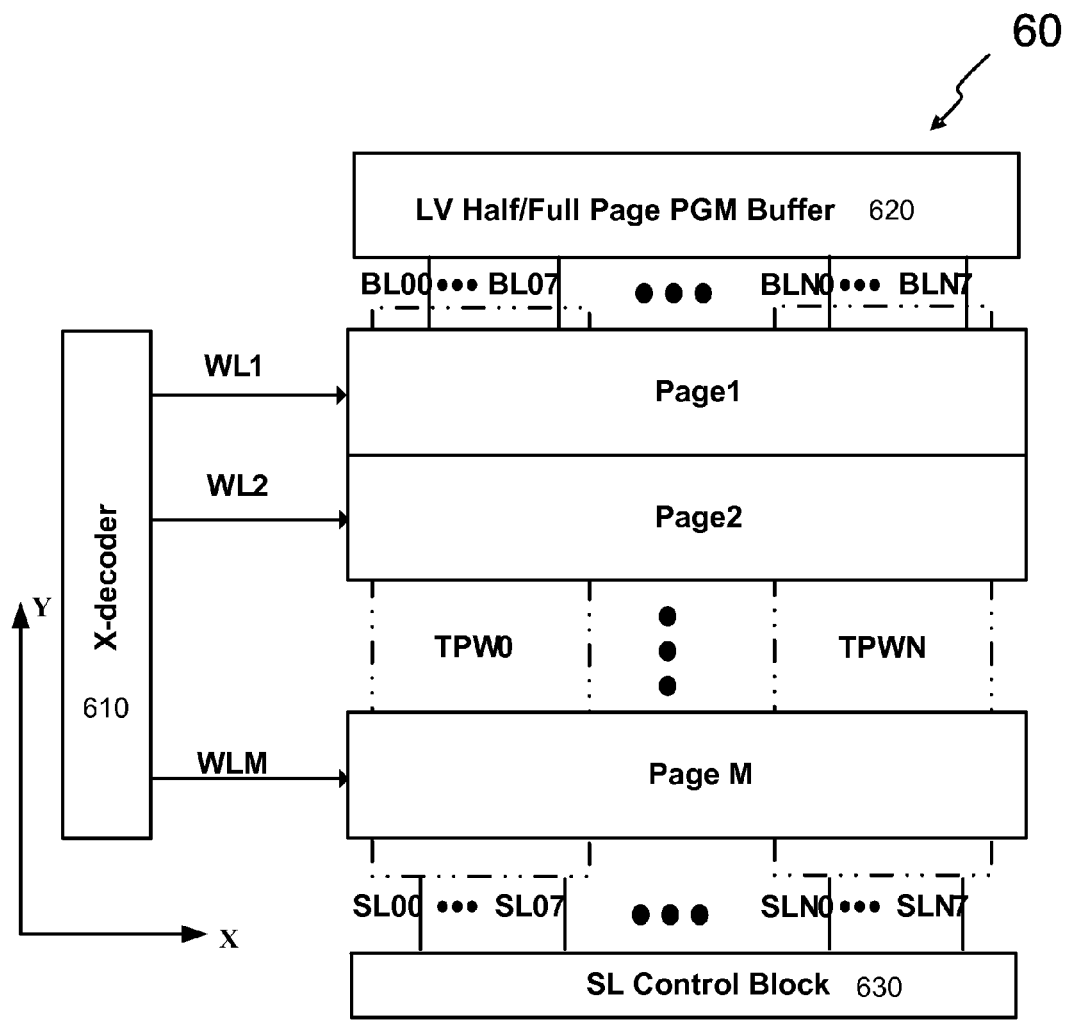
FIG. 5A is a block diagram of an 1T1b Flash-based EEPROM cell array that includes an X-decoder, a LV Half/Full Page PGM buffer, a SL Control circuit block, and 1T1b EEPROM cell array according to an embodiment of the present invention.

FIG. 5A is a block diagram of an 1T1b Flash-based EEPROM cell array that includes an X-decoder, a LV Half/Full Page PGM buffer, a SL Control circuit block, and 1T1b EEPROM cell array according to an embodiment of the present invention. Instead of using HV Page PGM buffer, a LV Half/Full Page PGM buffer 620 is adopted in the memory cell array. Still, like the cell array shown in FIG. 3, an X-decoder 610 and a SL control block circuit 630 are included along with an 1T1b EEPROM cell array formed in the middle.

In a specific embodiment, the 1T1b EEPROM cell array is divided into a plurality of M horizontal pages denoted as Page 1, Page 2, . . . , and Page M. M is an integer greater than 1. Each Page is electrically made of one row of the 1T1b EEPROM cells having their CGs connected in series and each cell is defined in layout shown in FIGS. 1*a*, 1*b*, and 1*c*. The page M is associated with one input connection denoted as WLM in the left corresponding to a word line laid in parallel to the row direction. Each row has (N+1)×8 BLs, such as BL00 to BLN7 connected to the corresponding lines of the top LV Half/Full Page PGM Buffer 620 through global BLs laid in vertical direction and also has (N+1)×8 SLs, such as SL00 to SLN7, connected to the corresponding lines of the bottom SL Control Block circuit 630 through global SLs in parallel with the global BLs. All M Pages would have M WLs, WL1 to WLM, that are respectively connected to M outputs of the X-decoder 610.

The LV Full/Half Page PGM Buffer 620 is configured to temporarily store the (N+1)×8 data bits of incoming string data for programming into the selected page of this 1T1b EEPROM cell array. These data bits are coming from the external I/O pins via a Y-decoder and all BLs to reach the LV Half/Full Page PGM Buffer. Note, the LV Page PGM Buffer is made of LV Vdd devices. Thus this LV Half/Full Page PGM Buffer size is drastically reduced. For Vdd 3V operation, all devices of this LV Page PGM Buffer can be made from 3V PMOS and NMOS devices as opposed to the traditional HV 14V devices to achieve substantial area reduction. For large density 1T1b or 2T2b EEPROM array die size, the reduction from HV PGM Buffer to LV PGM Buffer can be up to 3% in die size.

Figure 5B:
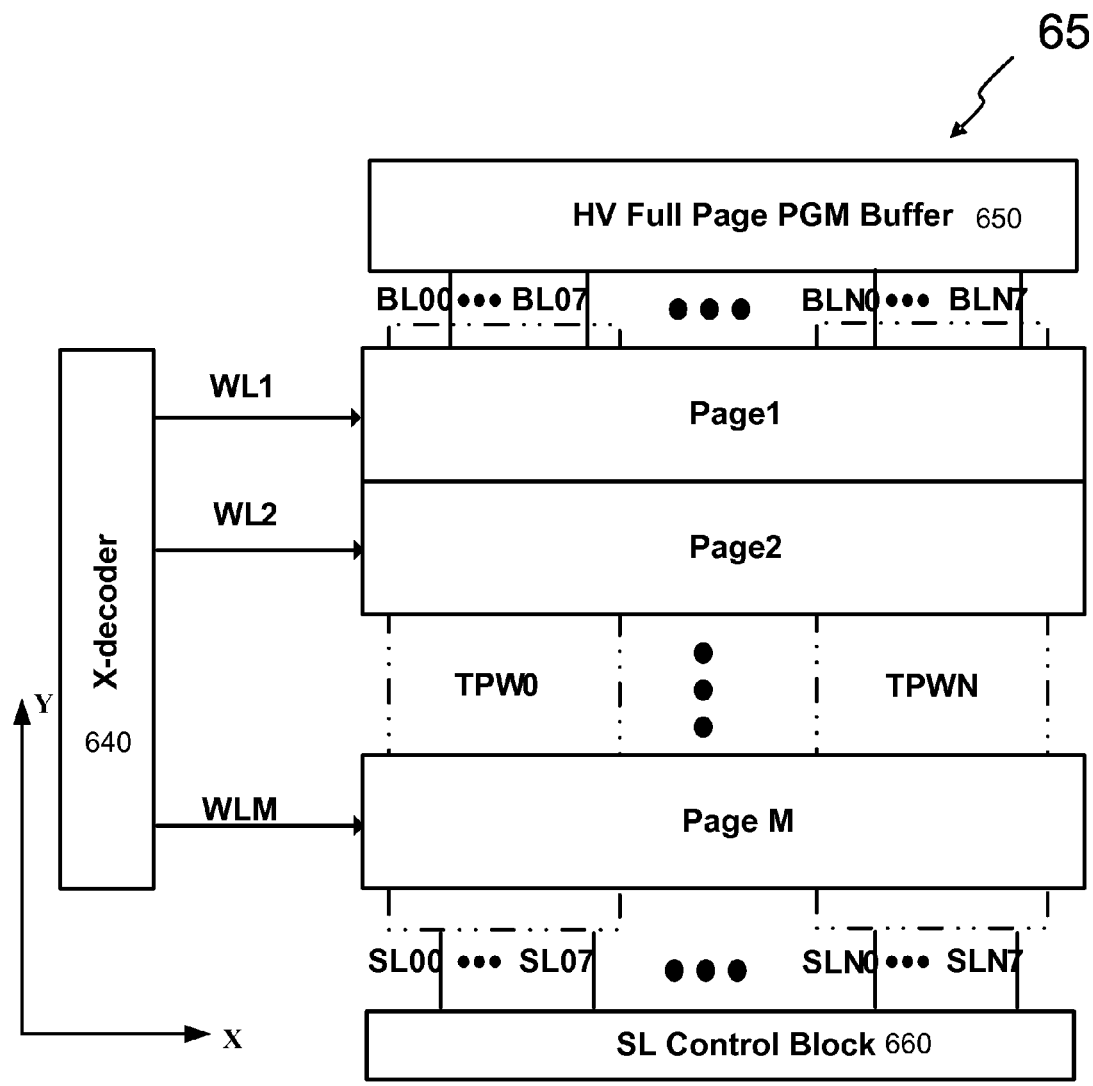
FIG. 5B is a block diagram of an 1T1b Flash-based EEPROM cell array that includes an X-decoder, a HV Full Page PGM buffer, a SL Control circuit block, and 1T1b EEPROM cell array according to an alternative embodiment of the present invention.

FIG. 5B is a block diagram of an 1T1b Flash-based EEPROM cell array that includes an X-decoder, a HV Full Page PGM buffer, a SL Control circuit block, and 1T1b EEPROM cell array according to an alternative embodiment of the present invention. FIG. 5B is a preferable circuit block diagram of the 1T1b Flash-based EEPROM array 65 of prior art and will be used for the present invention. The 1T1b Flash-based EEPROM array 65 includes an X-decoder 640 disposed in the left of the whole block. X-decoder 640 is substantially the same as the X-decoder 610. The 1T1b Flash-based EEPROM array 65 includes a HV Full Page PGM Buffer 650 located on the top of the block, replacing the LV Half/Full Page PGM buffer 620. In this case, the devices for building the HV Full Page PGM Buffer 650 have to be 16V PMOS and NMOS devices to avoid the breakdown. Further, the 1T1b Flash-based EEPROM array 65 has a SL Control circuit block 660 disposed on the bottom of the block. An 1T1b EEPROM cell array is formed in the middle to connect other component circuits mentioned above, which is substantially the same as the traditional EEPROM array (FIG. 3).

Figures 6A, 6B:
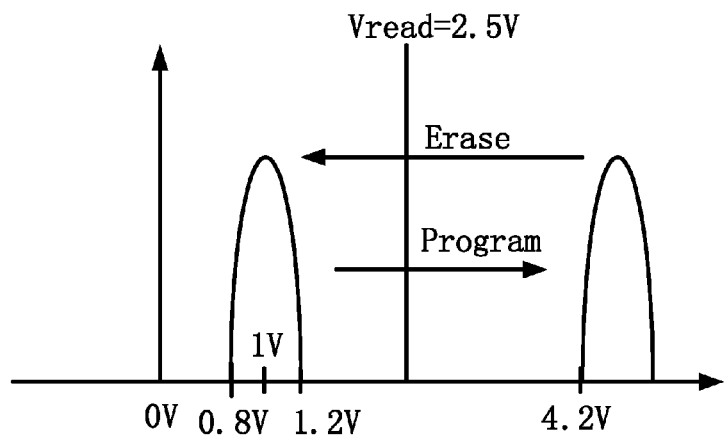
FIG. 6A is a plot of threshold voltage level distributions of the 1T1b Flash-based EEPROM cell according to an embodiment of the present invention.
FIG. 6B is a table of the detailed bias voltage conditions for Erase, Program, and Read operations of the 1T1b Flash-based EEPROM cell array according to embodiments of the present invention.

FIG. 6A is plot of threshold voltage level distributions of the 1T1b Flash-based EEPROM cell according to an embodiment of the present invention. In an embodiment, one set of preferable threshold voltage level $V_t$ distributions of 1T1b Flash-based EEPROM cell is used primarily for operating an 1T1b Flash-based EEPROM cell array to be presented below. Due to an unique feature that this 1T1b Flash-based EEPROM cell is effectively a 3T cell structure with one 2-poly floating gate transistor sandwiched by two 1-poly transistors without need of any extra 1T Select transistor in this 1T1b EEPROM cell to block the leakage, the cell's high and low threshold levels, $V_{tH}$ and $V_{tL}$, are all defined with positive values to avoid the false data read results. The program threshold voltage level is associated with the high level of $V_{tH}$ and the erase threshold voltage level is associated with the low level of $V_{tL}$, each defines the logic state of the data retained by the 1T1b Flash-based EEPROM cells. In this 1T1b Flash-based EEPROM cell, the $V_{tH}$ is set to a high value above 4.2V for the advantage of a short program time without an iterative program and verify lengthy process.

In an embodiment, the erase threshold voltage level is defined to decrease the threshold voltage level $V_t$ down to a voltage level of $V_{tL}$, approximately 1.0V with a small distribution of 0.2 V. This is a conduction state for the 1T1b Flash-based EEPROM cell and is performed by a reverse Fowler Nordheim-channel tunneling effect. Electrons are driven out of the floating gate of the FT of the 3T cell structure into the TPW region through the channel after a predetermined erase time of approximately 1 ms. Conversely, in the embodiment, the program threshold voltage level is defined to increase the threshold voltage level $V_t$ from the erased threshold voltage level $V_{tL}$ of approximately 1.0V to the programmed threshold voltage level $V_{tH}$ of above approximately 4.2V after a program operation embodying the concepts of the present invention. The cell is a non-conduction state and is accomplished with a Fowler Nordheim-channel tunneling effect. The electrons are injected to the floating gate of the 1T1b EEPROM cell after the predetermined program time of approximately 1 ms. The 1T1b EEPROM cell does not allow negative erased and programmed threshold voltage level. In another aspect, the read voltage level $V_{read}$ is set at 2.5 V.

In an alternative embodiment, another set of preferable threshold voltage level $V_t$ distributions of 1T1b Flash-based EEPROM cell includes a moderately high threshold $V_{tH}$ value defined between 2.0-3.0V, unlike the case defined in FIG. 6A with a $V_{tH}$ value greater than 4.2V ($V_tH \geq 4.2V$). This set of threshold level distribution may be used for an EEPROM cell array with a different arrangement of plurality of 1T1b Flash-based EEPROM cells. A disadvantage of the lower $V_{tH}$ value plus a narrow window requiring the lengthy bit-by-bit iterative program and verify operation as today's NAND MLC program algorithm. But the advantage is to save the effective cell size when two 1T1b EEPROM cells are connected in series like NAND for cell size reduction. The details would be explained below.

FIG. 6B is a table of the detailed bias voltage conditions for Erase, Program, and Read operations of the 1T1b Flash-based EEPROM cell array according to embodiments of the present invention. As shown, preferable sets of different biased voltage conditions of the key operations of this Flash-based 1T1b EEPROM cell array of the present invention are provided. Specifically, preferable sets of bias voltages are defined optimally for applying to the nodes of Selected WL, Unselected WLs, Selected and Unselected TPW, Selected BL/SL and Unselected BLs/SLs in the respective operations in accordance with the organization of 1T1b EEPROM cell array as seen in FIG. 5. In certain embodiments, the key operations of the present invention include Byte-erase, Byte-program, Page-erase, Page-program and Read operations.

For Byte-erase operation, as oppose to the prior art wherein the selected TPW nodes of the selected bytes is coupled to 14 V along with the Selected WL coupled to 0 V and unselected M−1 WLs to +11 V, in an embodiment of the present invention, the selected TPW nodes and BL/SLs of the selected bytes are coupled to 10 V along with the Selected WL coupled to a negative bias level of approximately −5 V to induce the FN tunneling effect. By contrast, the unselected M−1 WLs are coupled to about +5 V with unselected TPW Nodes and unselected BLs/SLs coupled to 0 V to inhibit the FN tunneling effect. After byte-erase, only the selected cells in the selected bytes in the selected page would be erased to a low $V_{tL}$ state (defined in FIG. 6A) due to about 14-16 V is applied across between all CGs and channels of the selected bytes. The cells in the unselected M−1 pages and in the unselected bytes in the selected page would keep their threshold voltage levels $V_t$s unchanged, regardless of $V_{tH}$ and $V_{tL}$, due to only about −5V for the unselected bytes in the selected page or about 5 V for the unselected bytes in the M−1 unselected pages is applied between corresponding CGs and channels.

For Page-erase operation, all TPW nodes and BL/SLs of all bytes in the selected page are coupled to 10 V along with the Selected WL coupled to a negative bias level of −5 V to induce the FN tunneling effect. After page erase, the selected cells in all bytes of the selected page would be erased to a low $V_{tL}$ state. But the unselected M−1 pages all M−1 WLs are coupled to +5 V to inhibit inducing the FN tunneling effect so that the unselected cells in the unselected M−1 pages would keep their threshold voltage levels $V_t$s unchanged, regardless of $V_{tH}$ and $V_{tL}$.

For Page-program operation, all TPW nodes and BL/SLs associated with the selected cells in the selected page are reversely coupled to 0 V along with the Selected WL coupled to a high program voltage level of approximately 16 V to induce the FN tunneling effect. But the unselected BLs/SLs of the unselected cells are coupled to 10 V to inhibit the FN tunneling effect. After Page-program, the threshold voltage levels $V_t$s of the selected cells of the selected page would be programmed to a high $V_{tH}$ state due to the high program voltage level of 16V between CGs and channels of corresponding cells is sufficient to induce the FN tunneling effect. For those unselected cells, the BL/SLs are selectively coupled to 10 V in the selected page to inhibit FN tunneling effect due to only about 6 V (16V−10V) is applied between CGs and channels of the unselected cells. This 6V difference between a CG and a channel is insufficient to induce the FN-tunneling effect. Thus for those unselected cells in the selected page the threshold voltage levels $V_t$s would remain the same before and after page program operation.

For those unselected cells in the unselected M−1 pages, the M−1 WLs are coupled to 0V to inhibit inducing the FN tunneling effect so that the unselected cells in the unselected M−1 pages would keep their threshold voltage levels $V_t$s unchanged, regardless of $V_{tH}$ and $V_{tL}$.

For read operation, the selected WL is coupled to a predetermined read voltage level of 2.5 V for 3V Vdd operation. But the unselected M−1 WLs are coupled to 0V to inhibit leakage in the selected BLs coupled to 1V along with 0V coupled to SLs. During read operation in embedded EEPROM application, one byte for 8-bit CPU read, 2-byte for 16-bit CPU read and 4-byte for 32-but CPU read for fast read speed. But in slow 8-pin serial EEPROM design, one bit read is very common to save area and power consumption.

In an specific embodiment, the program operation of the 1T1b EEPROM cell array is preferably divided into two stages. The first stage is a Half-page Pre-charge Period and the second stage is a Half-page Program Period. During the program operation, the whole page is divided into two half-pages. Each time to execute the program operation, only a first Half-page of one row is selected for erasing, programming and verifying first. Once pass, then the second Half-page is selected for erasing, programming and verifying. The advantage for using two steps of Half-page program to replace one step of Full-page program is to allow usage of LV Vdd Page PGM Buffer to replace conventional HV 16V Page PGM Buffer to save the silicon area and make data loading optimization easier. The first Pre-charge Period for the Half-page Program operation will be described below.

Figure 7A:
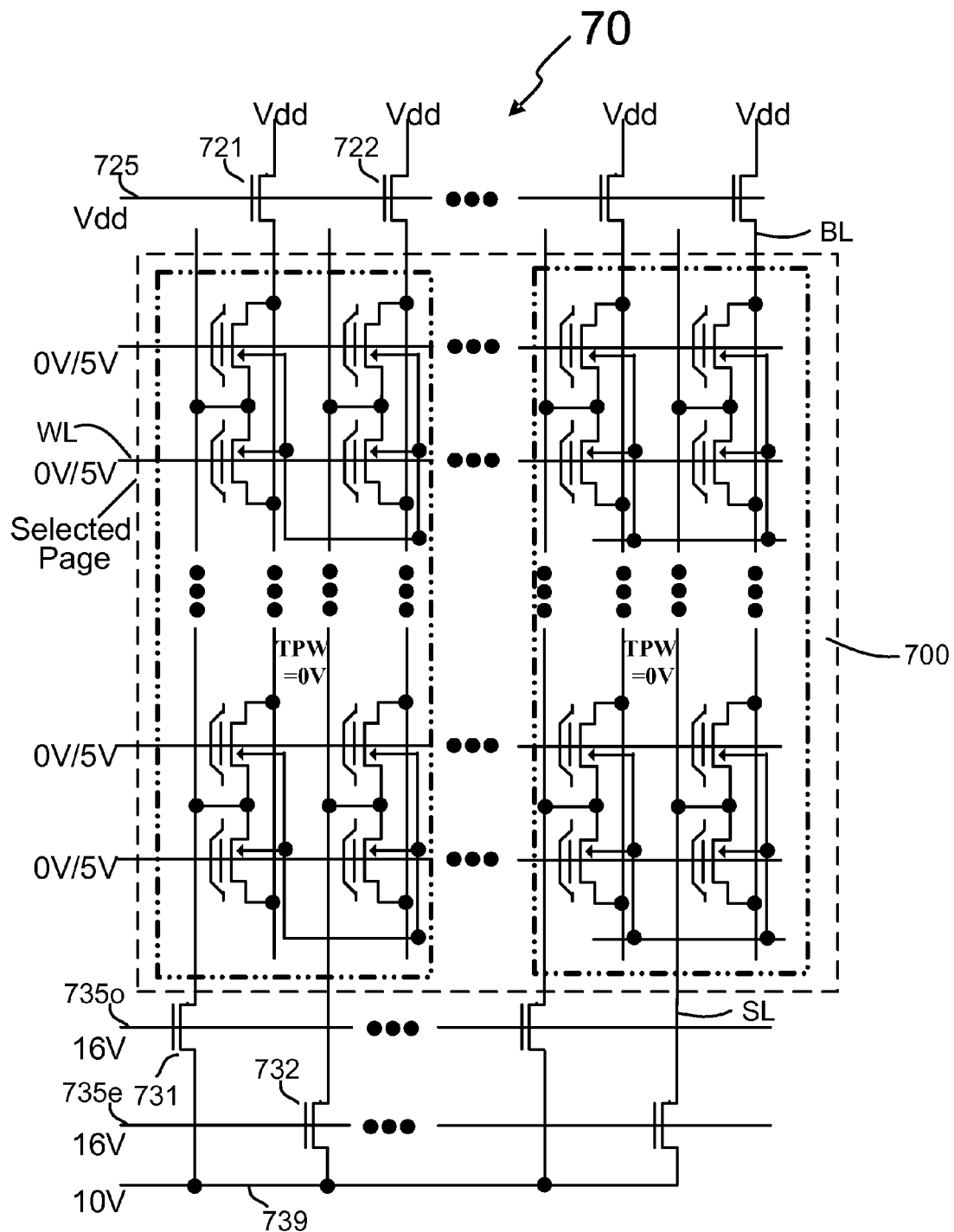
FIG. 7A is a diagram of an 1T1b Flash-based EEPROM cell array circuit in pre-charge period of half-page program operation according to an embodiment of the present invention.

FIG. 7A is a diagram of an 1T1b Flash-based EEPROM cell array circuit in pre-charge period of half-page program operation according to an embodiment of the present invention. As shown, the 1T1b Flash-based EEPROM cell array circuit 70 is subjected to a preferable set of the biased voltage conditions for the Pre-charge Period of Half-page program operation provided in the present invention. The 1T1b EEPROM array 700 is being formed in a matrix that comprises a plurality of pages of rows connected to corresponding WLs along with a plurality of columns made of a plurality of bytes, each byte having eight pairs of BLs and SLs. Each pair of BL/SL corresponds to a column number which can be either an odd number or even number. All BL/SLs are divided into two half-page groups. In one Half-page group all control gates are connected to odd column decoder 721 associated with a PGM buffer and in another Half-page group all control gates are connected to even column decoder 722 associated with the PGM buffer. The PGM buffer (not fully shown) is made by LV Vdd NMOS and PMOS devices (620 in FIG. 5A). In FIG. 7A, part of the PGM buffer is shown to include a row of column decoders 721, 722, . . . , each made by a transistor coupled to each BL. This column decoder transistor having its source node connected to a BL and its drain node connected to rest part of the LV PGM buffer is called a BL-select transistor throughout this specification. During the Half-page Pre-charge period, it is optional that only the gates of column decoders in one group having either odd or even numbers are open to allow full passage of an inhibit BL voltage of approximately 10 V (defined for unselected BLs, see FIG. 6B). The gates of column decoders of another group are optionally close so that the other half-page BLs would be left floating. Alternatively, all gates of the BL-select transistors can be set to a non-conduction state to let all BLs floating.

During the pre-charge period in Half-page program operation, all SLs in the 1T1b EEPROM cell array 700 are being pre-charged to approximately +10 V in accordance with the Inhibit SL voltage condition specified (for unselected SLs) in FIG. 6B along with all BLs are left floating. The +10 V pre-charge voltage level comes from a bottom common bus 739 associated with the SL control block circuit (e.g., 630 in FIG. 5A) when it is applied with 10 V. Additionally, the SL control block circuit includes a plurality of HV NMOS SL-select transistors, also divided into a half-page group 731 with odd column numbers and another half-page group 732 with even column numbers, respectively coupled their drain nodes to the SLs and their source nodes to the common bus 739. In a specific embodiment, all gates 735o of the SL-select transistors 731 with odd column numbers and gates 735e of the SL-select transistors 732 with even column numbers are respectively coupled to a common gate voltage up to approximately 16 V to allow the full passage of 10V from the common bus 739 to all SLs, regardless of Select and un-select SLs. Alternatively, only SLs in one half-page group can be pre-charged by allowing just gates of just one half-page group to open by coupling, either 735o or 735e, to the high gate voltage. But in order to prevent the leakages to the Page Buffer and stress though all 1T1b EEPROM cells, all top BL-select transistors 721, 722, . . . are biased in a non-conduction state by applying Vdd on all drains nodes in each BL-select transistors along with a Vdd on the common gate 725.

Once all gates and drain nodes are biased in same Vdd voltage level, all BL-select transistors are in non-conduction state, any voltage on all BL nodes of the 1T1b EEPROM cell array 700 would not leak to the top PGM buffer circuit. During the pre-charge period of the program operation (for either half-page or full page operation), all TPW nodes are coupled to a ground reference level of 0 V. As a result, the pre-charged +10V would be sustained in all SLs as all cells in 1T1b EEPROM cell array 700 are in conduction state when about 5 V (which is higher than $V_{tH}$ level) is applied to all WLs in an embodiment during the Pre-charge period. In other embodiments, any voltages between 0 V to 5 V can be applied to the WLs. One reason to apply preferable 5 V level to all WLs of all 1T1b EEPROM cells is to reduce the stress experiences by the BLs subjected to about 10 V during the Pre-charge period.

Figure 7B:
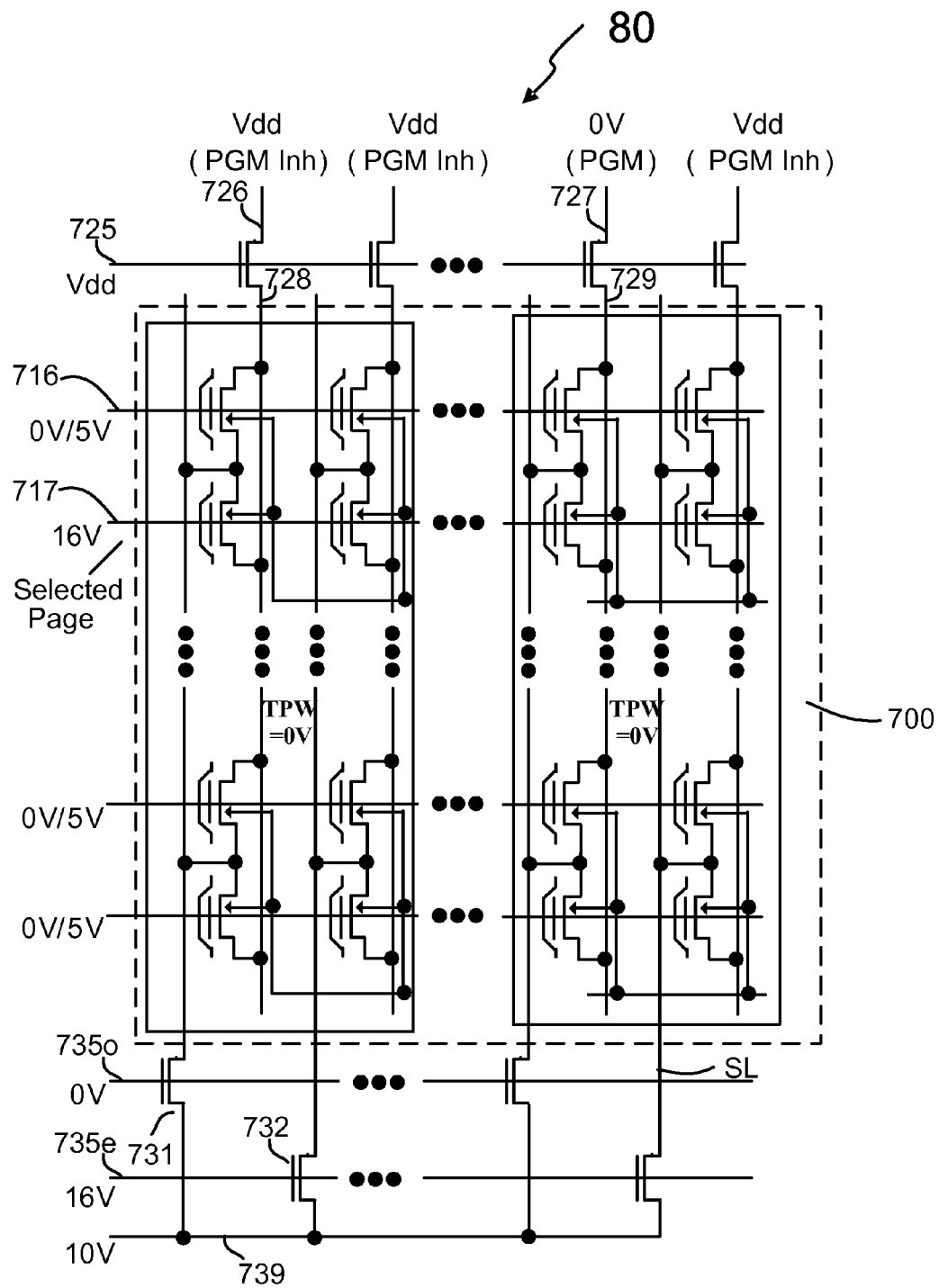
FIG. 7B is a diagram of an 1T1b Flash-based EEPROM cell array circuit in programming period of half-page program operation according to an embodiment of the present invention.

FIG. 7B is a diagram of an 1T1b Flash-based EEPROM cell array circuit in programming period of half-page program operation according to an embodiment of the present invention. As shown, 1T1b Flash-based EEPROM cell array circuit 80 is subjected to another preferable set of the biased voltage conditions for operating in the second-step of Programming Period of the two-stage Half-page program operation. The difference between Half-page operation and Full-page operation is the column decoder. In the Half-page architecture, there are odd and even column decoders, while in the Full page scheme, only one type of column decoders.

In a specific embodiment, before executing the programming period operation, all SLs have been fully pre-charged to 10 V during the Pre-charge period. But the BLs are either left floating (when the WLs are applied to 0 V) or charged to about $5V-V_t$ (when the WLs are applied to 5V). If the voltage level of a selected cell is at its low value of $V_{tL}$, the BL's voltage level is around 4.0V. If the voltage level of the selected cell is at its high value of $V_{tH}$, the BL's voltage level would be $5V-V_{tH}$, which is around 0 V if the maximum $V_{tH}$ is 5.0 V or greater. But in multiple WLs array, some cells in some WLs must have low $V_{tL}$ values. As a result, initially when all SLs are pre-charged to +10 V, all non-floated BLs would be pre-charged to 4.0V typically.

As the second Half-page program period starts, the biased voltage conditions are illustrated in FIG. 7B. All TPW nodes are still coupled to the ground reference level of 0 V. The selected WL 717 is ramped slowly to a high program voltage level of approximately +16V while unselected WLs 716 remain at about 5V. The selected BLs 729 in the selected Half-page are being discharged to 0 V through top BL-select transistors. The BL-select transistors are applying a PGM voltage or a PGM Inhibit voltage respectively to the drain node 727 corresponding to the selected BLs 729 and the drain nodes 726 corresponding to the unselected BLs 728. The PGM voltage is 0 V and the PGM Inhibit voltage is Vdd (of 3V or less for LV Vdd devices). For the inhibit (or unselected) BLs 728 the corresponding BL-select transistors are closed as their gates 725 are coupled to a same Vdd level so that those BLs 728 are left floating and retain the pre-charged voltage level of 10 V passed from corresponding SLs. Thus the voltage drop between the Inhibit BLs 728 and selected gate (WL) 717 would be always kept below 6V, which is 16V–10V, to inhibit programming into these cells. For the selected BLs 729, the corresponding BL-select gates are open as their drain nodes are coupled to 0 V (PGM voltage) so that the selected BLs 729 are discharged to 0 V. While the selected program gate WL is 16 V to provide nearly 16 V across the gate to the BLs 729. As a result, only the selected cells corresponding to those selected BLs 729 in the selected Half-page are programmed in the Half-page programming period with the threshold voltage levels of the cells being increased from $V_{tL}$ to $V_{tH}$ value. Note, the $V_{tH}$ value is greater than 4.2 V (see FIG. 6A). All the unselected cells in the remaining selected Half-page and in the unselected Half-page remain unchanged.

Note, during the Half-page programming period, the SL control block circuit is configured to coordinate the selected half-page and the unselected half-page by setting different states for corresponding SL-select transistors 731 with odd column numbers or SL-select transistors 732 with even column numbers. For example, when the half-page with odd column numbers is a selected half-page, the gates 735o of SL-select transistors 731 with odd column numbers would be closed by coupling to a low gate voltage level of 0 V to prevent shorting between the PGM buffer and bottom common bus 739. At the same time, the gates 735e of SL-select transistors 732 with even column numbers are open by coupling to a high gate voltage of 16 V to allow passage of 10 V from the bottom common bus 739 to the corresponding SLs and floated BLs.

Figure 7C:
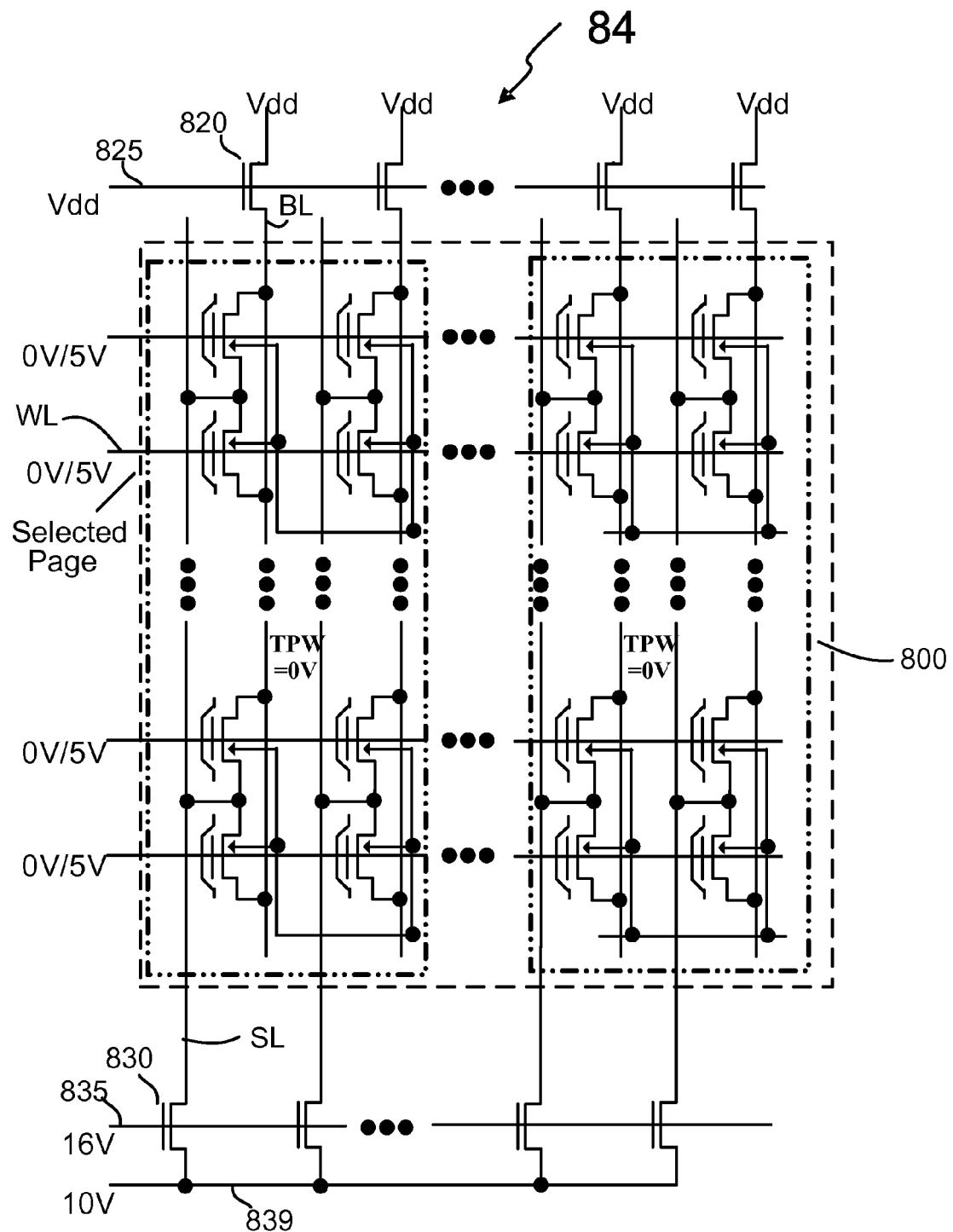
FIG. 7C is a diagram of an 1T1b Flash-based EEPROM cell array circuit in pre-charge period of full-page program operation according to an embodiment of the present invention.

FIG. 7C is a diagram of an 1T1b Flash-based EEPROM cell array circuit in pre-charge period of full-page program operation according to an embodiment of the present invention. As shown, the 1T1b Flash-based EEPROM cell array circuit 84 is subjected to another preferable set of the biased voltage conditions for a first step of Pre-charge Period of Full-page program operation in the 1T1b Flash-based EEPROM cell array 800. In a specific embodiment, the Full-page operation is associated with only one type of column decoder while the PGM buffer used here remains to be made by LV Vdd NMOS and PMOS devices for saving silicon area in each die. Accordingly, one row of SL-select transistors 830 are respectively coupled to all SLs with their gates 835 commonly coupled to a gate voltage to control their open or close states. During the Pre-charge period, all gates 835 of the SL-select transistors 830 are applied to a high gate voltage level to allow a HV voltage of 10V passage from a bottom common bus 839 to all SLs. At the same time, one row of BL-select transistors 820 has all their gates coupled to Vdd and all drain nodes coupled to Vdd to let all BLs in floating. During the pre-charge period of the program operation (for either half-page or full page operation), all TPW nodes are coupled to ground reference level of 0 V. All WLs in the pre-charge period are applied about 5 V or less to allow passage of the pre-charge voltage to all BLs. Therefore, all SLs/BLs are fully pre-charged to 10V, if all the BLs are left floating by the BL-select transistors. In case some BLs are not in floating, those BLs may be charged to $5V-V_{tL}$, which is around 4.0V if the threshold level of corresponding cell is at the low value. Of the BLs may be charged to $5V-V_{tH}$, which is around 0V if the threshold level of corresponding cell is at the high value and the maximum $V_{tH}$ is over 5.0V. In multiple WLs array, some cells in some WLs must have a low $V_{tL}$ value. As a result, initially when all SLs are pre-charged to 10V, all non-floating BLs would be pre-charged to 4.0V typically.

Figure 7D:
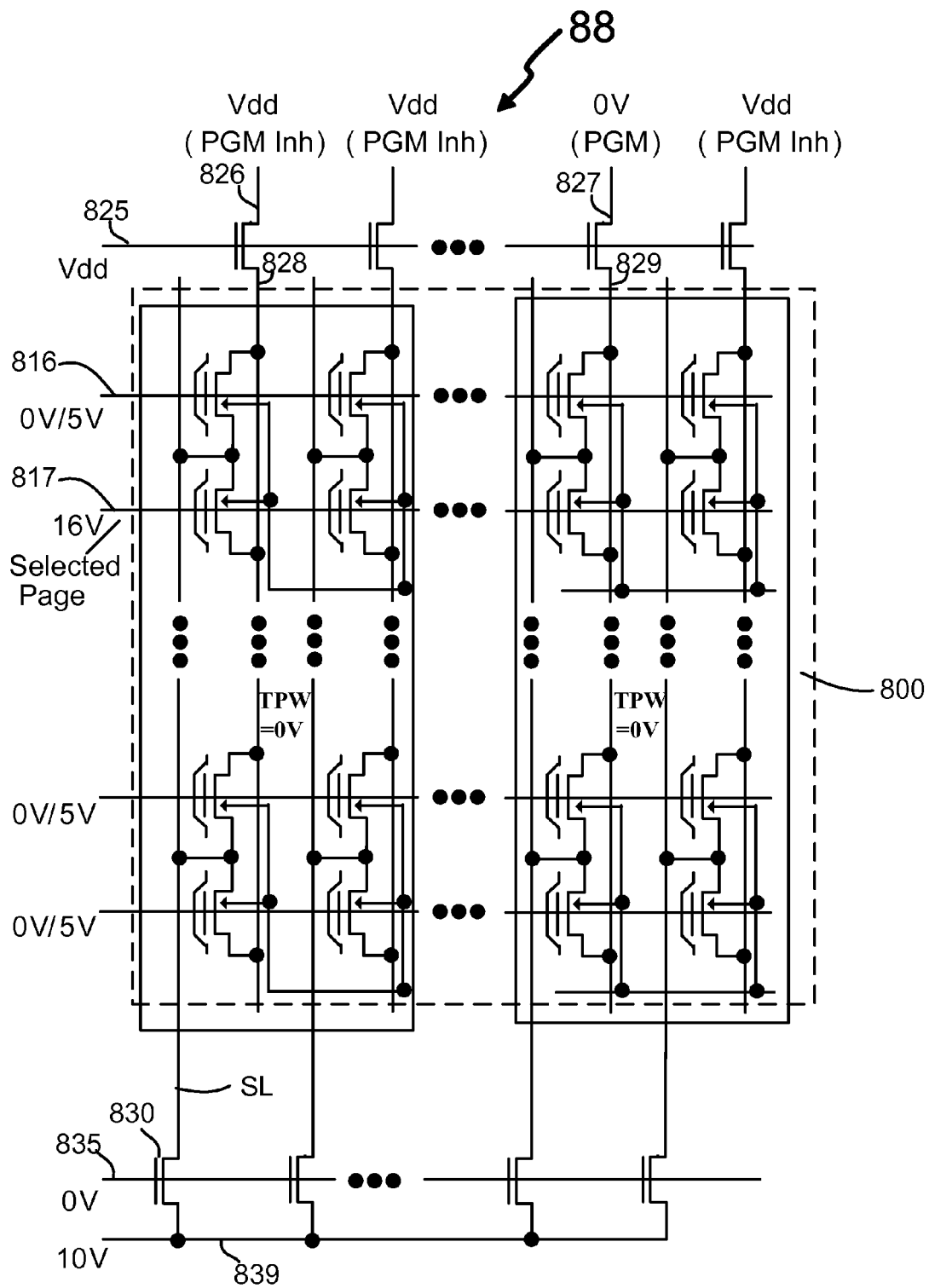
FIG. 7D is a diagram of an 1T1b Flash-based EEPROM cell array circuit in programming period of full-page program operation for a selected page according to an embodiment of the present invention.

FIG. 7D is a diagram of an 1T1b Flash-based EEPROM cell array circuit in programming period of full-page program operation for a selected page according to an embodiment of the present invention. As shown, the 1T1b Flash-based EEPROM cell array circuit 88 is subjected to another preferable set of the biased voltage conditions for the second-step of the Period of Full-page program operation for this 1T1b EEPROM cell array 800. The full-page programming period operation of this cell array is performed in substantially the same as the half-page programming period except that there is only one type of SL-select transistors 830 having their gates all coupled to 0 V to close for preventing short between the bottom common bus 839 and the PGM buffer on top through the discharged selected BLs. Correspondingly, the PGM buffer is a LV Full Page PGM buffer including a row of BL-selected transistors having gates coupled to LV Vdd (e.g., 3V of less). For programming into the selected bits in a selected page, the selected WL 817 ramps the voltage level to a high program voltage of approximately 16 V and let the unselected WLs 816 stay at about 5 V or less. Corresponding to the selected bits, the selected BLs 829 are discharged by let the drain nodes 827 of corresponding BL-select transistors to be coupled to 0 V. But the drain nodes 826 of BL-selected transistors corresponding to the unselected BLs are coupled to Vdd to keep those BLs in the pre-charged voltage level. All TPW nodes are set to the ground reference level of 0 V. Therefore, only the selected bits in the selected page are programmed with their threshold voltage levels being increased from $V_{tL}$ to $V_{tH}$ value. Note, the $V_{tH}$ value is greater than 4.2 V (see FIG. 6A). All unselected bits in the selected page and M−1 unselected pages are unchanged in their threshold voltage levels.

Figure 7E:
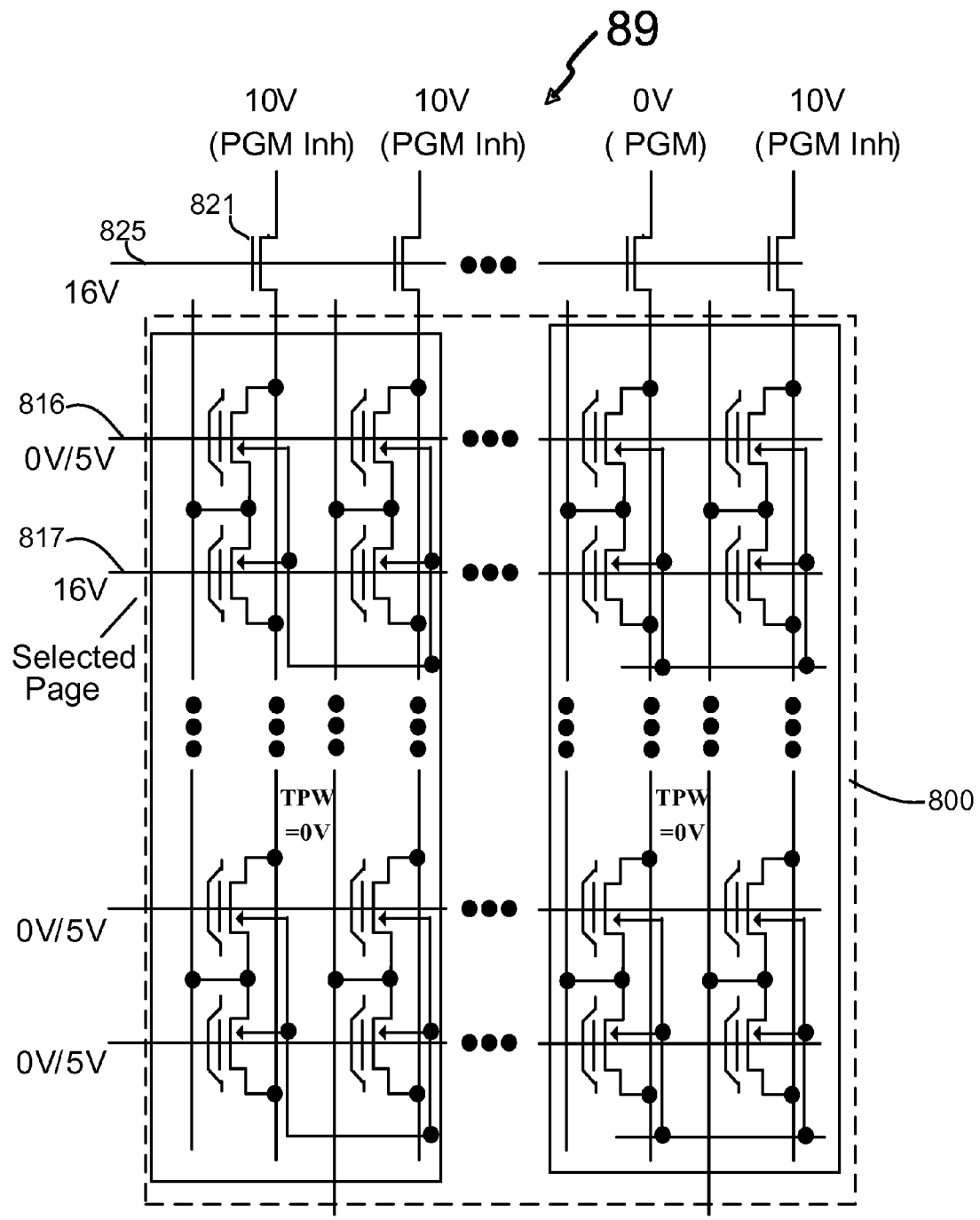
FIG. 7E is a diagram of an 1T1b Flash-based EEPROM cell array circuit with a HV PGM Buffer in programming period of full-page program operation according to an embodiment of the present invention.

FIG. 7E is a diagram of an 1T1b Flash-based EEPROM cell array circuit with a HV PGM Buffer in programming period of full-page program operation according to an embodiment of the present invention. As shown, the 1T1b Flash-based EEPROM cell array circuit 89 is subjected to another preferable set of the biased voltage conditions for a Full-page program operation for this 1T1b EEPROM cell array 800 along with a HV Page PGM Buffer. In an embodiment of the present invention, the HV page PGM buffer includes a plurality of column decoders made by HV NMOS BL-select transistors 821 having their common gates coupled to a high voltage level of 16 V. Other operation scheme would be the same as the cell array with LV Full-Page PGM Buffer except that the drain nodes of the BL-select transistors are selectively coupled to PGM voltage of 0 V for the selected BLs and HV PGM Inhibit voltage of approximately 10 V to the unselected BLs. In other words, for those unselected program bits the BL inhibit voltage of 10 V (as defined in FIG. 6B) is not passed over from the pre-charged SLs but directly comes from the HV page buffers according to the loaded data pattern. For the selected program bits, the BLs would generate 0V by coupling corresponding drain nodes of the BL-select transistors to 0 V. The WLs bias conditions would be the same as those shown before (see FIG. 6B, FIG. 7B, and FIG. 7D). During the Full-page program operation with HV PGM buffer, all TPW nodes are set to ground reference level of 0 V.

Figure 8A:
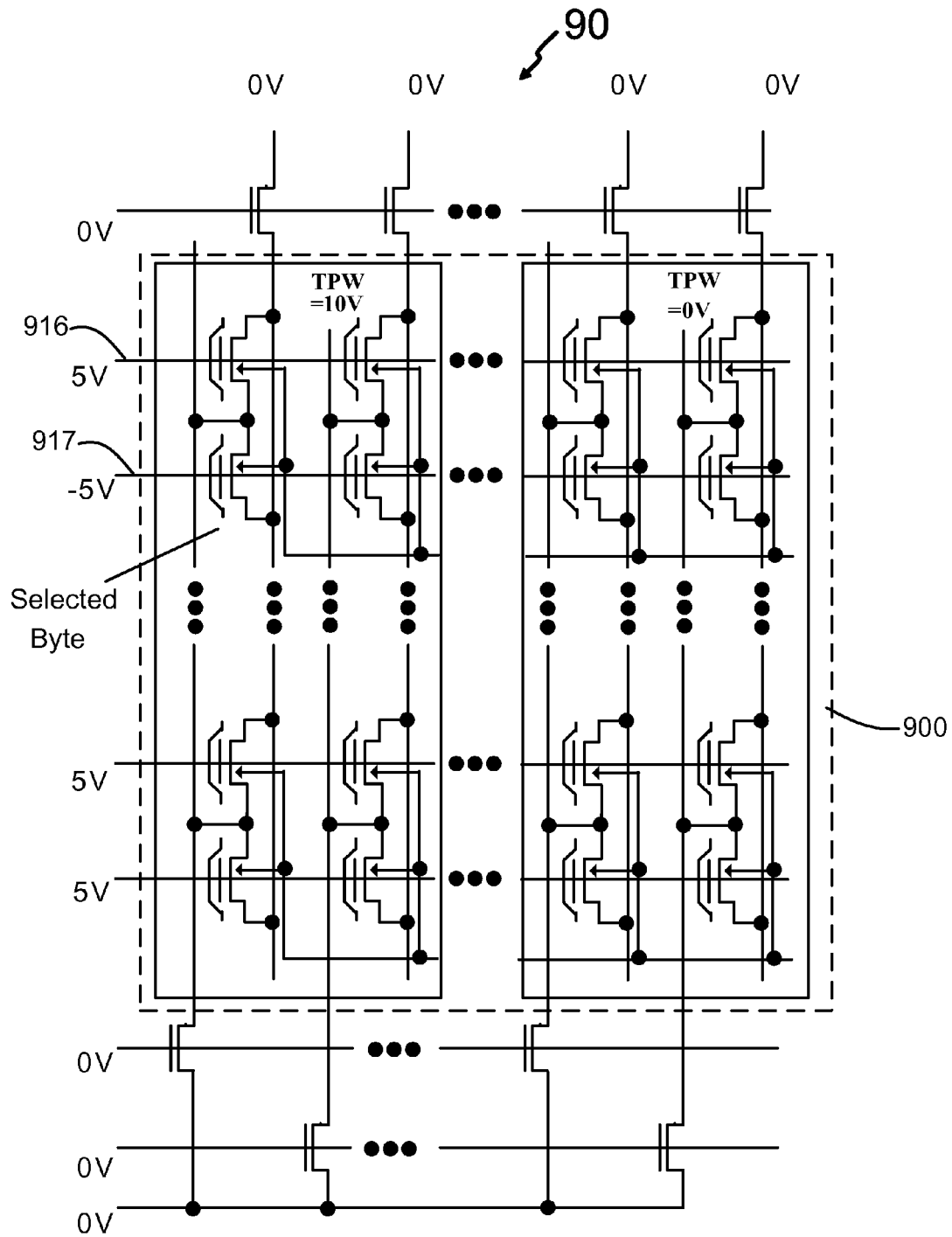
FIG. 8A is a diagram of an 1T1b Flash-based EEPROM cell array circuit with a LV Half-Page PGM Buffer in byte erase operation according to an embodiment of the present invention.

FIG. 8A is a diagram of an 1T1b Flash-based EEPROM cell array circuit with a LV Half-Page PGM Buffer in byte erase operation according to an embodiment of the present invention. As shown, the 1T1b Flash-based EEPROM cell array circuit 90 is subjected to another preferable set of the biased voltage conditions for the Byte Erase operation of this 1T1b EEPROM cell array 900 along with the LV Half-Page PGM Buffer of the present invention. There are odd and even column decoders for each Half-page. But since the operation scheme for half-page erase and full-page erase is essentially the same, no specific biasing conditions would be presented to differentiate the two types. In an embodiment, this Byte-erase operation can be performed for a minimum single byte erase or the multiple, random, bytes erase in a same selected page. One novel idea in this Byte-erase and later the Page-erase is to use a negative WL voltage of −5V so that conventional HV of about 14V voltage levels applied to BLs of selected byte can be reduced to be around 9 or 10 V in accordance with the spec specified in the Table of FIG. 6B. More details will be seen in following sections of the specification.

In a specific embodiment, the negative WL voltage for erase operation can be provided through a charge pump circuit made by existing HV PMOS device associated with the X-decoder. The negative charge pump circuit can be generated directly based on this Flash-based EEPROM process without using a TPW HV 1-poly NMOS device in the peripheral area to avoid substantial process change.

In other words, the BLs highest voltage levels are normalized to be below 10 V, regardless of Program and Erase operations. For both program and erase operation, the number of BLs are about 1K that requires HV (though it may be applied bit by bit) but only one WL needs HV signal. As a result, any BLs voltage drop to 10V from about 14 V would have many advantages such as superior performances in P/E endurance cycles, smaller BL pump size, and the least BLs' leakage in high temperature operation for auto-grade 125° C. applications.

During the Byte-erase operation as shown in FIG. 8A, a LV half-page PGM buffer is associated with the 1T1b EEPTOM cell array 900. the selected WL 917 is coupled to −5 V along with the selected TPW node (corresponding to the selected byte) coupled to approximately +10V, unlike the prior art wherein the selected WL is coupled to 0 V along with +14 to +16 V coupled to the selected TPW node. In an embodiment of the present invention, all BLs will see 10V only due to the 10V of the TPW node would be forwarded to all BLs through P/N Cell's Drain and Source junctions. In prior art, the 16V HV stress will be exerted on all SL-select transistors and BL-select transistors, thus resulting in inferior P/E cycles on those unselected 1T EEPROM cells in the unselected pages and BL-select transistors in all BLs and SL-select transistors in all SLs. For those selected cells, the bias difference between the selected WL voltage of −5V and BLs at about +10 V would cause the threshold voltage level to decrease from $V_{tH}$ level to $V_{tL}$ level to complete the bit erasure. For unselected WLs, a moderate positive voltage level of +5V is applied to block the erasing to those pages as the bias difference is only about 5 V.

Figure 8B:
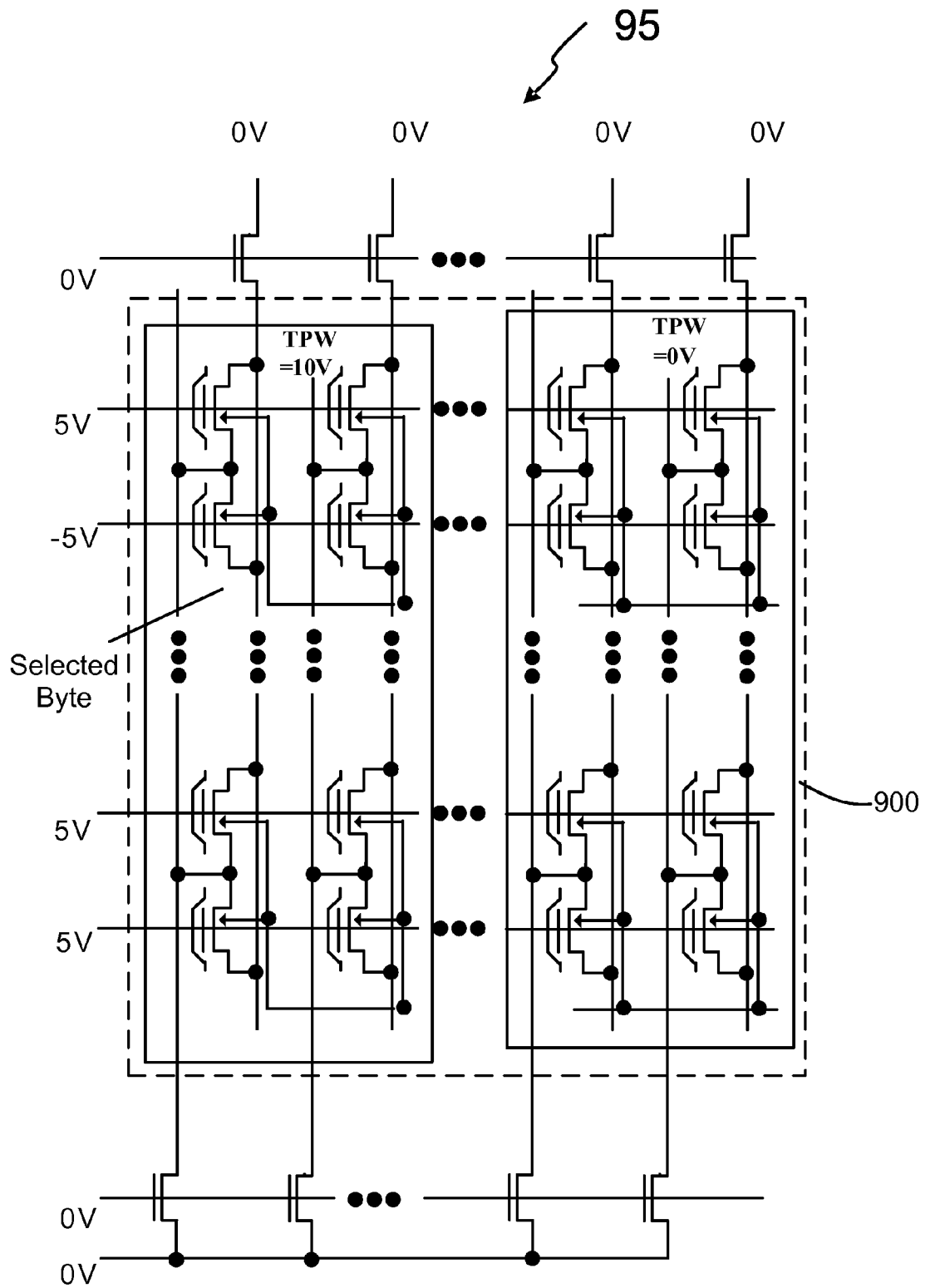
FIG. 8B is a diagram of an 1T1b Flash-based EEPROM cell array circuit with a LV Full-Page PGM Buffer in byte erase operation according to an embodiment of the present invention.

FIG. 8B is a diagram of an 1T1b Flash-based EEPROM cell array circuit with a LV Full-Page PGM Buffer in byte erase operation according to an embodiment of the present invention. As shown, the 1T1b Flash-based EEPROM cell array circuit 95 is subjected to another preferable set of the biased voltage conditions for the Byte Erase operation of this 1T1b EEPROM cell array 900 along with the LV Full-Page PGM Buffer of the present invention. There is only one type of column decoders for the Full-page scheme. The operation scheme would the same as the half-page (or essentially two half-page) operation. The novel feature would be to apply a negative WL voltage level to the selected byte along with a reduced BL voltage levels forwarded from a TPW node associated with the selected byte. After the erase operation, the bits in selected byte have a lowered threshold voltage level of $V_{tL}$ from originally a high $V_{tH}$ level, as defined in FIG. 6A.

Figure 8C:
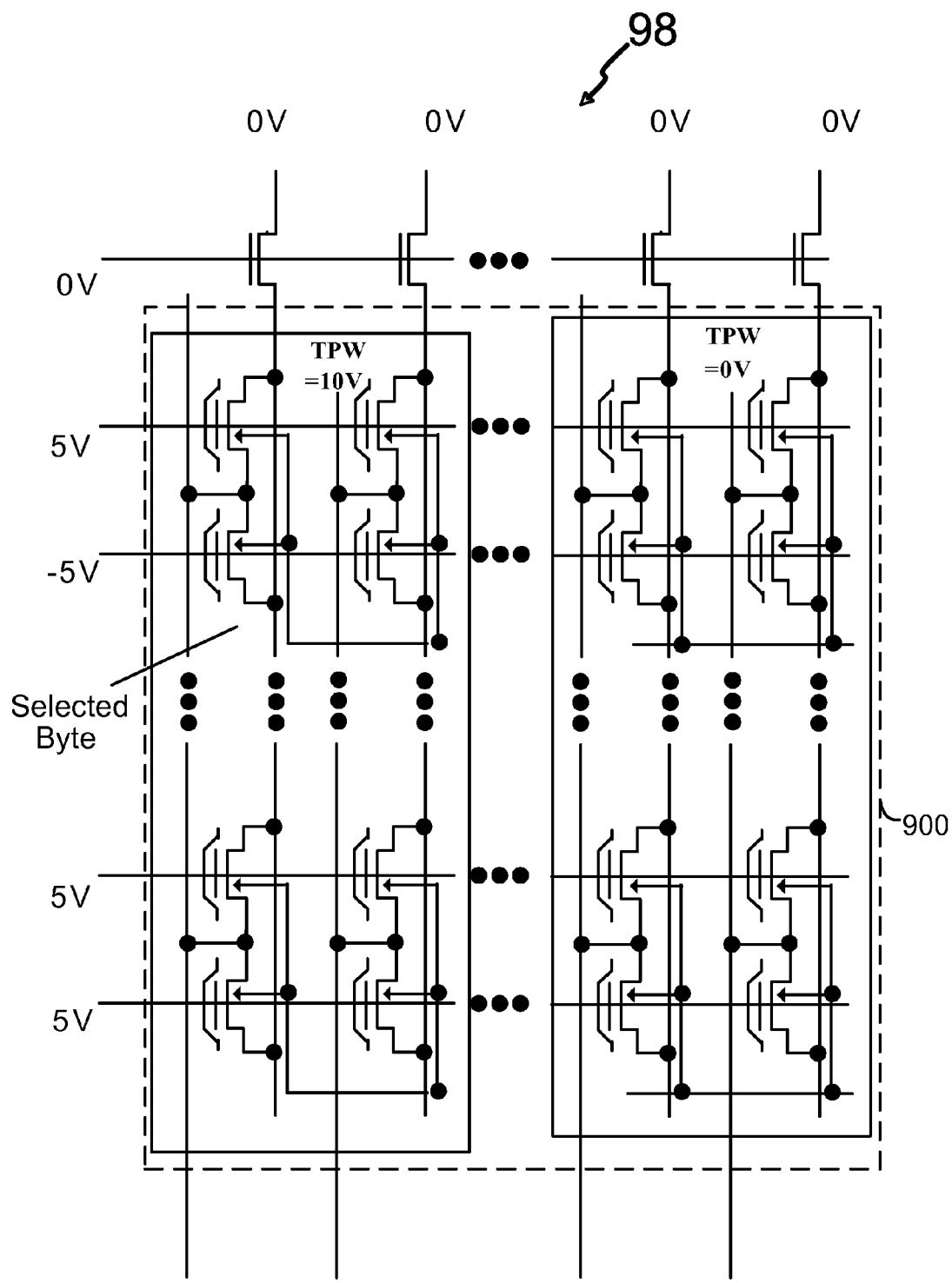
FIG. 8C is a diagram of an 1T1b Flash-based EEPROM cell array circuit with a HV Full-Page PGM Buffer in byte erase operation according to an embodiment of the present invention.

FIG. 8C is a diagram of an 1T1b Flash-based EEPROM cell array circuit with a HV Full-Page PGM Buffer in byte erase operation according to an embodiment of the present invention. As shown the 1T1b Flash-based EEPROM cell array circuit 98 is subjected to another preferable set of the biased voltage conditions for the Byte Erase operation of this 1T1b EEPROM cell array 900 along with a HV Full-Page PGM Buffer of the present invention. There is only one type of column decoders for the Full-page scheme. The operation scheme would the same as the half-page (or essentially two half-page) operation, no matter that the LV PGM buffer or the HV PGM buffer is used. Again, the novel feature is to apply a negative WL voltage level to the selected byte along with a reduced BL voltage levels forwarded from a TPW node associated with the selected byte. After the erase operation, the bits in selected byte have a lowered threshold voltage level of $V_{tL}$ from originally a high $V_{tH}$ level, as defined in FIG. 6A.

FIG. 9A is a schematic diagram of top layout view of a two-transistor-two-bit (2T2b) Flash-based EEPROM cell according to an embodiment of the present invention. As shown, the 2T2b Flash-based EEPROM cell 110 is the derivative cell structure from the 1T1b EEPROM cell structure 10 of prior art (FIG. 1A). In an embodiment, the 2T2b novel EEPROM cell 110 is made of two 1T1b EEPROM cells (10 of FIG. 1A) being connected in series without one contact layer in between in Y-axis layout without any process changes. In another embodiment, the 2T2b EEPROM cell layout is preferably made substantially fully symmetrical relative to the center line in Y-axis with a drain node connected to bit line denoted as BL (on the top of FIG. 9A), a source node connected to source line denoted as SL (on the bottom of FIG. 9A) along with two separate word lines denoted as WL1 on top and WL2 on the bottom. As we see in FIG. 1A, FIG. 1B, and FIG. 1C, each 1T1b EEPROM cell 10 includes one floating gate FG under one control gate of the floating gate transistor (FT). The 2T2b EEPROM cell 110 correspondingly includes two FGs, FG1 and FG2, of two floating gate transistors (FTs). Note, for either 1T1b or 2T2b cell structures used in this invention, each FT can only store one bit of single-layer cell (SLC) digital data. In other words, each bit stored in each cell corresponds to threshold voltage level associated with the FG in each FT.

FIG. 9B is a diagram of two circuit symbols of the 2T2b Flash-based EEPROM cell 120 circuit according to an embodiment of the present invention. In the left section of FIG. 9B, it shows a cell symbol 1201 having two 2-poly floating-gate 1T1b Flash-based EEPROM cells with the same 1T1b cell circuit symbol (of 201 in FIG. 1B) being connected in series to realize this 2T2b EEPROM cell 120. The average size per cell deduced from the 2T2b cell 120 would be smaller than a single 1T1b EEPROM cell size by more than 25% in Y-pitch due to one less contact region in channel length direction. But the X-pitch size of both types of cells remains identical.

In an embodiment, the 2T2b EEPROM cell 1201 includes a first HV NMOS floating-gate transistor, referred to be FT1 in the specification, with a Poly2 control-gate node connected to a first word line, denoted as WL1. The 2T2b EEPROM cell 1201 further includes a second floating-gate transistor, referred to be FT2 in the specification, with its Poly2 control-gate node connected to second word line denoted as WL2. Furthermore, the 2T2b EEPROM cell includes an N+ Drain node denoted as BL, an N+ Source node denoted as SL and a common bulk denoted as TPW respectively. As to be seen in FIG. 9C below, the TPW is connected to a triple P-well region which is formed within the Deep N-well, denoted as DNW, which is additionally formed on top of a P-substrate, denoted as P-Sub.

In the right section of FIG. 9B, it shows that the 2T2b EEPROM cell 120 can be illustrated by a circuit symbol 1202, which is electrically equivalent to the circuit symbol 1201. In particular, the circuit symbol 1202 is made of two FTs serially connected in Y-axis with each FT represented by two 1-poly poly2 gate HV NMOS transistors on top and bottom and a 2-poly NMOS poly1 FG transistor (as described in FIG. 1B). The circuit symbol 1202 also includes a pair of BL and SL running in Y-axis along with two separate WLs, such as WL1 on top and WL2 on bottom, respectively running in X-axis connected to two control gates of two FTs.

FIG. 9C is a diagram of a cross-sectional view of the 1T1b Flash-based EEPROM cell according to an embodiment of the present invention. As shown, the cross-sectional view of this Flash-based 2T2b EEPRPM cell 130 of the present invention is in accordance with the 2T2b cell layout 110 shown in FIG. 9A and circuit symbol 1201 and equivalent circuit symbol 1202 shown in FIG. 9B. Two 1T1b HV NMOS 2-poly FT EEPROM transistors are placed in series on top of a common bulk as a TPW region. To the left of the TPW region on one end of a whole channel length $L_{eff}$ (along the Y direction) a Source region is connected to a source line SL through an N+ contact region. At the right or another end of the channel length, a Drain region is connected to a bit line BL through another N+ contact layer within the TPW region. There is no more a contact region in the middle portion 1350 of the channel between these two FTs in layout across the Drain and Source nodes.

Similarly to the 1T1b EEPROM cell shown in FIG. 1C, a TPW node is connected to the FT's common bulk TPW region through a P+ contact region. The TPW region is formed within a Deep N-well (DNW) region which is connected out to a DNW node through a common N+ contact region on the far left in the Y direction. Note, due to the cell structure configuration defined above, the erase and program schemes of both the original 1T1b EEPROM cell and the current 2T2b EEPROM cell remain identical. But the read scheme in the paired FTs cell structure of the 2T2b EEPROM cell is modified as one of the non-selected WL has to be boosted to a higher voltage level than $V_{tH}$ to make that non-selected FT in a conduction state so as to allow the data verification of the selected FT in the selected paired FTs of each 2T2b cell. Note, each FT in 1T1b cell still just stores one bit while each 2T2b cell having two FTs stores two bits.

Figure 10:
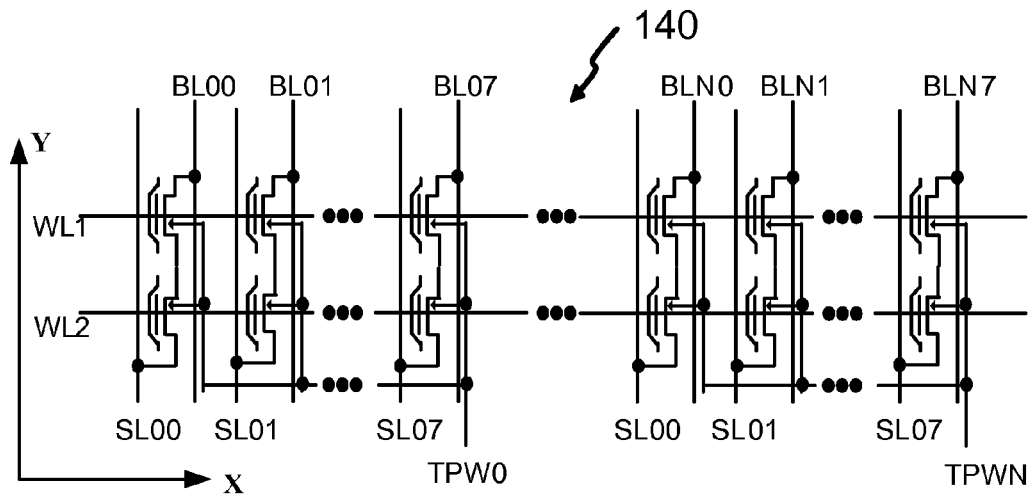
FIG. 10 is diagram of a 2T2b Flash-based EEPROM cell array circuit formed in a matrix comprising of one row of the 2T2b Flash-based EEPROM cell with two word lines according to an embodiment of the present invention.

FIG. 10 is diagram of a 2T2b Flash-based EEPROM cell array circuit formed in a matrix comprising of one row of the 2T2b Flash-based EEPROM cell with two word lines according to an embodiment of the present invention. As shown, a partial 2T2b Flash-based EEPROM cell array circuit 140 is formed in a matrix comprising of only two rows, WL1 and WL2, each row including N+1 bytes. N is an integer greater than 0. Unlike FIG. 2, there is no need of a contact connection between the top FT1 cell and the bottom FT2 cell within each paired FTs cell structure. As a result, the cell pitch in Y-axis is drastically reduced but the X-pitch remains identical. All BLs of each 2T2b cell formed in the same columns are connected to common global BLs such as BLN0 to BLN7 corresponding to eight BLs in Byte N. Additionally, All SLs of each 2T2b cell formed in the same columns are connected to a common global SLs such as SLN0 and SLN7 corresponding to eight SLs in the Byte N. Both the common global BLs and SLs are running in Y-axis direction. All common control gates CGs of FTs formed in a same row are tied together and connected to WL1 or WL2, running in X-axis direction. Lastly, all bulks of FTs in a byte in the same column are tied to a common node of TPW, denoted as TPW0, TPW2, . . . , TPWN.

Figure 11A:
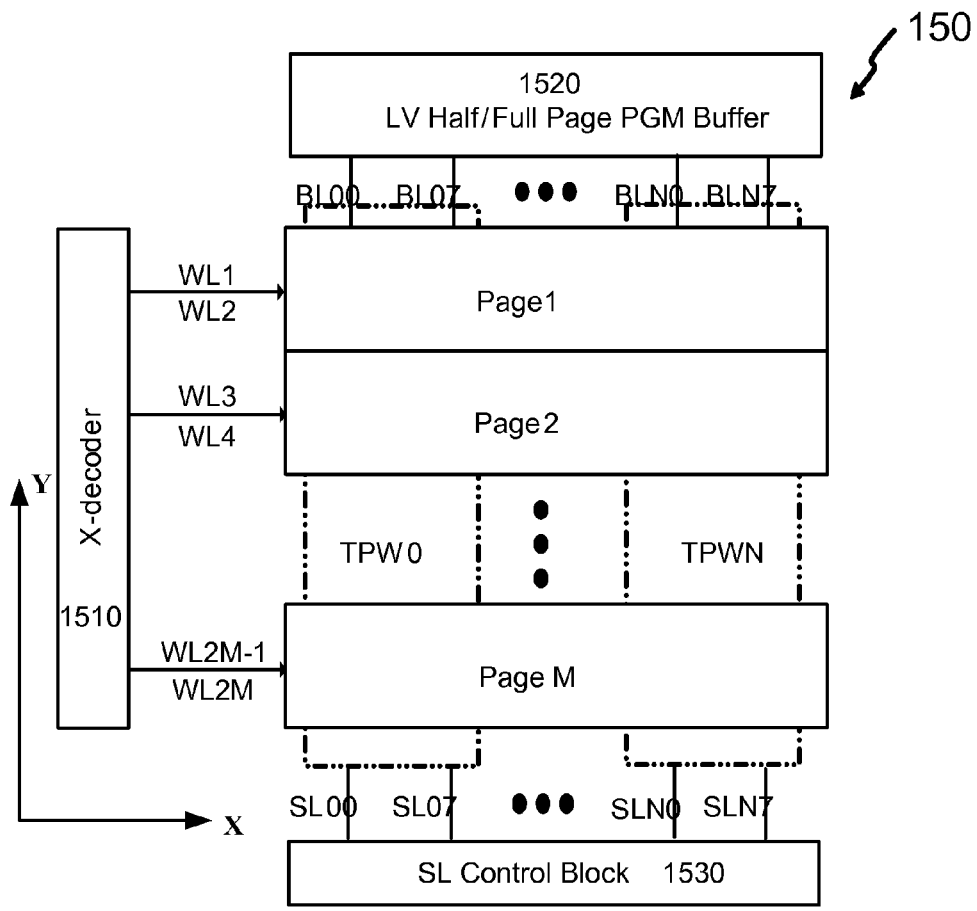
FIG. 11A is a block diagram of a 2T2b Flash-based EEPROM cell array that includes an X-decoder, a LV Half/Full Page PGM buffer, a SL Control circuit block, and 2T2b EEPROM cell array according to embodiments of the present invention.

FIG. 11A is a block diagram of a 2T2b Flash-based EEPROM cell array that includes an X-decoder, a LV Half/Full Page PGM buffer, a SL Control circuit block, and 2T2b EEPROM cell array according to embodiments of the present invention. As shown, the 2T2b Flash-based EEPROM cell array 150 includes an X-decoder 1510 situated in the left and a LV Half/Full-page PGM buffer 1520 located on the top and a SL Control block 1530 situated on the bottom and a matrix of a plurality of 2T2b EEPROM cells formed in the middle. The plurality of 2T2b EEPROM cells is arranged in rows of M pages configured to couple with the X-decoder 1510 via a plurality of word lines WLs in X-axis direction. Each page is associated with two WLs, such as WL1 and WL2, . . . , up to WL2M−1 and WL2M. M is an integer greater than 1. Additionally, the matrix of the plurality 2T2b EEPROM cells is coupled with the LV Half/Full-page PGM buffer 1520 through a plurality of bit lines BLs in Y-axis direction and coupled with the SL control block through a plurality of source lines SLs also in the Y direction. The LV Half/Full-Page PGM Buffer 1520 are made of Vdd devices, thus the cell area can be reduced.

Unlike the 1T1b EEPROM cell array shown in FIG. 5, each page here comprises two rows of FTs as defined in the partial two-row layout in FIG. 10 with one pair of two word lines of WL1 and WL2. Thus the whole 2T2b EEPROM array in FIG. 11 has double WL number over the 1T1b array in FIG. 5.

Similarly, any row M of FTs is associated with a pair of word line connections denoted as WL2M−1 and WL2M laid horizontally (not limited to but merely for illustration purpose). Each row of FTs is also associated with (N+1)×8 BLs, such as BL00 to BLN7 vertically connected to the top LV Half/Full-Page PGM Buffer 1520 through respective global BLs, and (N+1)×8 SLs, such as SL00 to SLN7, vertically connected to the bottom SL Control Block 1530 through respective global SLs. All 2×M WLs, WL1 to WL2M, are then connected to 2×M outputs of X-decoder 1510.

Figure 11B:
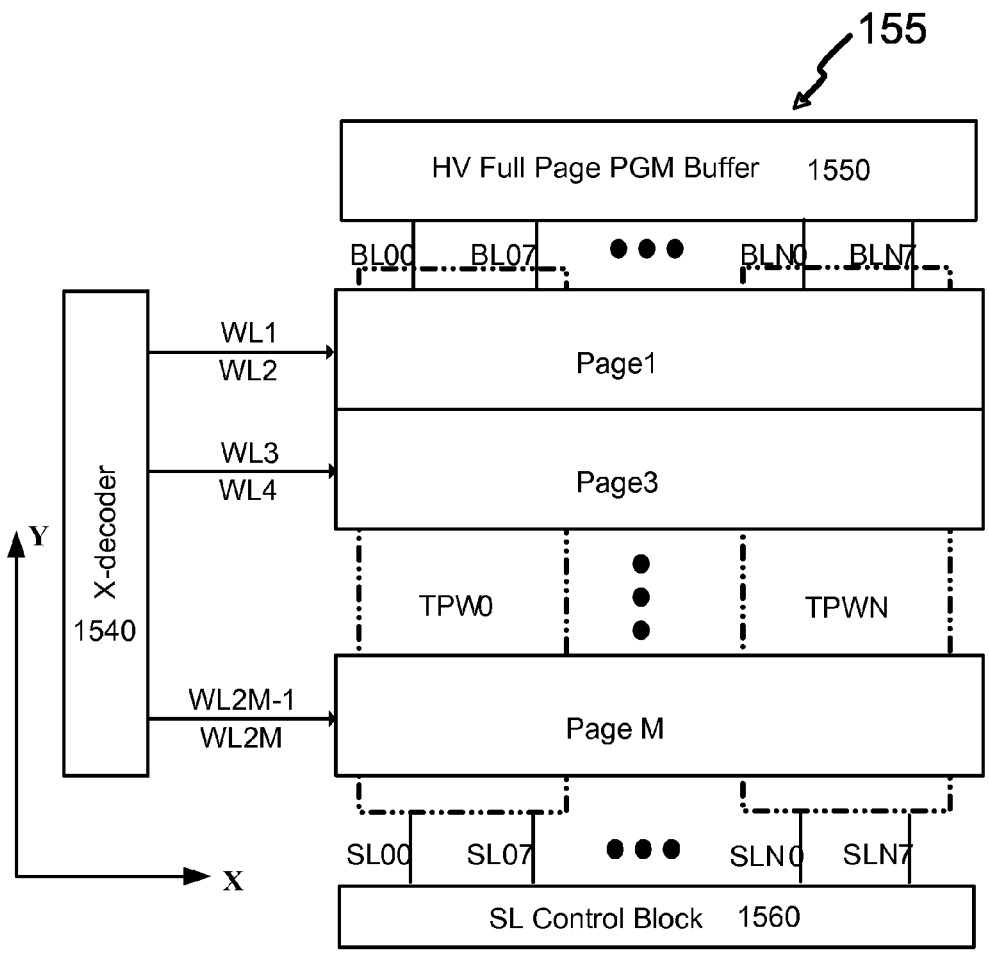
FIG. 11B is a block diagram of a 2T2b Flash-based EEPROM cell array that includes an X-decoder, a HV Full Page PGM buffer, a SL Control circuit block, and 2T2b EEPROM cell array according to embodiments of the present invention.

The function of LV Half/Full-Page PGM Buffer is used to temporarily store the (N+1)×8-bit of incoming string data for programming into the selected page of this 2T2b EEPROM cell array. These data bits are coming from the external I/O pins via Y-decoders and all BLs to reach the LV Half/Full-Page PGM Buffer. The LV Half/Full-Page PGM Buffer is correspondingly used for a half-page or a full-page erase or program operation on the above 2T2b EEPROM cell array circuit. One thing to differentiate the half-page and full-page program operations is the specific Page buffer design. In a full-page Buffer design, the Page Buffer has to be a 16V HV Page Buffer, which is bigger in size and poorer in performance with less P/E cycles and larger BL pumps. But in a half-page program, the Page Buffer just needs to use LV Vdd Page Buffer, which is much smaller. This is a trade-off FIG. 11B is a block diagram of a 2T2b Flash-based EEPROM cell array that includes an X-decoder, a HV Full Page PGM buffer, a SL Control circuit block, and 2T2b EEPROM cell array according to embodiments of the present invention. As shown, the 2T2b Flash-based EEPROM cell array circuit 155 substantially similar to the 2T2b Flash-based EEPROM cell array circuit 150 including an X-decoder 1540 located on the left and a SL Control circuit block 1560 situated on the bottom along with a matrix of 2T2b EEPROM cell array in the middle except the LV Half/Full-page PFM Buffer is replaced by a HV Full-page PGM buffer 1550 located on the top. The HV Full-page PGM Buffer 1550 is made of 16V devices, thus the area is large as compared to the LV PGM Page Buffer.

Figure 12A:
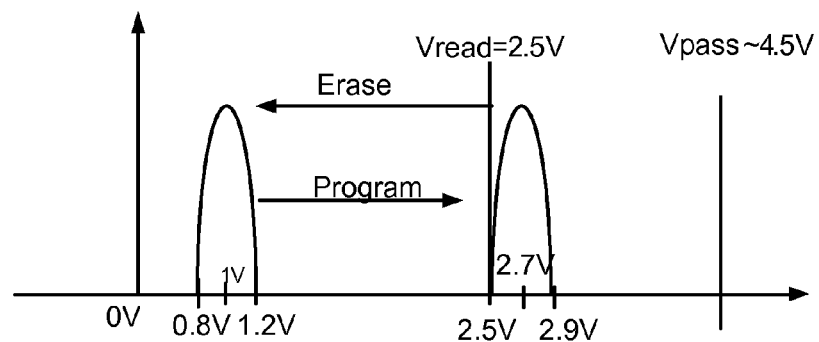
FIG. 12A is a plot of threshold voltage level distributions of each 1T1b Flash-based EEPROM cell in the 2T2b Flash-based EEPROM cell according to an alternative embodiment of the present invention.

FIG. 12A is a plot of threshold voltage level distributions of each 1T1b Flash-based EEPROM cell in the 2T2b Flash-based EEPROM cell according to an embodiment of the present invention. In an embodiment, the specific set of preferable threshold voltage level $V_t$ distributions is designated for each floating gate transistor (FT) in the 2T2b EEPROM cell array provided in FIG. 11A and FIG. 11B for the present invention. Due to the electrical feature of this unique 2T2b cell structure (see FIG. 9B), the high threshold level $V_{tH}$ is preferably defined with a lower center value of 2.7 V with a tight distribution of about 0.4 V for each FT within the 2T2b cell. It is smaller than the $V_{tH}$ defined for the 1T1b cell described before which can has basically any value greater than 4.2 V (with a wide distribution). A pass-voltage is preferably defined as 4.5 V, which is higher than the just-defined maximum $V_{tH}$ of 2.9 V. Although the $V_{tH}$ value is defined differently between the 2T2b and 1T1b EEPROM cell, the low threshold voltage level $V_{tL}$ is defined the same between 2T2b and 1T1b EEPROM cell. This is because the $V_{tL}$ value must be set to be positive and cannot be made different by erase operation due to the equivalent 3T cell structure of each FT within the 2T2b EEPROM cell device characteristics.

In an embodiment, the erase threshold voltage level is defined to decrease the threshold voltage level $V_t$ down to a voltage level of $V_{tL}$, approximately 1.0 V with a small distribution of 0.2 V. This is a conduction state for each FT in the 2T2b Flash-based EEPROM cell and is performed by a reverse Fowler Nordheim-channel tunneling effect. Electrons are driven out of the floating gate of the FT into the TPW region through the channel after a predetermined erase time of approximately 1 ms. Conversely, in the embodiment, the program threshold voltage level is defined to increase the threshold voltage level $V_t$ from the erased threshold voltage level $V_{tL}$ of approximately 1.0V to the programmed threshold voltage level $V_{tH}$ ranged from 2.5 V to 2.9 V after a program operation embodying the concepts of the present invention. The cell is a non-conduction state and is accomplished with a Fowler Nordheim-channel tunneling effect. The electrons are injected into the floating gate of selected FT in the 2T2b EEPROM cell after the predetermined program time of approximately 1 ms. The 2T2b EEPROM cell does not allow negative erased and programmed threshold voltage level.

The erased time of the 1T1b cell and the 2T2b cell can be made the same, while the program time of 2T2b cell would be longer than the 1T1b cell due to that an iterative program operation is needed and each iteration cycle includes pumping a short program voltage pulse followed by a verification read operation to determine if $V_{tH}$ is reached but not over the maximum value defined by the distribution range defined in accordance with the one shown in FIG. 12A. Once it is verified by the verification read operation that VtH is reached to a level surpassing the maximum value (e.g., 2.9 V) defined for the high threshold level, the selected BL of the selected cell in the 2T2b cell would be applied a PGM inhibit voltage to turn off the correspond BL-select transistor and further inhibit the FN tunneling effect so that the programming of the selected cell will be stopped.

FIG. 12B is a table of the detailed bias voltage conditions for Erase, Program, and Read operations of the 2T2b Flash-based EEPROM cell array according to embodiments of the present invention. As shown, preferable sets of different biased voltage conditions of the key operations of this 2T2b Flash-based EEPROM cell array of the present invention are provided. Specifically, preferable sets of bias voltages are defined optimally for applying to the nodes of Selected WL and Unselected WL in Selected Pair (of FTs), Unselected WLs in Unselected Pair, Selected and Unselected TPW, Selected BL/SL and Unselected BLs/SLs in the respective operations in accordance with the organization of 2T2b EEPROM cell array as seen in FIG. 11A or FIG. 11B. In certain embodiments, the key operations of the present invention include Byte-erase, Byte-program, Page-erase, Page-program and Read operations.

In an embodiment of the present invention for Byte-erase operation, the selected TPW nodes and BL/SLs of a selected byte are coupled to 10 V. Along with the above TPW node bias condition, a selected WL in the selected byte is coupled to a negative bias level of approximately −5 V to induce the FN tunneling effect. Note, for the 2T2b EEPROM cell array, each selected cell is associated with selected paired FTs. By contrast, the unselected 2M−1 WLs including the unselected WL in the selected paired FTs are coupled to about +5 V. Additionally, all unselected TPW nodes and unselected BLs/SLs are coupled to 0 V to inhibit the FN tunneling effect. After byte-erase, only the selected cells in the selected byte in the selected page would be erased to a low $V_{tL}$ state (defined in FIG. 12A) due to about 14 to 16 V is applied across between the CG and channel of each selected cell. The cells in association with the same WL but with unselected BLs/SLs in the selected page would keep their threshold voltage levels $V_t s$ unchanged, regardless of $V_{tH}$ and $V_{tL}$, due to only about −5 V difference across CGs and channels of corresponding cells. Again, for cells in the unselected bytes in the unselected M−1 pages the threshold voltage levels will not be changed either because only about 5 V difference is applied between corresponding CGs and channels.

For Page-erase operation, all TPW nodes and all BL/SLs associated with a selected page are coupled to 10 V along with a selected WL coupled to a negative bias level of −5 V to induce the FN tunneling effect. While an unselected WL associated with the selected page is still coupled to a positive voltage level of +5 V to inhibit the FN tunneling effect. For the unselected M−1 pages all 2M−2 WLs are also coupled to +5 V to inhibit inducing the FN tunneling effect so that the unselected cells in the all unselected M−1 pages would keep their threshold voltage levels $V_t s$ unchanged, regardless of $V_{tH}$ and $V_{tL}$. After page erase, only the selected cells in all selected bytes of the selected page would be erased to a low $V_{tL}$ state.

For Page-program operation, all TPW nodes and BL/SLs associated with the selected cells in the selected page are reversely coupled to 0 V along with one selected WL coupled to a high program voltage level of approximately 16 V to induce the FN tunneling effect but keep the other WL in the selected page at a moderate positive voltage level to inhibit the FN tunneling effect. The unselected BLs/SLs of the unselected cells are coupled to 10 V to inhibit the FN tunneling effect. After Page-program, the threshold voltage levels $V_t s$ of the selected cells of the selected page would be programmed to a high $V_{tH}$ state due to the high program voltage level of 16V between CGs and channels of corresponding cells is sufficient to induce the FN tunneling effect. For those unselected cells, the BL/SLs are selectively coupled to 10 V in the selected page to inhibit FN tunneling effect due to only about 6 V (16V−10V) is applied between CGs and channels of the unselected cells. This 6V difference between a CG and a channel is insufficient to induce the FN-tunneling effect. Thus for those unselected cells in the selected page the threshold voltage levels $V_t s$ would remain the same before and after page program operation. For cells associated with all unselected 2M−1 WLs the CGs are coupled low voltage level of about 5 V along with corresponding BLs/SLs either at 0 V or 10 V, resulting a bias difference of about 5 V and insufficient to induce FN tunneling effect thereof.

For read operation, the selected WL is coupled to a predetermined read voltage level of 2.5 V for 3V Vdd operation. But the unselected 2M−1 WLs are coupled to 0 V to inhibit leakage in the selected BLs coupled to 1V along with 0V coupled to SLs. During read operation in embedded EEPROM application, one byte for 8-bit CPU read, 2-byte for 16-bit CPU read and 4-byte for 32-but CPU read for fast read speed. But in slow 8-pin serial EEPROM design, one bit read is very common to save area and power consumption.

Figure 13A:
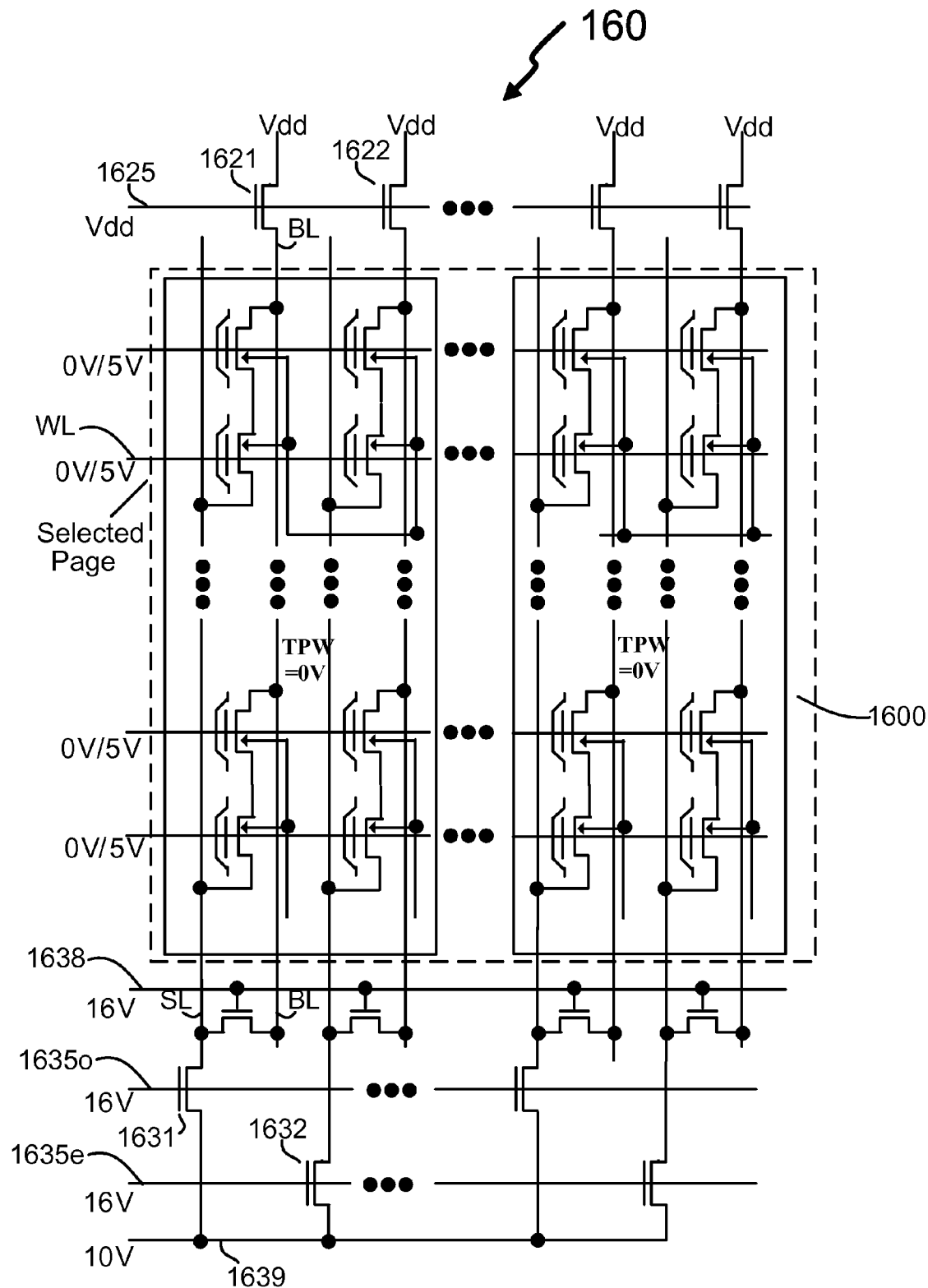
FIG. 13A is a diagram of a 2T2b Flash-based EEPROM cell array circuit in pre-charge period of half-page program operation according to an alternative embodiment of the present invention.

FIG. 13A is a diagram of a 2T2b Flash-based EEPROM cell array circuit in pre-charge period of half-page program operation according to an alternative embodiment of the present invention. As shown, the 2T2b Flash-based EEPROM cell array circuit 160 is subjected to the preferable set of the biased voltage conditions for a Pre-charge Period of Half-page program operation of the present invention. The 2T2b EEPROM cell array circuit 160 is being formed in a matrix of a plurality of 2T2b EEPROM cells 1600 that comprises a plurality of pages of rows (along X-axis) along with a plurality of columns (along Y-axis). Each page is a row of 2T2b EEPROM cells which is a row of paired FTs (see FIG. 9B) (along Y-axis) respectively having all common Control gates CGs of FTs tied to a pair of word lines WL1 and WL2 running along X-axis one on top and one down. Each page is made of two rows of (N+1) bytes each having eight BLs and eight SLs, wherein each FT corresponds to a memory cell having its own dedicated BL and SL. All BLs and SLs belonging to the same columns are then connected to (N+1)×8 common global BLs such as BLN0 to BLN7 and (N+1)×8 common global SLs such as SLN0 and SLN7 running in the Y-axis direction. Lastly, all bulks of FTs of a same byte are tied to the common TPW node and further all bytes in the same columns are tied to the same common TPW node.

During the pre-charge period in Half-page program operation, all SLs in the 2T2b EEPROM cell array 1600 are being pre-charged to approximately +10 V in accordance with the Inhibit SL voltage condition specified (for unselected SLs) in FIG. 12B along with all BLs are left floating. The +10 V pre-charge voltage level comes from a bottom common bus 1639 when it is applied with 10V. Additionally, the SL control block circuit includes a plurality of SL-select transistors, also divided into a half-page group 1631 with odd column numbers and another half-page group 1632 with even column numbers, respectively coupled their drain nodes to the SLs and their source nodes to the common bus 1639. In a specific embodiment, all gates 1635o of the SL-select transistors 1631 with odd column numbers and all gates 1635e of the SL-select transistors 1632 with even column numbers are respectively coupled to a common gate voltage up to 16 V to allow the full passage of 10V from the common bus 1639 to all SLs, regardless of Select and un-select SLs. Alternatively, only SLs in one half-page group can be pre-charged by allowing just gates of just one half-page group to open by coupling, either 1635o or 1635e, to the high gate voltage. But in order to prevent the leakages to the Page Buffer and stress though all 1T1b EEPROM cells, all top BL-select transistors 1621, 1622, ... are biased in a non-conduction state by applying Vdd on all drains nodes in each BL-select transistors along with a Vdd on the common gate 1625.

Like the previous description associated with erase and program operations on the 1T1b EEPROM cell array, the Half-page scheme has one odd and one even column decoders. All BL/SLs are divided into two half-page groups. As shown in FIG. 13A, In one Half-page group all control gates are connected to odd column decoder 1621 associated with a LV Half-page PGM buffer and in another Half-page group all control gates are connected to even column decoder 1622 associated with the LV Half-page PGM buffer. The LV Half-page PGM buffer (not fully shown) is made by LV Vdd NMOS and PMOS devices including a row of column decoders 1621, 1622, ... , each made by a transistor having its source node coupled to each BL with odd or even column number of the 2T2b EEPROM cell array. Each column decoder transistor having its drain node connected to rest part of the LV Half-page PGM buffer is a BL-select transistor. During the Half-page Pre-charge period, it is optional that only the gates of column decoders in one group having either odd or even numbers are open to allow full passage of an inhibit BL voltage of approximately 10 V (defined for unselected BLs, see FIG. 12B). The gates of column decoders of another group are optionally close so that the other half-page BLs would be left floating. Alternatively, all gates of the BL-select transistors can be set to a non-conduction state to let all BLs floating while the Full-page scheme needs only one set of column decoders.

Once all gates and drain nodes are biased in same Vdd voltage level, all BL-select transistors are in non-conduction state, any voltage on all BL nodes of the 2T2b EEPROM cell array 1600 would not leak to the top PGM buffer circuit. During the pre-charge period of the program operation (for either half-page or full page operation), all TPW nodes are coupled to a ground reference level of 0 V. As a result, the pre-charged +10V would be sustained in all SLs as all cells in 2T2b EEPROM cell array 1600 are in conduction state when about 5V (which is higher than $V_{tH}$ level) is applied to all WLs in an embodiment during the Pre-charge period. The SLs can still be pre-charged with all cells in non-conduction state when voltages between 0V to 5 V are applied to the WLs. One reason to apply preferable 5 V level to all WLs of all 2T2b EEPROM cells is to reduce the stress experiences by the BLs subjected to about 10 V during the Pre-charge period. One difference in cell array circuit between FIG. 13A and FIG. 7A is the adding of an extra row of equalizer transistors in SL control block that is configured to provide voltage level balance between each pair of BL and SL per column. Specifically, each equalizer transistor is made by a HV NMOS 1-poly device inserted between one pair of BL and SL with gate 1638 tied to the common control signal which can be adjusted from 0 V to 16 V. During the Half-page pre-charge period, the common control gate signal of the equalizer transistor is coupled to 16 V to keep the transistor in conduction state for balancing the corresponding voltage level of BL and SL for each column of the 2T2b EEPROM cell array 1600.

Figure 13B:
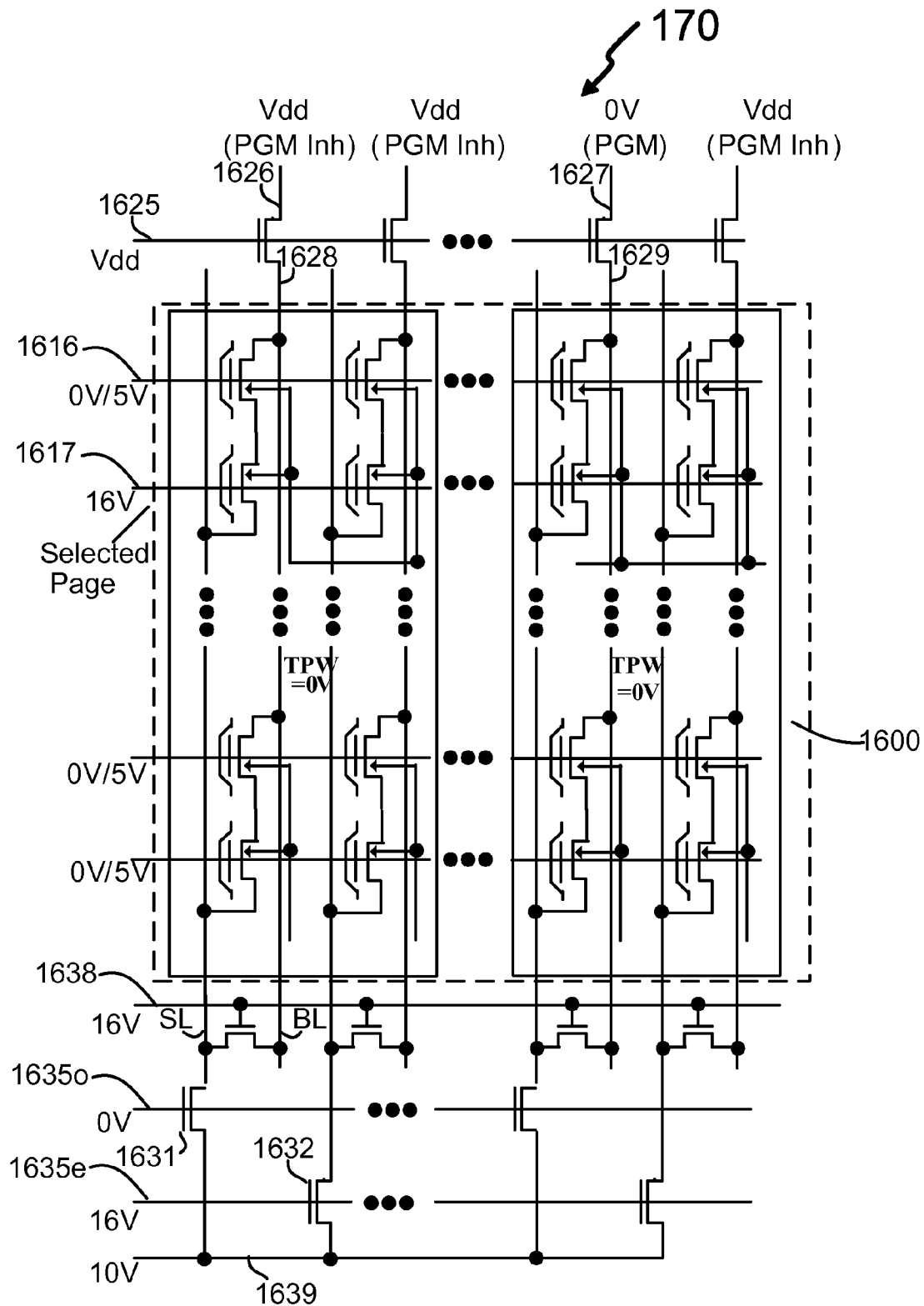
FIG. 13B is a diagram of a 2T2b Flash-based EEPROM cell array circuit in programming period of half-page program operation according to an alternative embodiment of the present invention.

FIG. 13B is a diagram of a 2T2b Flash-based EEPROM cell array circuit in programming period of half-page program operation according to an alternative embodiment of the present invention. As shown, the preferable Flash-based 2T2b EEPROM cell array circuit 170 is subjected to another preferable set of the biased voltage conditions for the Programming Period of Half-page program operation of the present invention. As the programming period starts, the biased voltage conditions are illustrated in FIG. 12B, wherein all TPW nodes are still coupled to the ground reference level of 0 V. The selected WL 1617 in the selected page is ramped slowly to a high program voltage level of approximately +16V while unselected WLs 1616, including the one unselected WL within the selected (half) page and all unselected WLs in unselected pages, remain at about 5 V. The selected BLs 1629 in the selected half-page are being discharged to 0 V through top BL-select transistors. The BL-select transistors are applying a PGM voltage or a PGM Inhibit voltage respectively to the drain node 1627 corresponding to the selected BLs 1629 and the drain nodes 1626 corresponding to the unselected BLs 1628. The PGM voltage is 0 V and the PGM Inhibit voltage is Vdd (of 3V or less for LV Vdd devices). For the inhibit (or unselected) BLs 1628 the corresponding BL-select transistors are closed as their gates 1625 are coupled to a same Vdd level so that those BLs 1628 are left floating and retain the pre-charged voltage level of 10 V passed from corresponding SLs. Thus the voltage drop between the Inhibit BLs 1628 and selected WL 1617 would be always kept below 6V, which is 16V–10V, to inhibit programming into these cells. For the selected BLs 1629, the corresponding BL-select gates are open as their drain nodes are coupled to 0 V (PGM voltage) so that the selected BLs 1629 are discharged to 0 V. While the selected program gate WL is 16 V to provide nearly 16 V across the gate to the BLs 1629. As a result, only the selected cells corresponding to those selected BLs 1629 in the selected Half-page are programmed in the Half-page programming period with the threshold voltage levels of the cells being increased from $V_{tL}$ to $V_{tH}$ value. Note, now the $V_{tH}$ value is defined to be at 2.7 V with a small distribution of 0.2 V (see FIG. 12A). In order to avoid over programming concern, a new algorithm is introduced to execute the programming step with an iterative program-verify scheme for the 2T2b EEPROM cell. In particular, the program voltage is applied to the selected one WL with another (unselected) WL to a pass voltage level of 4.5 V, which is higher than the maximum threshold value of 2.9 V. The selected WL voltage is pulsed with a shortened pulse time out of the total program time to drive the cell threshold voltage level from its low value of $V_{tL}$ to a higher value. After each pulse, a read operation is executed to the selected cell to test the current threshold level $V_t$. Then these program-verify steps are iteratively executed until the value of $V_t$ reaches the pre-defined high threshold level of $V_{tH}$, ranging between +2.5 V and +2.9V, which is lower than +4.2 V defined previously for the 1T1b cell. The verification step is added to ensure that the cell threshold level does not surpass the high $V_{tH}$ value to cause interference to neighboring cells. Finally, after the programming period, all the unselected cells in the remaining selected Half-page and in the unselected Half-page remain unchanged.

During the Half-page Programming period, one half of unselected BLs are shut off by grounding the gates of SL-select transistors but another selected one-half BLs remain on to pass the 10V to sustain the selected Inhibit BL at 10V to prevent FN tunneling.

Still in an embodiment of the present invention, a row of Equalizer transistors is added in SL control block to couple their gates 1638 to high voltage of 16 V to keep them in conduction state and to provide bias level balance between each BL and SL. On the contrary, the top BLs voltages are either coupled to Vdd for shut off the leakage through top BL-select transistors 1626 to retain unselected BLs 1628 at 10 V but coupled specific BL-select transistor 1627 to 0 V to discharge the selected BL 1629 to 0 V for program operation when the selected WL is coupled to 16 V. As a result, the selected cells in the selected page would be programmed but the unselected cells in the select page and un-select pages would not get programmed.

Figure 13C:
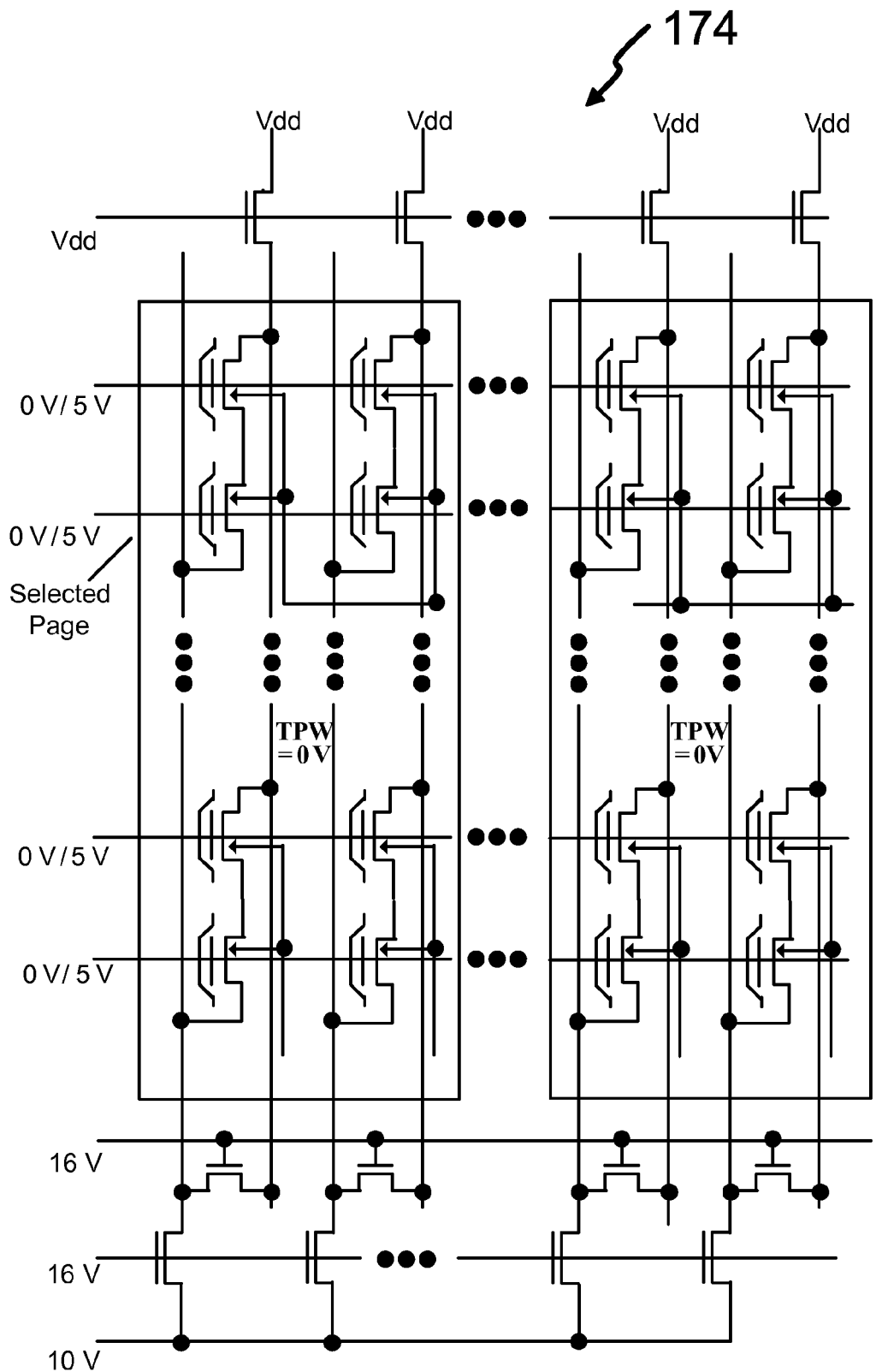
FIG. 13C is a diagram of a 2T2b Flash-based EEPROM cell array circuit in pre-charge period of full-page program operation according to an alternative embodiment of the present invention.

FIG. 13C is a diagram of a 2T2b Flash-based EEPROM cell array circuit in pre-charge period of full-page program operation according to an alternative embodiment of the present invention. As shown, the preferable Flash-based 2T2b EEPROM cell array circuit 174 is subjected to another preferable set of the biased voltage conditions for the Programming Period of Full-page program operation of the present invention. There is only one column decoder. During the Pre-charge Period, all SLs are pre-charged to 10 V though the bottom charge line of 10V and on-state of SL-selected transistors' gates are coupled to 16 V. All WLs are either coupled to 0 V or 5 V and all BLs are left floating. Along with the top BL-select transistors are biased in non-conduction state.

Figure 13D:
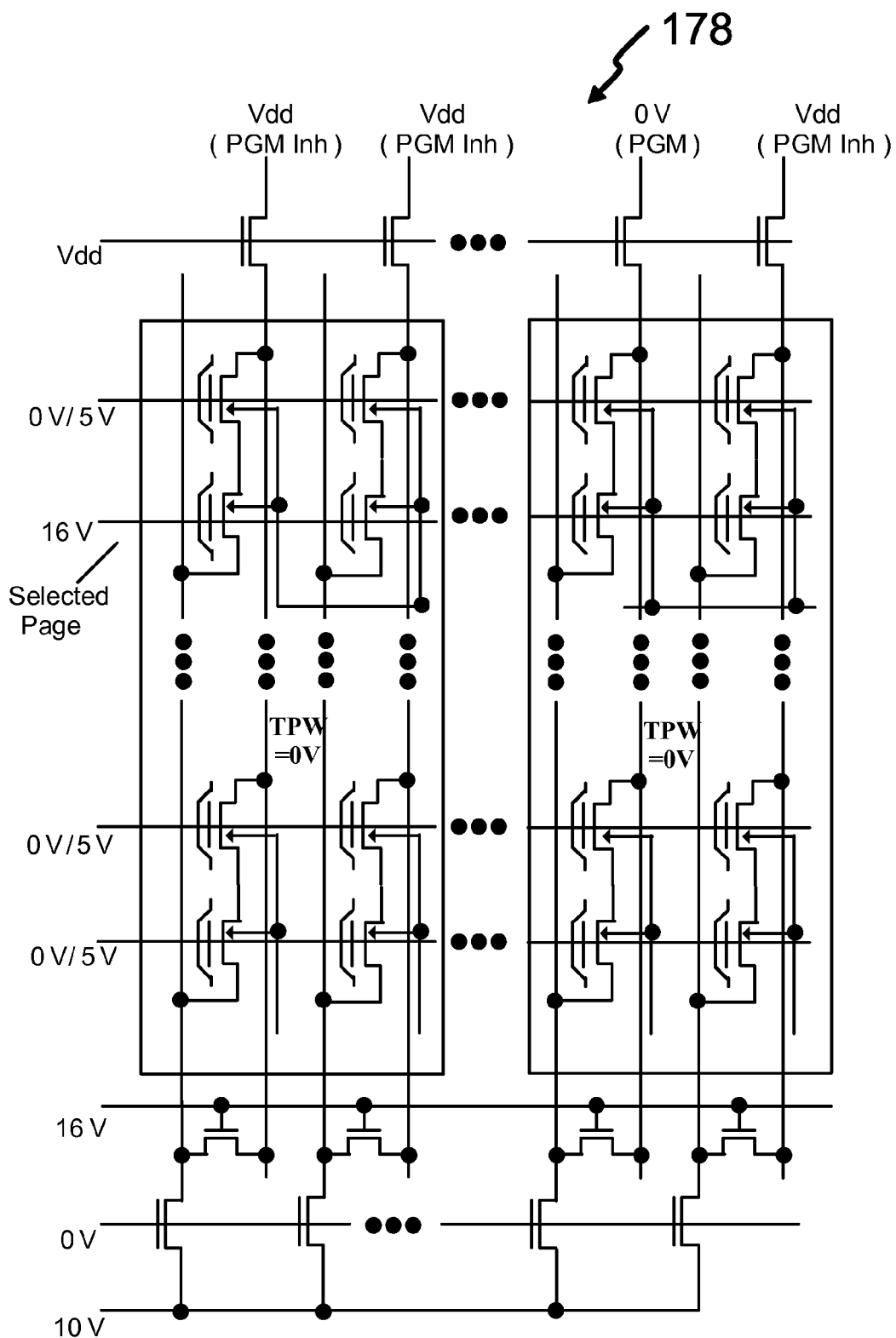
FIG. 13D is a diagram of a 2T2b Flash-based EEPROM cell array circuit in programming period of full-page program operation for a selected page according to an alternative embodiment of the present invention.

FIG. 13D is a diagram of a 2T2b Flash-based EEPROM cell array circuit in programming period of full-page program operation for a selected page according to an alternative embodiment of the present invention. As shown, the preferable Flash-based 2T2b EEPROM cell array circuit 178 is subjected to another preferable set of the biased voltage conditions for the Programming Period of Full-page Programming biased conditions of the present invention. There is only one column decoder for Full-page program operation. During the Programming Period, all SLs are shut off but the BL-select transistors are turned on selectively in accordance with loaded pattern. Only the selected BLs are discharged to 0V and then the selected WL is ramped to 16 V to induce the FN tunneling to those cells with 0V coupled to BLs and SLs. Those cells of the un-discharged BLs and SLs that still retain the pre-charge inhibit voltage of 10 V would not get programmed. Thus the threshold voltage levels of unselected cells remain unchanged after Full-page program operation.

Figure 14A:
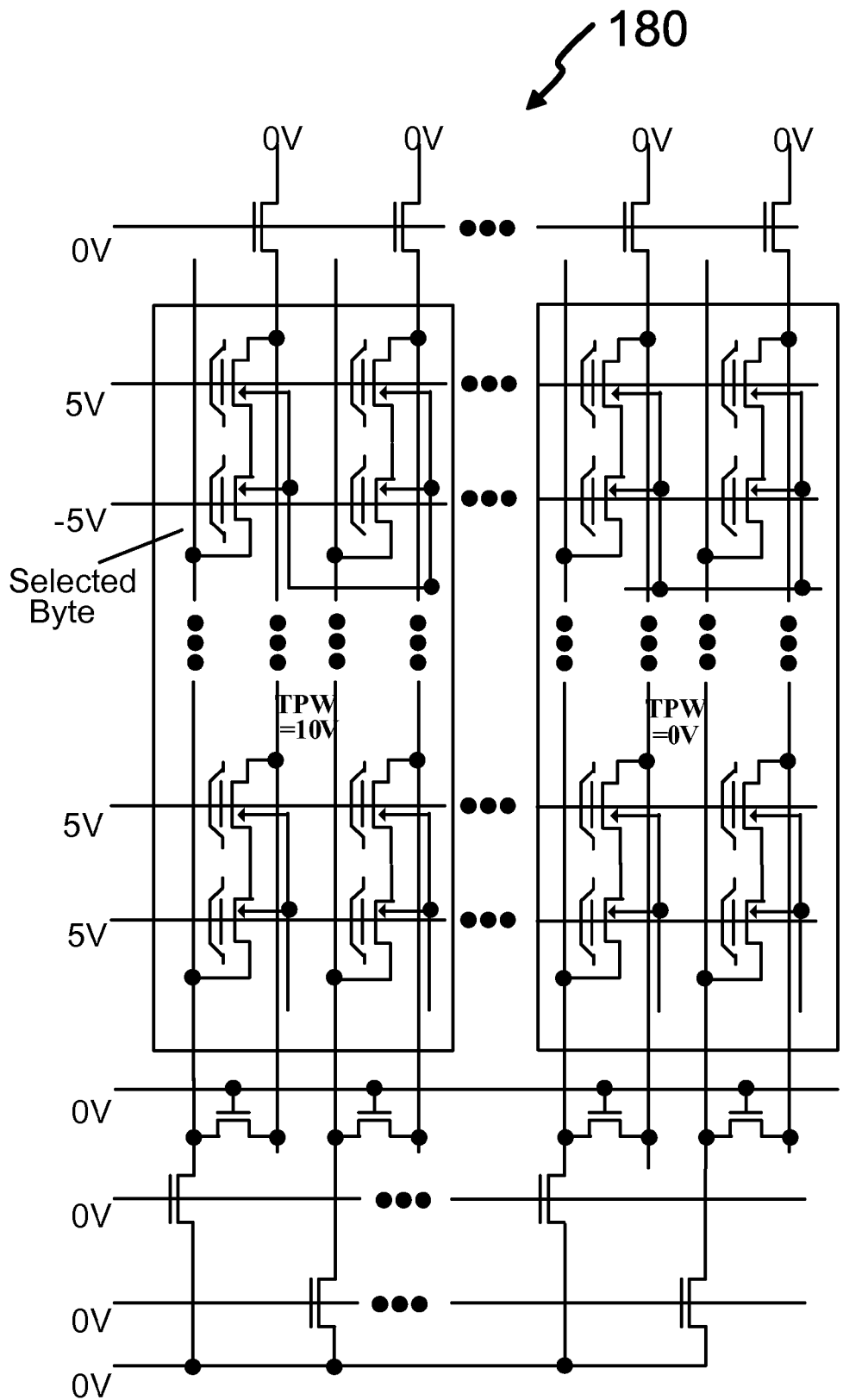
FIG. 14A is a diagram of a 2T2b Flash-based EEPROM cell array circuit with a LV Half-Page PGM Buffer in byte erase operation according to an alternative embodiment of the present invention.

FIG. 14A is a diagram of a 2T2b Flash-based EEPROM cell array circuit with a LV Half-Page PGM Buffer in byte erase operation according to an alternative embodiment of the present invention. As shown, the preferable Flash-based 2T2b EEPROM cell array circuit 180 is subjected to another preferable set of the biased voltage conditions for the Erase operation of along with the LV Half-page PGM Buffer scheme of the present invention. Similarly, this embodiment has two column selected groups (odd or even half-pages). In an embodiment, this Byte-erase operation is performed for a minimum single byte erase or the multiple, random, bytes erase in a same selected page using a negative WL voltage of −5V along with a reduced to bit line bias at 9 or 10 V in accordance with the spec specified in the Table of FIG. 12B. The operation scheme is substantially similar to that described in earlier part of the specification for FIG. 8A.

In a specific embodiment, the negative WL voltage for erase operation can be provided through a charge pump circuit made by existing HV PMOS device associated with the X-decoder. The negative charge pump circuit can be generated directly based on this Flash-based EEPROM process without using a TPW HV 1-poly NMOS device in the peripheral area to avoid substantial process change.

One difference in circuit between FIG. 14A and FIG. 8A is the addition of an extra row of circuit in array which is a row of HV NMOS 1-poly device referred as an equalizer between each BL and SL. In byte erase operation, the equalizer transistor has its gate tied to the common 0 V so that the BL is isolated from the corresponding SL.

Figure 14B:
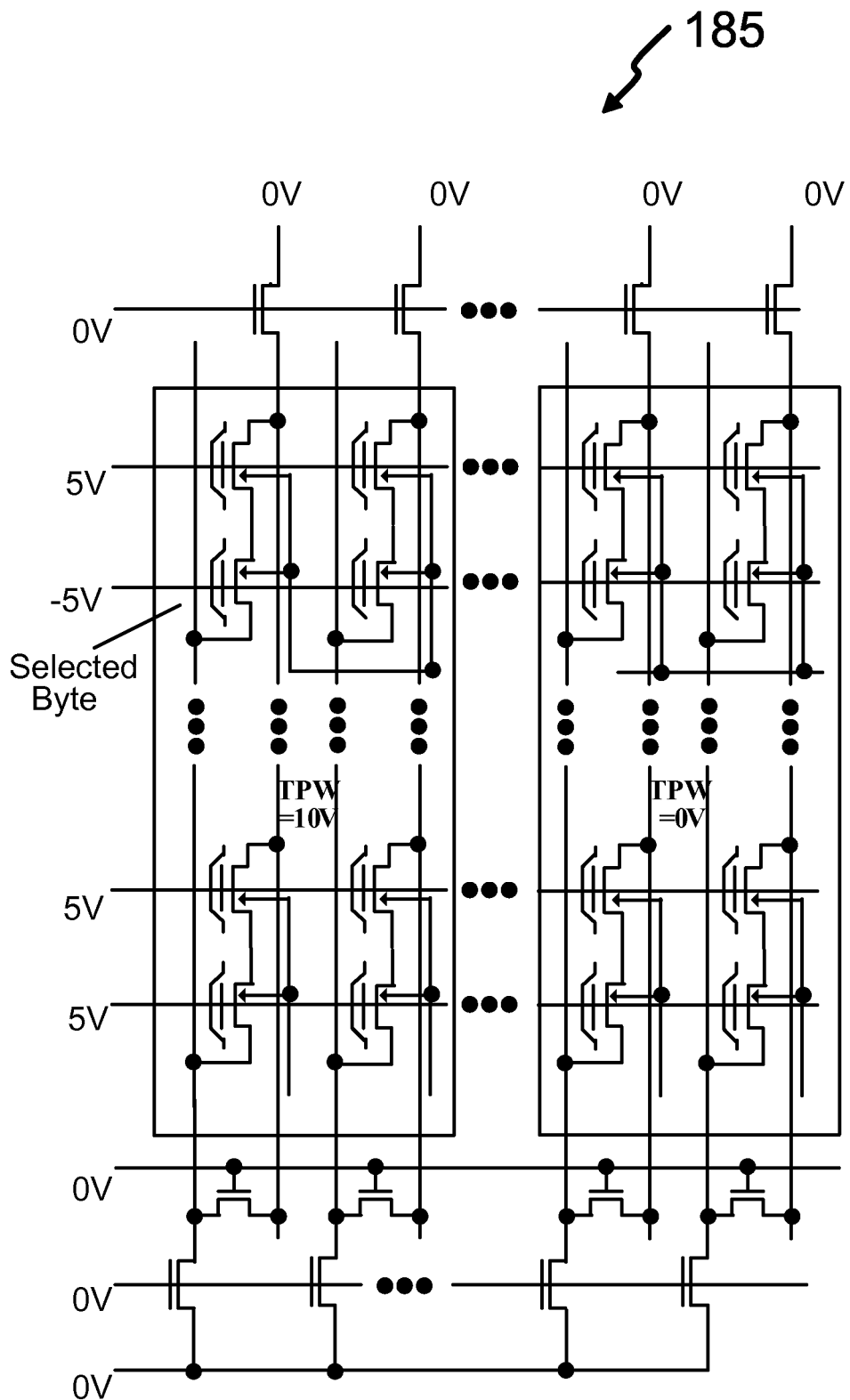
FIG. 14B is a diagram of a 2T2b Flash-based EEPROM cell array circuit with a LV Full-Page PGM Buffer in byte erase operation according to an alternative embodiment of the present invention.

FIG. 14B is a diagram of a 2T2b Flash-based EEPROM cell array circuit with a LV Full-Page PGM Buffer in byte erase operation according to an alternative embodiment of the present invention. As shown, the preferable Flash-based 2T2b EEPROM cell array circuit 185 is subjected to another preferable set of the biased voltage conditions for the Erase operation of along with the LV Full-page PGM Buffer scheme of the present invention. Similarly, this embodiment has only one column selected group. The biased condition of the array is shown in FIG. 14B and also referred to FIG. 12B. The operation scheme is substantially similar to that described in earlier part of the specification for FIG. 8B.

Figure 14C:
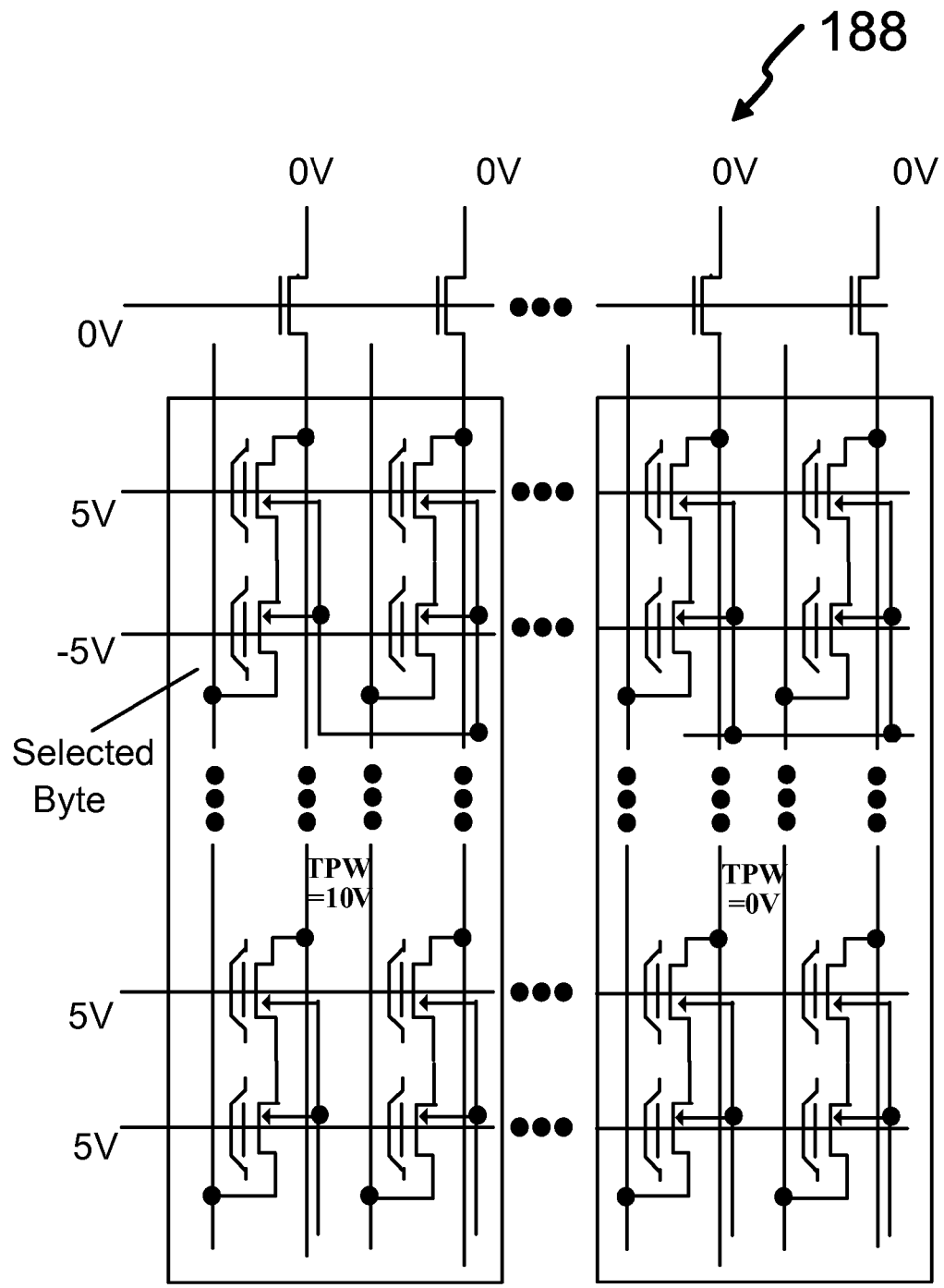
FIG. 14C is a diagram of a 2T2b Flash-based EEPROM cell array circuit with a HV Full-Page PGM Buffer in byte erase operation according to an alternative embodiment of the present invention.

FIG. 14C is a diagram of a 2T2b Flash-based EEPROM cell array circuit with a HV Full-Page PGM Buffer in byte erase operation according to an alternative embodiment of the present invention. As shown, the preferable Flash-based 2T2b EEPROM cell array circuit 188 is subjected to another preferable set of the biased voltage conditions for the Erase operation of along with the HV Full-page PGM Buffer scheme of the present invention. Similarly, this embodiment has only one column selected group. The biased condition of the array is shown in FIG. 14C and also referred to FIG. 12B. The operation scheme is substantially similar to that described above for FIG. 14B except a HV PGM Buffer in the cell array 188 is used to replace the LV Full Page PGM Buffer in the cell array 185. The operation scheme is also substantially similar to that described in earlier part of the specification for FIG. 8C.

Figure 15A:
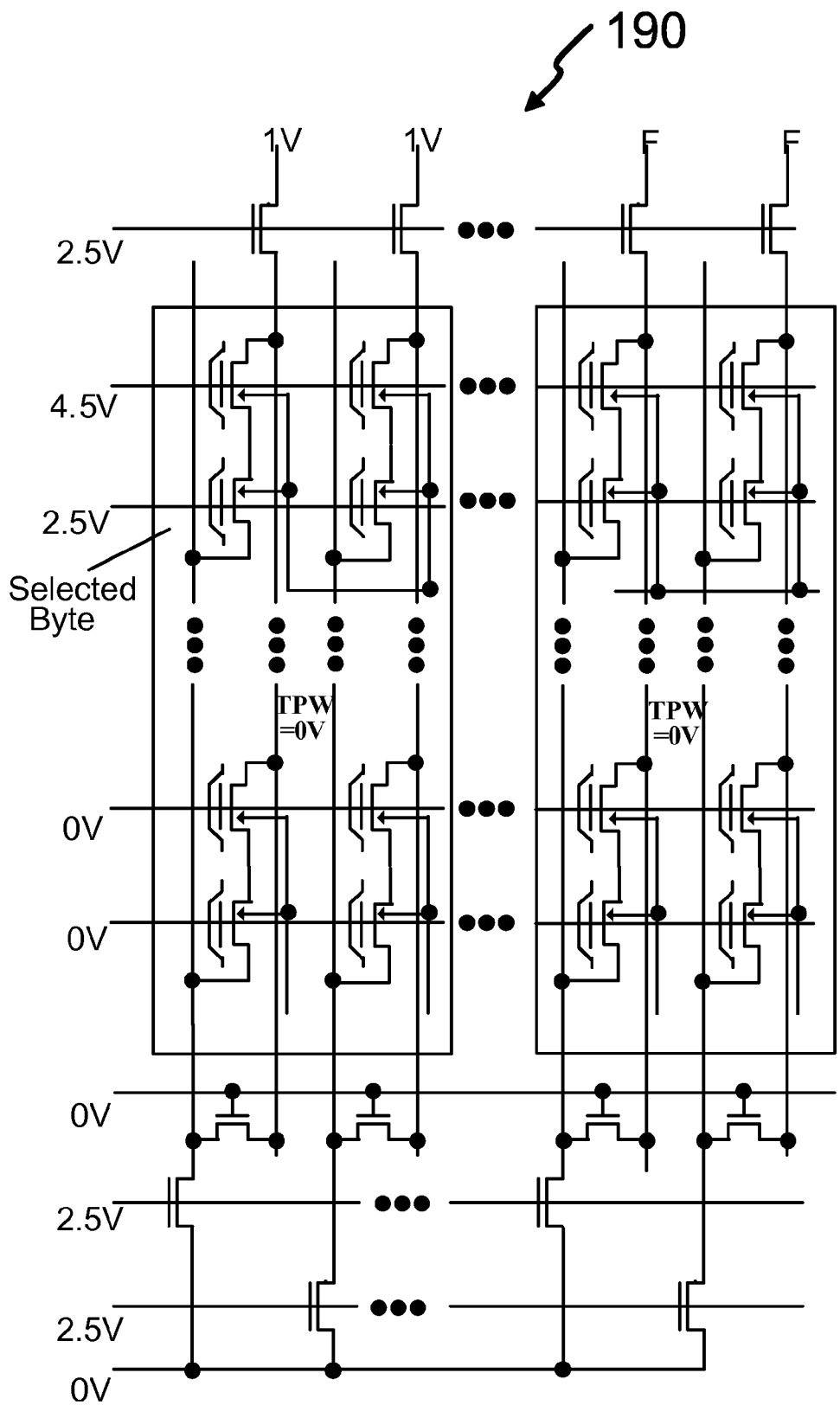
FIG. 15A is a diagram of a 2T2b Flash-based EEPROM cell array circuit with a LV Half-Page PGM Buffer in read operation according to an alternative embodiment of the present invention.

FIG. 15A is a diagram of a 2T2b Flash-based EEPROM cell array circuit with a LV Half-Page PGM Buffer in read operation according to an alternative embodiment of the present invention. As shown, the preferable Flash-based 2T2b EEPROM cell array circuit 190 along with the LV Half-page PGM Buffer is subjected to another preferable set of the biased voltage conditions for the Read operation of the present invention. The gate voltage of the equalizer transistor between each BL and SL for the Read operation is coupled tom 0 V to isolate them of the present invention. The gate control voltage of SL-select transistor is coupled to 2.5 V for 3V Vdd operation. It can be coupled directly to Vdd level when Vdd is down to 1.2V. The common gates of the equalizer transistors are connected 0 V to remain high impedance state to isolate all BL and SL pairs for proper read operation. The selected WL is coupled to 2.5 V when Vdd is 3V or less for the selected byte. For the next unselected WL in the same select page, the gates of the corresponding unselected FTs (which is called pass transistors) is coupled to a boosted voltage of 4.5 V. The rest of all unselected WLs are coupled to 0 V to turn off the cells in the unselected WLs due to the minimum threshold level $V_{tL}$ is about 1.0 V. All selected BLs are connected to Sense Amplifier with BL voltage levels kept below 1.0V. The unselected BLs are left floating along with all SLs coupled to 0V for the proper read operation. Again, for the Half-page read operation, there are two column select decoders so that the read operation, a bit-by-bit operation scheme, will be performed in a first half-page and further executed for a second half-page. For example, the gates of SL-select transistors with odd column numbers are coupled to 2.5 V for executing the read operation on the half-page with odd column numbers but the gates of SL-select transistors with even column numbers are coupled to 0 V to shut off the half-page with even column numbers.

Figure 15B:
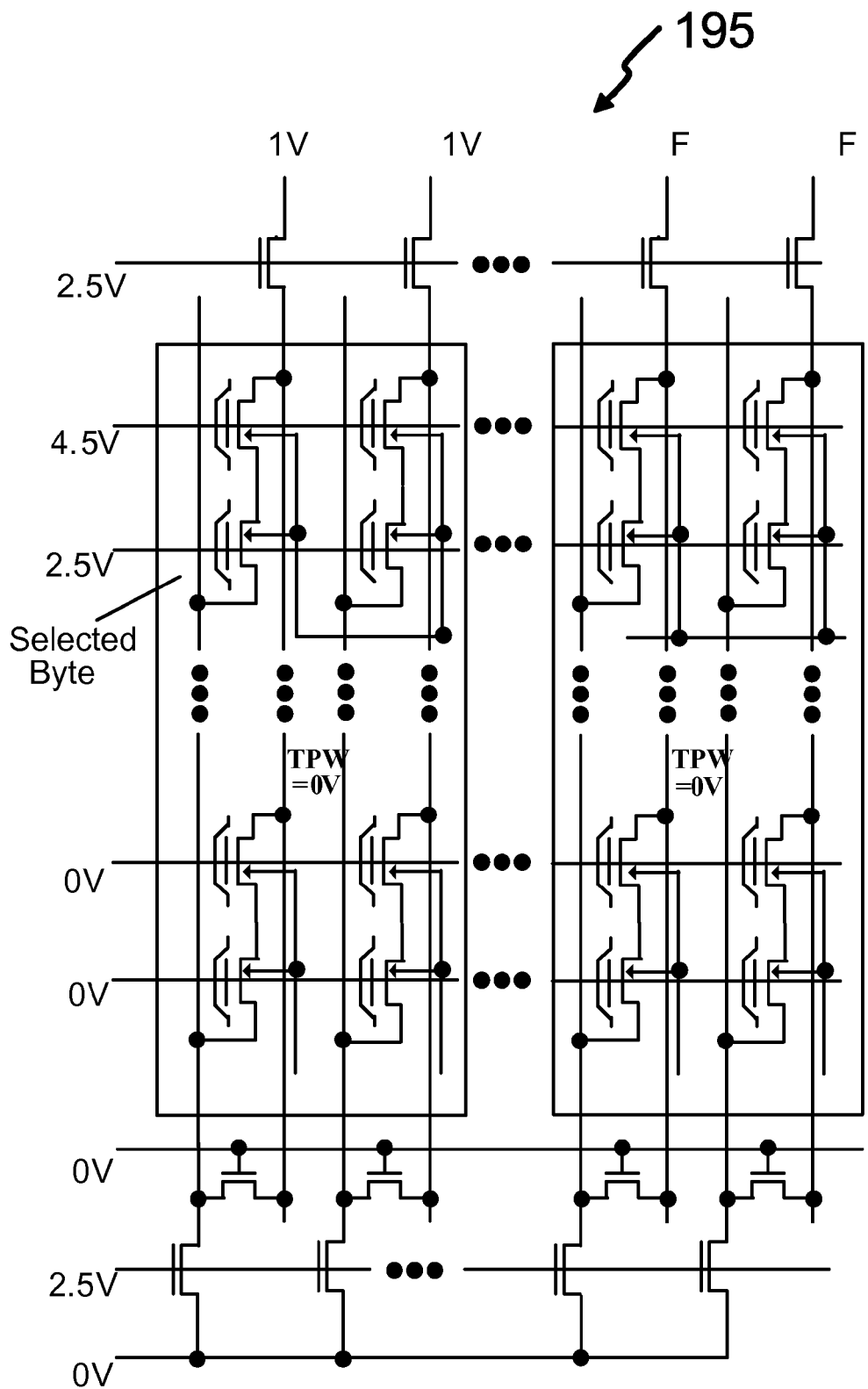
FIG. 15B is a diagram of a 2T2b Flash-based EEPROM cell array circuit with a LV Full-Page PGM Buffer in read operation according to an alternative embodiment of the present invention.

FIG. 15B is a diagram of a 2T2b Flash-based EEPROM cell array circuit 195 with a LV Full-Page PGM Buffer in read operation according to an alternative embodiment of the present invention. This embodiment is substantially the same as the one described above (FIG. 15A) but is associated with a full-page read operation. There is only one column decoder and rest of the bias conditions is the same as those in FIG. 15A for proper bit-by-bit read operation.

Figure 15C:
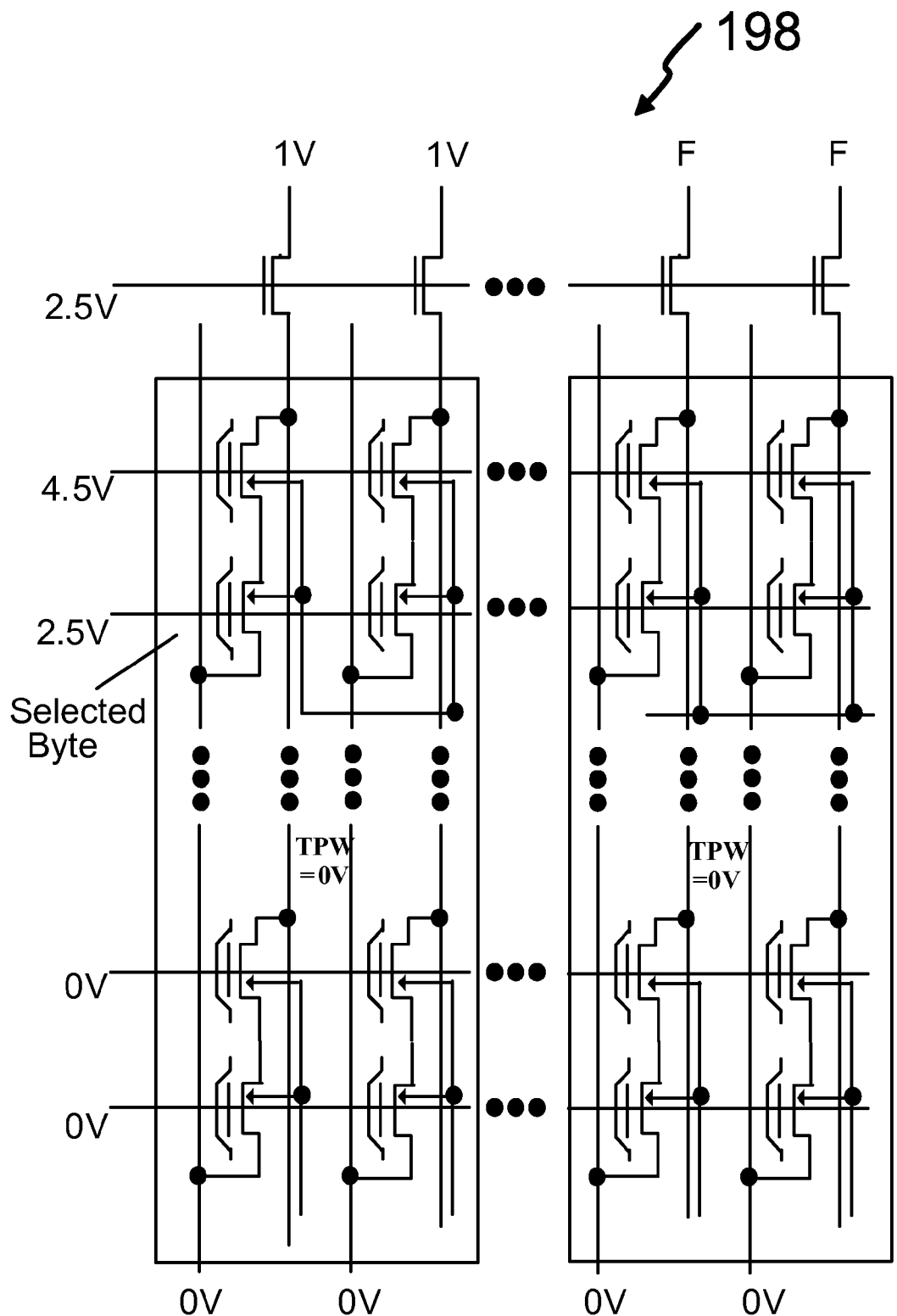
FIG. 15C is a diagram of a 2T2b Flash-based EEPROM cell array circuit with a HV Full-Page PGM Buffer in read operation according to an alternative embodiment of the present invention.

FIG. 15C is a diagram of a 2T2b Flash-based EEPROM cell array circuit 198 with a HV Full-Page PGM Buffer in read operation according to an alternative embodiment of the present invention. This embodiment is substantially the same as the one described above (FIG. 15B) but is associated with a HV PGM buffer for full-page read operation. All SLs are coupled to ground reference level of 0 V without using column select decoder and all BLs in selected byte is coupled to a small positive level <1 V through Sense Amplifier and all unselected BLs are left floating. The rest bias conditions would be the same as those described above (FIG. 12B and FIG. 15A) for proper bit-by-bit read operation.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An one-transistor-one-bit (1T1b) Flash-based EEPROM array circuit comprising:
    a 1T1b Flash-based EEPROM cell array divided into a plurality of pages, each page being laid in a row having a number of bytes in X direction, each byte including eight bits, each bit being associated with a memory cell having a triple P-well (TPW) node, a word line WL node connected to a common WL for each page in the X direction, a bit line BL node configured to connect a global BL in Y direction perpendicular to the X direction, and a source line SL node configured to connect a global SL in the Y direction, wherein the plurality of pages is arranged in the number of columns of bytes in the Y direction, each column of bytes sharing a common TPW node connected to all TPW nodes of all memory cells in the column;
    a decoder circuit connected to each common WL in the X direction associated with each of the plurality of pages;
    a low-voltage PGM buffer circuit made from PMOS and NMOS devices with power supply voltages of 3V or less and connected to all the global BLs in the Y direction; and
    a source line control block circuit configured to connect all the global SLs in the Y direction;
    wherein the decode circuit is configured to apply a negative voltage level to a selected WL along with a reduced voltage level to selected TPW node and selected BLs for superior channel length reduction during data-oriented storage operations on selected memory cells in selected bytes or selected page.

2. The 1T1b Flash-based EEPROM array circuit of claim 1 wherein each memory cell is one 2-poly High-voltage floating gate transistor comprising a first poly-silicon floating gate above a channel, a second poly-silicon control gate above the first poly-silicon floating gate with edge extensions above the channel, a N+ Drain region and a N+ Source region formed across the channel in the Y direction on a Triple P-well region, the Triple P-well region being a common bulk formed within a Deep N-well region on top of a P-substrate;
    wherein the second poly-silicon control gate is connected to the corresponding WL, the N+ Drain region is connected to the corresponding BL, the N+ Source region is connected to the corresponding SL, the Triple P-well region is connected to a TPW node through a P+ contact region, and the Deep N-well region is connected to a DNW node through a N+ contact region.

3. The 1T1b Flash-based EEPROM array circuit of claim 1 wherein the negative voltage to the selected WL is generated by a negative charge-pump circuit built with HV PMOS device to reduce bit line voltage so that memory cell size can be reduced without need of changing Flash-based EEPROM process.

4. The 1T1b Flash-based EEPROM array circuit of claim 1 wherein the data-oriented storage operations comprise a bias condition for byte-erase operation on selected bytes, the selected bytes being associated with selected TPW nodes, selected global BLs and SLs, and a selected WL, the bias condition including approximately +10 V being coupled to the selected TPW nodes corresponding to the selected bytes and nearly +10V being forwarded to the selected global BLs and SLs via a PN junction between TPW nodes at the +10V and the corresponding selected global BLs and SLs, approximately −5 V being coupled to the selected WL, approximately +5 V being coupled to all un-selected WLs, and ground level to all un-selected TPW nodes and all unselected global BLs and SLs.

5. The 1T1b Flash-based EEPROM array circuit of claim 1 wherein the data-oriented storage operations comprise a bias condition for page-erase operation on a selected page, the selected page being associated with a selected WL, the bias condition including approximately +10 V being coupled to all TPW nodes and forwarded to all global BLs and SLs of the selected page, a negative bias approximately −5 V being coupled to the selected WL, a positive bias approximately +5 V or less being coupled to all un-selected WLs.

6. The 1T1b Flash-based EEPROM array circuit of claim 1 wherein the data-oriented storage operations comprise a bias condition for page-program operation on a selected page, the selected page being associated with a selected WL and selected cells and un-selected cells, the bias condition including a ground level applied to all TPW nodes and 0 V to discharge all selected global BLs in the selected page, approximately +16 V being applied to the selected WL for programming into the selected cells associated with the selected BLs in the selected page, any voltages between 0 V and 5 V being coupled to all un-selected WLs, and approximately +10 V being pre-charged and retained at all un-selected global BLs and SLs.

7. The 1T1b Flash-based EEPROM array circuit of claim 1 wherein the data-oriented storage operations comprise a bias condition for read operation on selected bytes in selected page, the selected bytes being associated with a selected WL, selected TPW nodes, and selected global BLs and SLs, the bias condition including a ground reference level being coupled to the selected TPW nodes and the selected global BLs and SLs, a power supply voltage level Vdd of approximate 3V or less being coupled to the selected WL, approximately 0 V being coupled to all un-selected WLs, approximately +1 V or less being coupled to the selected global BLs and a floating state for all un-selected global BLs, and approximately 0 V being coupled to all global SLs.

8. The 1T1b Flash-based EEPROM array circuit of claim 1 wherein the data-oriented storage operations comprise a two-step program operation along with the low-voltage PGM buffer, the two-step program operation including, a first step of pre-charge period during which all global SLs are biased at an approximately 10 V using a pre-charge HV bus in the source line control circuit and all global BLs are at a floating state and all WLs are biased at 5V or less, and a second step of programming period during which the selected global BLs are discharged to 0 V while the unselected global BLs are retained at the floating state and the selected WL is ramped up to approximate +16 V for programming only the selected cells associated with the selected global BLs.

9. The 1T1b Flash-based EEPROM array circuit of claim 1 wherein the plurality of pages comprises a first Half-page group and a second Half-page group, the first Half-page group being associated with the global SLs having odd column numbers selected by coupling a sufficiently high voltage to open all corresponding SL-select transistors' gates through an odd column decoder in the source line control block circuit, the second Half-page group being associated with the global SLs having even column numbers selected by coupling a sufficiently high voltage to open all corresponding SL-select transistors' gates through an even column decoder in the source line control block circuit.

10. The 1T1b Flash-based EEPROM array circuit of claim 9 wherein the data-oriented storage operations comprise byte-erase operation, page-erase operation, page-program operation, and read operation performed on the first/second Half-page group by applying a high bias voltage of approximately 16 V to open gates of all odd/even column number SL-select transistors while grounding gates of all even/odd column number SL-select transistors.

11. A method for operating an one-transistor-one-bit (1T1b) Flash-based EEPROM cell array during a byte erase operation, the method comprising:
providing a 1T1b Flash-based EEPROM cell array comprising:
an 1T1b Flash-based EEPROM cell array divided into a plurality of pages, each page being laid in a row having a number of bytes in X direction, each byte including eight bits, each bit being associated with a memory cell having a triple P-well (TPW) node, a word line WL node connected to a common WL for each page in the X direction, a bit line BL node configured to connect a global BL in Y direction perpendicular to the X direction, and a source line SL node configured to connect a global SL in the Y direction, wherein the plurality of pages is arranged in the number of columns of bytes in the Y direction, each column of bytes sharing a common TPW node connected to all TPW nodes of all memory cells in the column;
a decoder circuit connected to each common WL in the X direction associated with each of the plurality of pages;
a low-voltage PGM buffer circuit made from PMOS and NMOS devices with power supply voltages of 3V or less and connected to all the global BLs in the Y direction respectively through a plurality of BL-select transistors; and
a source line control block circuit configured to connect all the global SLs in the Y direction respectively through a plurality of SL-select transistors;
biasing the 1T1b Flash-based EEPROM cell array for erasing a selected byte in a selected page by
applying a negative voltage level through the decode circuit to a selected WL associated with the selected byte belonging to the selected page, the negative voltage level being approximately −5 V;
applying a +5 V level through the decoder circuit to all unselected WLs;
coupling 0 V from the low-voltage PGM buffer circuit to gates of the plurality of BL-select transistors to close all global BLs for preventing leakage;
applying approximately +10 V level to a selected TPW node associated with the selected byte;
applying approximately 0 V level to all un-selected TPW nodes;
coupling 10 V or less to all selected global BLs/SLs associated with the selected byte through corresponding PN junctions between the selected TPW node and the selected global BLs/SLs; and
setting all un-selected global BLs/SLs to 0V or float state;
wherein a bias difference between the selected WL and the selected BLs is about 16 V for inducing FN tunneling effect for erasing the selected byte.

12. A method for operating a one-transistor-one-bit (1T1b) Flash-based EEPROM cell array during a page program operation, the method comprising:
providing a 1T1b Flash-based EEPROM cell array comprising:
a 1T1b Flash-based EEPROM cell array divided into a plurality of pages, each page being laid in a row having a number of bytes in X direction, each byte including eight bits, each bit being associated a memory cell with a triple P-well (TPW) node, a word line WL node connected to a common WL for each page in the X direction, a bit line BL node configured to connect a global BL in Y direction perpendicular to the X direction, and a source line SL node configured to connect a global SL in the Y direction, wherein the plurality of pages is arranged in the number of columns of bytes in the Y direction, each column of bytes sharing a common TPW node connected to all TPW nodes of all memory cells in the column;
a decoder circuit connected to each common WL in the X direction associated with each of the plurality of pages;
a low-voltage PGM buffer circuit made from PMOS and NMOS devices with power supply voltages of 3V or less and connected to all the global BLs in the Y direction respectively through a plurality of BL-select transistors; and
a source line control block circuit configured to connect all the global SLs in the Y direction through a plurality of SL-select transistors;

biasing the 1T1b Flash-based EEPROM cell array for pre-charging all global SLs by
  applying a moderate positive voltage level between 0 V and 5V to all WLs from the decoder circuit;
  setting the TPW nodes to ground reference voltage level at 0 V;
  applying a high gate voltage level of approximately 16 V to gates of all SL-select transistors to allow passage of 10V pre-charge voltage from a bottom common bus to the global SLs;
  applying a LV Vdd level of 3V or less to gates and drain nodes of the plurality of BL-select transistors to set them in non-conduction state for prevent leakages;
biasing the 1T1b Flash-based EEPROM cell array for programming a selected bit in the selected page with pre-charged SLs by
  ramping only the moderate positive voltage level to the selected WL associated with the selected page to a high program voltage level of approximately 16 V, and keeping the moderate positive voltage level for other WLs;
  keeping the TPW nodes in the ground reference voltage level;
  applying a low gate voltage level of 0 V to turn off the SL-select transistor connecting to the SL of the selected bit, and keeping other SL-select transistors On to allow passage of the common bus voltage of 10 V to un-selected global SLs;
  applying the LV Vdd level to gates of all BL-select transistors and applying a PGM inhibit voltage level to all but one drain nodes of the BL-select transistors to inhibit discharging of the corresponding global BLs except applying a PGM voltage level to said one drain node of the BL-select transistor to allow discharge of the BL associated with the selected bit;
  wherein the PGM inhibit voltage level is equal to the LV Vdd of 3 V or less and the PGM voltage level is 0 V.

13. The method of claim 12 wherein the pre-charging all global SLs comprises
  dividing all SL-select transistors to a first half-page SL-select transistors associated with only odd column numbers and a second half-page SL-select transistors associated with only even column numbers;
  applying the high gate voltage level of approximately 16 V to gates of all first half-page SL-select transistors to allow passage of 10V pre-charge voltage from a bottom common bus to the global SLs associated with the first half-page; and
  applying the high gate voltage level of approximately 16 V to gates of all second half-page SL-select transistors to allow passage of 10V pre-charge voltage from a bottom common bus to the global SLs associated with the second half-page.

14. The method of claim 12 wherein the programming a selected bit in the selected page comprises
  ramping only the moderate positive voltage level to the selected WL associated with the selected page to a high program voltage level of approximately 16 V, and keeping the moderate positive voltage level for other WLs;
  keeping the TPW nodes in the ground reference voltage level;
  applying a low gate voltage level of 0 V to turn off the SL-select transistor connecting to the SL of the selected bit and all other SL-select transistors in the same half-page having either odd or even column numbers;
  keeping the high gate voltage level on gates of all SL-select transistors of another half-page to allow passage of the common bus voltage of 10 V to the global SLs associated with;
  applying the LV Vdd level to gates of all BL-select transistors and applying the PGM inhibit voltage level to all but one drain nodes of the BL-select transistors to inhibit discharging of the corresponding global BLs except applying the PGM voltage level to said one drain node of the BL-select transistor to allow discharging of the BL associated with the selected bit, wherein the selected bit in said half page of the selected page is programmed to have an increased threshold voltage.

15. A method for operating an one-transistor-one-bit (1T1b) Flash-based EEPROM cell array during a read operation, the method comprising:
  providing a 1T1b Flash-based EEPROM cell array comprising:
    an 1T1b Flash-based EEPROM cell array divided into a plurality of pages, each page being laid in a row having a number of bytes in X direction, each byte including eight bits, each bit being associated with a memory cell having a triple P-well (TPW) node, a word line WL node connected to a common WL for each page in the X direction, a bit line BL node configured to connect a global BL in Y direction perpendicular to the X direction, and a source line SL node configured to connect a global SL in the Y direction, wherein the plurality of pages is arranged in the number of columns of bytes in the Y direction, each column of bytes sharing a common TPW node connected to all TPW nodes of all memory cells in the column;
    a decoder circuit connected to each common WL in the X direction associated with each of the plurality of pages;
    a low-voltage PGM buffer circuit made from PMOS and NMOS devices with power supply voltages of 3V or less and connected to all the global BLs in the Y direction respectively through a plurality of BL-select transistors; and
    a source line control block circuit configured to connect all the global SLs in the Y direction respectively through a plurality of SL-select transistors;
  biasing the 1T1b Flash-based EEPROM cell array for reading a selected byte by
    applying a low read voltage level of approximately 2.5 V through the decode circuit to a selected WL associated with the selected byte;
    applying a ground reference voltage level of 0 V to other unselected WLs;
    setting the TPW node associated with the selected byte to the ground reference voltage level;
    applying 1 V or less from the Low-voltage PGM buffer circuit through a sense amplifier to all selected global BLs corresponding to the selected byte;
    letting the un-selected global BLs to float; and
    applying the ground reference voltage level from the source line control block circuit to all global SLs.

* * * * *